US012718889B2

(12) United States Patent
Tang et al.

(10) Patent No.: US 12,718,889 B2

(45) Date of Patent: Aug. 25, 2026

(54) MEMORY DEVICE, MEMORY SYSTEM, MEMORY CONTROLLER AND OPERATING METHOD THEREOF

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN); Wen Luo, Wuhan (CN); Lu Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 58 days.

(21) Appl. No.: 18/792,164

(22) Filed: Aug. 1, 2024

(65) Prior Publication Data

US 2025/0266100 A1 Aug. 21, 2025

Related U.S. Application Data

(63) Continuation of application No. PCT/CN2024/077811, filed on Feb. 20, 2024.

(51) Int. Cl.

| | |
|---|---|
| ***G11C 16/26*** | (2006.01) |
| ***G11C 16/12*** | (2006.01) |
| ***G11C 16/34*** | (2006.01) |

(52) U.S. Cl.

CPC ............. *G11C 16/26* (2013.01); *G11C 16/12* (2013.01); *G11C 16/3404* (2013.01)

(58) Field of Classification Search

CPC ...... G11C 16/26; G11C 16/12; G11C 16/3404

USPC .................................................. 365/189.011

See application file for complete search history.

(56) References Cited

U.S. PATENT DOCUMENTS

| | | | | |
|---|---|---|---|---|
| 2015/0029796 | A1* | 1/2015 | Choi | G11C 11/5642 365/189.05 |
| 2016/0098197 | A1 | 4/2016 | Kuo et al. | |
| 2022/0375516 | A1* | 11/2022 | Tokutomi | G11C 16/0483 |
| 2023/0290410 | A1* | 9/2023 | Guo | G11C 16/3418 |

FOREIGN PATENT DOCUMENTS

| | | | |
|---|---|---|---|
| CN | 107015886 | A | 8/2017 |
| CN | 113421601 | A | 9/2021 |
| CN | 115206373 | A | 10/2022 |

* cited by examiner

*Primary Examiner* — Amir Zarabian

*Assistant Examiner* — Daniel John King

(74) *Attorney, Agent, or Firm* — BAYES PLLC

(57) ABSTRACT

Examples of the present disclosure disclose a memory device, a memory system, a memory controller and an operating method, the memory device includes: a preset number of the memory cells form one code word, and the multiple storage bits correspond to multiple pages respectively; at least one page corresponds to multiple stages, the multiple stages include a first stage and a second stage, and the read voltage corresponding to the second stage is less than the read voltage in the first stage; peripheral circuit coupled to the array of memory cells and configured to: obtain the target valley voltage in the first target stage; take the target valley voltage as a read voltage at which a read operation is performed on the at least one code word; and obtain the predicted valley voltage in the second target stage in accordance with the target valley voltage in the first target stage.

20 Claims, 27 Drawing Sheets obtaining the target valley voltage in the first target stage, the first target stage including at least one first stage among multiple first stages corresponding to multiple pages; taking the target valley voltage as a read voltage at which a read operation is performed on the at least one code word

S10 obtaining the predicted valley voltage in the second target stage in accordance with the target valley voltage in the first target stage, the second target stage including at least one of the remaining first stages or the second stage; the read voltage in the second target stage being less than the read voltage in the first target stage

Cycle Type
DQx
CMD
EFh
ADDR
DBh
Din
• • •

FIG. 16

MEMORY DEVICE, MEMORY SYSTEM, MEMORY CONTROLLER AND OPERATING METHOD THEREOF

CROSS-REFERENCE TO RELATED APPLICATIONS

The present application is a continuation of International Application No. PCT/CN2024/077811, filed on Feb. 20, 2024, which is hereby incorporated by reference in its entirety.

FIELD OF TECHNOLOGY

The present disclosure relates, but is not limited to, a memory device, memory system, memory controller and operating method thereof.

BACKGROUND

With the development of science and technology, the market size of the integrated circuit industry is getting larger and larger, and the process and technology of non-volatile memory devices in the entire integrated circuit industry have experienced rapid development in recent years, where NAND memory is particularly widely used. NAND memory implements data storage through capturing and storing charges in the gate dielectric layer of the memory cells it contains. However, as the use time increases, the charge stored in the memory cell will change with the increase in use time, repeated read operations, cross temperature, etc., therefore affecting the accuracy of reading the data stored in the memory cell.

SUMMARY

According to one aspect of the present disclosure a memory device is provided. The memory device may include an array of memory cells including a memory cell with multiple storage bits. A preset number of memory cells may form one code word, and the multiple storage bits may correspond to multiple pages respectively. At least one page may correspond to multiple stages. The multiple stages may include a first stage and a second stage. A read voltage in the second stage may be less than a read voltage in the first stage. The memory device may include a peripheral circuit coupled to the array of memory cells. The peripheral circuit may be configured to obtain a target valley voltage in a first target stage. The first target stage may include at least one first stage among multiple first stages corresponding to the multiple pages. The peripheral circuit may be configured to take the target valley voltage as a read voltage at which a read operation is performed on at least one code word. The peripheral circuit may be configured to obtain a predicted valley voltage in a second target stage in accordance with the target valley voltage in the first target stage. The second target stage may include at least one of the remaining first stages or the second stage. A read voltage in the second target stage may be less than a read voltage in the first target stage.

In some implementations, the peripheral circuit may be configured to obtain a target valley voltage in a first stage for each of the multiple pages. In some implementations, the peripheral circuit may be configured to obtain a predicted valley voltage in the second stage for the same page to which the first stage belongs, in accordance with the target valley voltage in the first stage for each of the pages.

In some implementations, each of the multiple pages may include multiple second stages. In some implementations, the peripheral circuit may be configured to obtain the predicted valley voltage in the second stage corresponding to the greatest read voltage among the multiple second stages for the same page to which the first stage belongs, in accordance with the target valley voltage in the first stage for each of the multiple pages. In some implementations, the peripheral circuit may be configured to, sequentially in accordance with the predicted valley voltage in the second stage corresponding to a larger read voltage among the multiple second stages for the same page to which the first stage belongs, obtain the predicted valley voltage in the second stage corresponding to a smaller read voltage than a read voltage corresponding to an adjacent second stage, until the predicted valley voltages in all the second stages in the same page to which the first stage belongs are obtained.

In some implementations, the storage bits of the memory cell may be three bits, and the three bits may correspond to a lower page, a middle page, and an upper page respectively. In some implementations, the multiple stages may include a first-level read voltage, a second-level read voltage, a third-level read voltage, a fourth-level read voltage, a fifth-level read voltage, a sixth-level read voltage, and a seventh-level read voltage with the read voltages increasing sequentially. In some implementations, the fifth-level read voltage to the seventh-level read voltage in the multiple stages may correspond to the first stages for the lower page, the middle page, and the upper page respectively. In some implementations, the first-level read voltage may correspond to the second stage for the lower page. In some implementations, the second-level read voltage in the multiple stages and the fourth-level read voltage in the multiple stages may correspond to the second stages for the middle page. In some implementations, the third-level read voltage in the multiple stages may correspond to the second stage for the upper page. In some implementations, the peripheral circuit may be configured to obtain the predicted valley voltage for the first-level read voltage for the lower page in accordance with the target valley voltage for the fifth-level read voltage for the lower page. In some implementations, the peripheral circuit may be configured to obtain the predicted valley voltage for the fourth-level read voltage for the middle page in accordance with the target valley voltage for the sixth-level read voltage for the middle page. In some implementations, the peripheral circuit may be configured to obtain the predicted valley voltage for the second-level read voltage for the middle page in accordance with the predicted valley voltage for the fourth-level read voltage for the middle page. In some implementations, the peripheral circuit may be configured to obtain the predicted valley voltage for the third-level read voltage for the upper page in accordance with the target valley voltage for the seventh-level read voltage for the upper page.

In some implementations, the peripheral circuit may be configured to obtain the predicted valley voltage in the second target stage in accordance with the target valley voltage in the first target stage and a mapping function. In some implementations, the mapping function may represent a relationship between the target valley voltage in the first target stage and the predicted valley voltage in the second target stage. In some implementations, the peripheral circuit may be configured to obtain the predicted valley voltage in the second target stage in accordance with the target valley voltage in the first target stage, a first adjustment coefficient, a second adjustment coefficient, and a third adjustment coefficient in the mapping function. In some implementations, the first adjustment coefficient, the second adjustment coefficient, and the third adjustment coefficient may all fixed values related to a stage number in which the read voltage is.

In some implementations, the peripheral circuit may be configured to, for the first target stage, obtain a first result corresponding to the at least one code word at a target read voltage. In some implementations, the first result may include the number of bits of the at least one code word which are flipped in two read results at a first read voltage and a second read voltage. In some implementations, a difference between the first read voltage and the second read voltage may be less than a preset voltage. In some implementations, the peripheral circuit may be configured to make at least one adjustment to the target read voltage, and after each adjustment, obtain a corresponding first result at the adjusted target read voltage. In some implementations, the peripheral circuit may be configured to determine the target valley voltage in the first target stage in accordance with multiple first results.

In some implementations, the peripheral circuit may be configured to, for the second target stage, obtain a first result corresponding to the at least one code word at a target read voltage. In some implementations, the peripheral circuit may be configured to obtain a first threshold in accordance with the corresponding first result at the target read voltage. In some implementations, the first threshold may represent the corresponding first result at an upper limit of the predicted valley voltage. In some implementations, the peripheral circuit may be configured to, when the corresponding first result at the predicted valley voltage in the second target stage is less than the first threshold, determine the predicted valley voltage in the second target stage to be the target valley voltage in the second target stage.

In some implementations, the peripheral circuit may be configured to, when the corresponding first result at the predicted valley voltage in the second target stage is greater than or equal to the first threshold, make at least one adjustment to a predicted read voltage in the second target stage, and after each adjustment, obtain the corresponding first result at the adjusted target read voltage. In some implementations, the peripheral circuit may be configured to determine the target valley voltage in the second target stage in accordance with the multiple first results.

In some implementations, the peripheral circuit may be configured to, when the corresponding first result at the predicted valley voltage in the second target stage is greater than or equal to the first threshold, obtain the predicted valley voltage in the second target stage in accordance with the target valley voltage in the first target stage and an alternate adjustment coefficient of a mapping function. In some implementations, the mapping function may represent relationship between the target valley voltage in the first target stage and the predicted valley voltage in the second target stage.

In some implementations, the memory device may be a memory device after data retention.

According to another aspect of the present disclosure, a memory system is provided. The memory system may include one or more memory devices. The one or more memory devices may include an array of memory cells including a memory cell with multiple storage bits. A preset number of memory cells may form one code word, and the multiple storage bits may correspond to multiple pages respectively. At least one page may correspond to multiple stages. The multiple stages may include a first stage and a second stage. A read voltage in the second stage may be less than a read voltage in the first stage. The one or more memory devices may include a peripheral circuit coupled to the array of memory cells. The peripheral circuit may be configured to obtain a target valley voltage in a first target stage, the first target stage including at least one first stage among multiple first stages corresponding to the multiple pages. The peripheral circuit may be configured to take the target valley voltage as a read voltage at which a read operation is performed on at least one code word. The peripheral circuit may be configured to obtain a predicted valley voltage in a second target stage in accordance with the target valley voltage in the first target stage, the second target stage including at least one of the remaining first stages or the second stage. A read voltage in the second target stage may be less than a read voltage in the first target stage. The memory system may include a memory controller coupled to the memory device and controlling the memory device.

In some implementations, the memory controller may be configured to send an instruction for obtaining data. In some implementations, the instruction for obtaining data indicates to obtain a target valley voltage. In some implementations, the memory device may be configured to receive the instruction for obtaining data, obtain the target valley voltage, and send information including the target valley voltage to the memory controller. In some implementations, the memory controller may be further configured to perform a read operation on data stored in the memory device in accordance with the target valley voltage in the information.

In some implementations, the memory controller may be further configured to perform an error correction code decoding operation on a read result of the read operation.

According to a further aspect of the present disclosure, a memory controller coupled to at least one memory device is provided. The memory controller may include a control component. The control component may be configured to obtain a target valley voltage in a first target stage. The first target stage may include at least one first stage among multiple first stages corresponding to multiple pages in the memory device. The memory controller may be configured to take the target valley voltage as a read voltage at which a read operation is performed on at least one code word. The memory device may include a memory cell with multiple storage bits, a preset number of memory cells form one code word. The multiple storage bits may correspond to multiple pages respectively. At least one page may correspond to multiple stages. The multiple stages may include a first stage and a second stage. A read voltage in the second stage may be less than a read voltage in the first stage. The control component may be configured to obtain a predicted valley voltage in a second target stage in accordance with the target valley voltage in the first target stage. The second target stage may include at least one of the remaining first stages or the second stage. A read voltage in the second target stage may be less than a read voltage in the first target stage.

In some implementations, the control component may be configured to obtain a target valley voltage in a first stage for each of the multiple pages. In some implementations, the control component may be configured to obtain a predicted valley voltage in the second stage for the same page to which the first stage belongs, in accordance with the target valley voltage in the first stage for each of the pages.

In some implementations, each of the multiple pages may include multiple second stages. In some implementations, the control component may be configured to obtain the predicted valley voltage in the second stage corresponding to the greatest read voltage among the multiple second stages for the same page to which the first stage belongs, in accordance with the target valley voltage in the first stage for each of the multiple pages. In some implementations, the control component may be configured to, sequentially in accordance with the predicted valley voltage in the second stage corresponding to a larger read voltage among the multiple second stages for the same page to which the first stage belongs, obtain the predicted valley voltage in the second stage corresponding to a smaller read voltage than a read voltage corresponding to an adjacent second stage, until the predicted valley voltages in all the second stages in the same page to which the first stage belongs are obtained.

In some implementations, the control component may be configured to obtain the predicted valley voltage in the second target stage in accordance with the target valley voltage in the first target stage and a mapping function. In some implementations, the mapping function may represent relationship between the target valley voltage in the first target stage and the predicted valley voltage in the second target stage.

In some implementations, the control component may be configured to obtain the predicted valley voltage in the second target stage in accordance with the target valley voltage in the first target stage, a first adjustment coefficient, a second adjustment coefficient, and a third adjustment coefficient in the mapping function. In some implementations, the first adjustment coefficient, the second adjustment coefficient, and the third adjustment coefficient may be all fixed values related to a stage number in which the read voltage is.

In some implementations, the control component may be configured to, for the first target stage, obtain a first result corresponding to the at least one code word at a target read voltage. In some implementations, the first result may include the number of bits of the at least one code word which are flipped in two read results at a first read voltage and a second read voltage. In some implementations, a difference between the first read voltage and the second read voltage may be less than a preset voltage. In some implementations, the control component may be configured to make at least one adjustment to the target read voltage, and after each adjustment, obtain the corresponding first result at the adjusted target read voltage. In some implementations, the control component may be configured to determine the target valley voltage in the first target stage in accordance with the multiple first results.

In some implementations, the control component may be configured to, for the second target stage, obtain the first result corresponding to the at least one code word at the target read voltage. In some implementations, the control component may be configured to obtain a first threshold in accordance with the corresponding first result at the target read voltage. In some implementations, the first threshold may represent the corresponding first result at an upper limit of the predicted valley voltage. In some implementations, the control component may be configured to, when the corresponding first result at the predicted valley voltage in the second target stage is less than the first threshold, determine the predicted valley voltage in the second target stage to be the target valley voltage in the second target stage.

In some implementations, the control component may be configured to, when the corresponding first result at the predicted valley voltage in the second target stage is greater than or equal to the first threshold, make at least one adjustment to a predicted valley voltage read voltage in the second target stage, and after each adjustment, obtain the corresponding first result at the adjusted target read voltage. In some implementations, the control component may be configured to determine the target valley voltage in the second target stage in accordance with the multiple first results.

In some implementations, the control component may be configured to, when the corresponding first result at the predicted valley voltage in the second target stage is greater than or equal to the first threshold, obtain the predicted valley voltage in the second target stage in accordance with the valley voltage in the first target stage and an alternate adjustment coefficient of a mapping function. In some implementations, the mapping function may represent a relationship between the target valley voltage in the first target stage and the predicted valley voltage in the second target stage.

In some implementations, the memory device may be a memory device after data retention.

In some implementations, a data amount of the first result may be less than a preset threshold of data amount.

According to still another aspect of the present disclosure, a method of operating a memory device is provided. The method may include obtaining a target valley voltage in a first target stage. The first target stage may include at least one first stage among multiple first stages corresponding to the multiple pages. The method may include taking the target valley voltage as a read voltage at which a read operation is performed on at least one code word. The memory device may include a memory cell with multiple storage bits. A preset number of memory cells may form one code word. The multiple storage bits may correspond to multiple pages respectively. At least one page may correspond to multiple stages. The multiple stages may include a first stage and a second stage. A read voltage in the second stage may be less than a read voltage in the first stage. The method may include obtaining a predicted valley voltage in a second target stage in accordance with the target valley voltage in the first target stage. The second target stage may include at least one of the remaining first stages or the second stage. A read voltage in the second target stage may be less than a read voltage in the first target stage.

According to yet another aspect of the present disclosure, a method for operating a memory system is provided. The method may include sending an instruction for obtaining data. The instruction for obtaining data may indicate to obtain a target valley voltage. The target valley voltage may be obtained by a method for operating a memory device. The memory device may include a memory cell with multiple storage bits. A preset number of memory cells may form one code word. The multiple storage bits may correspond to multiple pages respectively. At least one page may correspond to multiple stages. The multiple stages may include a first stage and a second stage. A read voltage in the second stage may be less than a read voltage in the first stage. The method of operating the memory device may include obtaining a target valley voltage in a first target stage, the first target stage including at least one first stage among multiple first stages corresponding to the multiple pages. The method of operating the memory device may include taking the target valley voltage as a read voltage at which a read operation is performed on at least one code word. The method of operating the memory device may include obtaining a predicted valley voltage in a second target stage in accordance with the target valley voltage in the first target stage. The second target stage may include at least one of the remaining first stages or the second stage. A read voltage in the second target stage may be less than a read voltage in the first target stage. The method of operating the memory device may include performing a read operation on data stored in the memory device in accordance with the target valley voltage.

According to yet a further aspect of the present disclosure, a method for operating a memory controller is provided. The method may include obtaining a target valley voltage in a first target stage. The first target stage may include at least one first stage among multiple first stages corresponding to the multiple pages in the memory device. The method may include taking the target valley voltage as a read voltage at which a read operation is performed on at least one code word. The memory controller may be coupled to at least one memory device. The memory device may include a memory cell with multiple storage bits, a preset number of memory cells form one code word, and the multiple storage bits correspond to multiple pages respectively. At least one page corresponds to multiple stages. The multiple stages may include a first stage and a second stage. A read voltage in the second stage may be less than a read voltage in the first stage. The method may include obtaining a predicted valley voltage in a second target stage in accordance with the target valley voltage in the first target stage. The second target stage may include at least one of the remaining first stages or the second stage. A read voltage in the second target stage may be less than a read voltage in the first target stage.

According to yet another aspect of the present disclosure, a non-transitory computer-readable medium storing instructions for a memory system is provided. The instructions, which when executed by a processor for the memory system, may implement a method for operating a memory device. The method may include sending an instruction for obtaining data. The instruction for obtaining data may indicate to obtain a target valley voltage. The target valley voltage may be obtained by a method for operating a memory device. The memory device may include a memory cell with multiple storage bits. A preset number of memory cells may form one code word. The multiple storage bits may correspond to multiple pages respectively. At least one page may correspond to multiple stages. The multiple stages may include a first stage and a second stage. A read voltage in the second stage may be less than a read voltage in the first stage. The method of operating the memory device may include obtaining a target valley voltage in a first target stage. The first target stage may include at least one first stage among multiple first stages corresponding to the multiple pages. The method of operating the memory device may include taking the target valley voltage as a read voltage at which a read operation is performed on at least one code word. The method of operating the memory device may include obtaining a predicted valley voltage in a second target stage in accordance with the target valley voltage in the first target stage, the second target stage including at least one of the remaining first stages or the second stage. A read voltage in the second target stage may be less than a read voltage in the first target stage. The method may include performing a read operation on data stored in the memory device in accordance with the target valley voltage.

According to yet another aspect of the present disclosure, a non-transitory computer-readable medium storing instructions for a memory system is provided. The instructions, which when executed by a processor for the memory system, may implement a method for operating a memory system. The method for operating the memory system may include sending an instruction for obtaining data. The instruction for obtaining data may indicate to obtain a target valley voltage. The target valley voltage may be obtained by a method for operating a memory device. The memory device may include a memory cell with multiple storage bits. A preset number of memory cells may form one code word. The multiple storage bits may correspond to multiple pages respectively. At least one page may correspond to multiple stages. The multiple stages may include a first stage and a second stage. A read voltage in the second stage may be less than a read voltage in the first stage. The method for operating the memory device may include obtaining a target valley voltage in a first target stage. The first target stage may include at least one first stage among multiple first stages corresponding to the multiple pages. The method of operating the memory device may include taking the target valley voltage as a read voltage at which a read operation is performed on at least one code word. The method of operating the memory device may include obtaining a predicted valley voltage in a second target stage in accordance with the target valley voltage in the first target stage. The second target stage may include at least one of the remaining first stages or the second stage. A read voltage in the second target stage may be less than a read voltage in the first target stage. The method of operating the memory system may include performing a read operation on data stored in the memory device in accordance with the target valley voltage.

According to yet another aspect of the present disclosure, a non-transitory computer-readable medium storing instructions for a memory system is provided. The instructions, which when executed by a processor for the memory controller, may implement a method for operating a memory controller. The method for operating a memory controller may include obtaining a target valley voltage in a first target stage. The first target stage may include at least one first stage among multiple first stages corresponding to the multiple pages in the memory device. The method for operating a memory controller may include taking the target valley voltage as a read voltage at which a read operation is performed on at least one code word. The memory controller may be coupled to at least one memory device. The memory device may include a memory cell with multiple storage bits. A preset number of memory cells may form one code word. The multiple storage bits correspond to multiple pages respectively. At least one page may correspond to multiple stages. The multiple stages may include a first stage and a second stage. A read voltage in the second stage may be less than a read voltage in the first stage. The method for operating a memory controller may include obtaining a predicted valley voltage in a second target stage in accordance with the target valley voltage in the first target stage. The second target stage may include at least one of the remaining first stages or the second stage. A read voltage in the second target stage may be less than a read voltage in the first target stage.

BRIEF DESCRIPTION OF THE DRAWINGS

In the accompanying drawings, unless otherwise specified, same reference numbers refer to same or similar parts or elements throughout multiple accompanying drawings. The accompanying drawings are not necessarily to scale. It should be understood that these accompanying drawings depict only some examples disclosed in accordance with the present disclosure and should not be considered as limiting the scope of the present disclosure.

FIG. 7 is a schematic diagram of the implementation process of an operating method that peripheral circuits of a memory device are configured to perform provided by an example of the present disclosure is configured to perform;

FIG. 16 is an example of a timing diagram for starting a single-level read mode operation provided by this disclosure;

DETAILED DESCRIPTION

Figure 1:
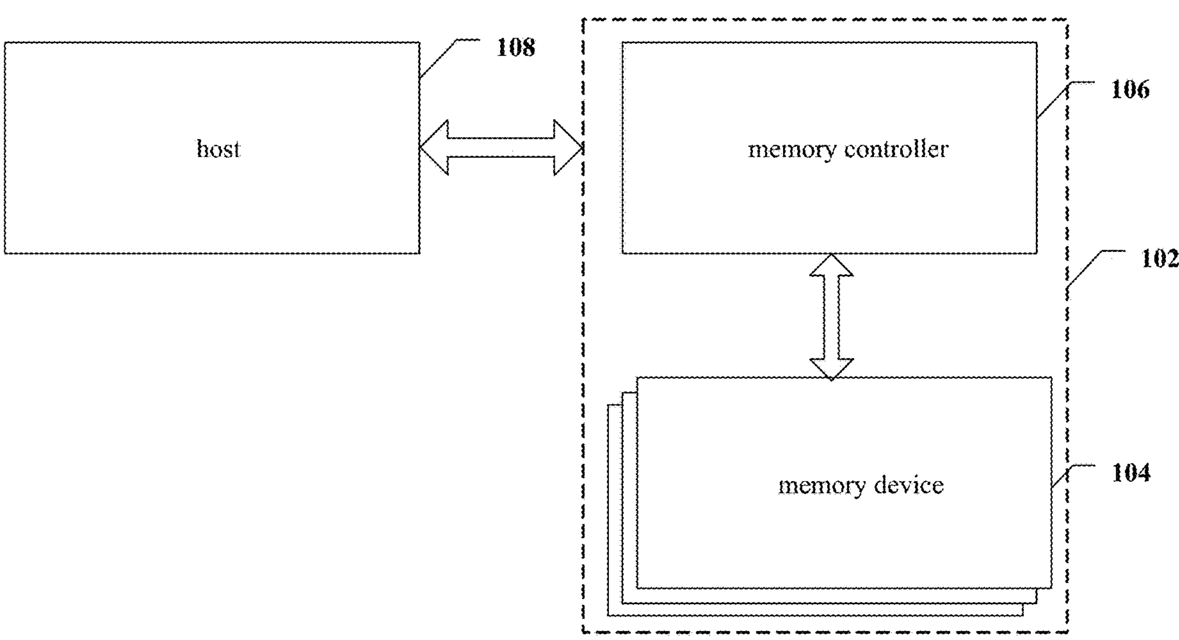
FIG. 1 is a schematic diagram of an example of a system with a memory system according to an example of the present disclosure.

Example of a implementations disclosed in the present disclosure will be described in more detail below with reference to the accompanying drawings. Although example of a implementations of the present disclosure are shown in the accompanying drawings, it should be understood that the present disclosure may be implemented in various forms and should not be limited to the implementations set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. However, it will be apparent to one skilled in the art that the present disclosure may be practiced without one or more of these details. In other examples, in order to avoid confusion with the present disclosure, some technical features known in the art are not described; that is, not all features of the actual example are described here, and well-known functions and structures are not described in detail.

Furthermore, accompanying drawings are merely schematic illustrations of the present disclosure and are not necessarily drawn to scale. Same reference numerals in the accompanying drawings represent same or similar parts, and thus repeated description thereof will be omitted. Some of the block diagrams shown in the accompanying drawings are functional entities and do not necessarily correspond to physically or logically separate entities. These functional entities may be implemented in software form, or implemented in one or more hardware modules or integrated circuits, or implemented in at least one of different networks or processor devices or microcontroller devices.

The flowcharts shown in the accompanying drawings are illustrative only and do not necessarily include all operations. For example, some operations may be decomposed, and some operations may be merged or partially merged, thus the actual stage for execution may change according to the actual situation.

A term used herein is for the purpose of describing a particular example only and is not to be considered as limitation of the present disclosure. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, operations, operations, elements and/or parts, but do not exclude the presence of one or more other features, integers, operations, operations, elements, parts and/or groups. As used herein, the term "and/or" includes any and all combinations of the associated listed items.

Memory devices in examples of the present disclosure include but are not limited to a three-dimensional NAND memory, and for ease of understanding, a three-dimensional NAND memory is taken as an example for illustration.

FIG. 1 illustrates a block diagram of an example of a system 100 with memory devices in accordance with some aspects of the present disclosure. The system 100 may be a mobile phone, a desktop computer, a laptop computer, a tablet, a vehicle computer, a gaming console, a printer, a positioning device, a wearable electronic device, a smart sensor, a Virtual Reality (VR) device, an Augment Reality (AR) device, or any other suitable electronic devices having memory device therein. As shown in in FIG. 1, system 100 may include a host 108 and a memory system 102, and the memory system 102 has one or more memory devices 104 and a memory controller 106. The host 108 may be a processor of an electronic device (e.g., a Central Processing Unit (CPU)) or a System of Chip (SoC) (e.g., an Disclosure Processor (AP)). Host 108 may be configured to send data to or receive data from memory device 104.

According to some implementations, memory controller 106 is coupled to memory device 104 and host 108 and is configured to control memory device 104. Memory controller 106 may manage data stored in memory device 104 and communicate with host 108. In some implementations, the memory controller 106 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc.

In some implementations, the memory controller 106 is designed to operate in high duty cycle environment Solid State Drive (SSD) or Embedded Multi Media Card (eMMC), where SSD or eMMC is taken as data storage for mobile devices such as smartphone, tablet computer, laptop computer, and enterprise storage array.

Memory controller 106 may be configured to control operations of memory device 104, e.g., read, erase and program operations. Memory controller 106 may also be configured to manage various functions related to data stored or to be stored in memory device 104, including but not limited to bad block management, garbage collection, logical-to-physical address translation, wear leveling, etc. In some implementations, memory controller 106 is also configured to process error correction code related to data read from or written to memory device 104.

The memory controller 106 may also perform any other suitable functions, e.g., formatting the memory device 104. Memory controller 106 may communicate with external devices (e.g., host 108) according to a particular communication protocol. For example, the memory controller 106 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

The memory controller 106 and one or more memory device 104 may be integrated into various types of storage devices, e.g., included in the same package (e.g., Universal Flash Storage (UFS) package or eMMC package). That is, memory system 102 may be implemented and packaged into different types of end electronic products.

Figure 2A:
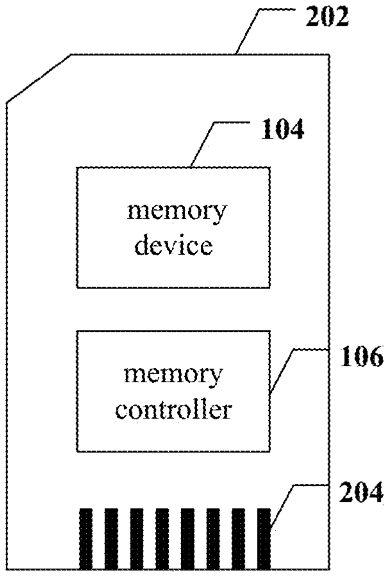
FIG. 2A is a schematic diagram of an example of a memory card with a memory system according to an example of the present disclosure.

In one example as shown in FIG. 2*a*, memory controller 106 and a single memory device 104 may be integrated into a memory card 202. Memory card 202 may include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 202 may further include a memory card connector 24 coupling memory card 202 with a host (e.g., host 108 in FIG. 1).

Figure 2B:
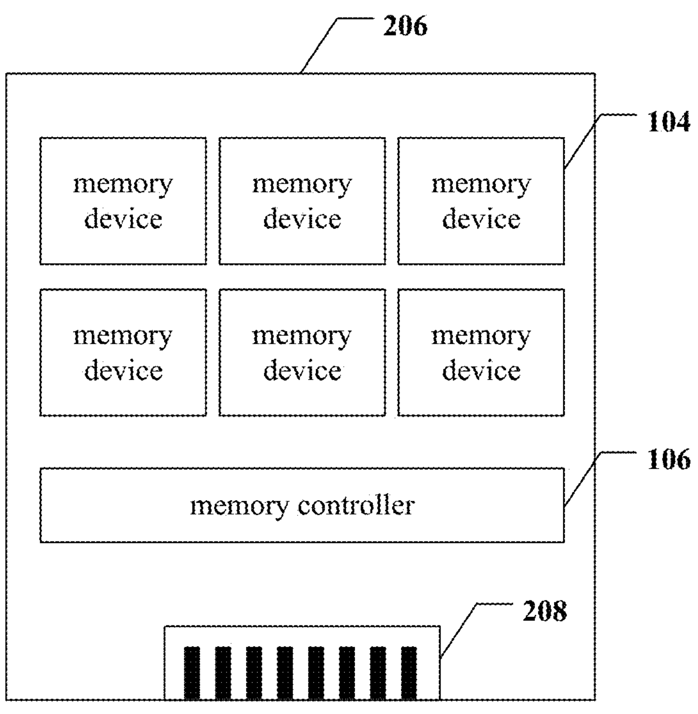
FIG. 2B is a schematic diagram of an example of a solid-state drive with a memory system according to an example of the present disclosure.

In another example as shown in FIG. 2*b*, memory controller 106 and multiple memory devices 104 may be integrated into a SSD 206. SSD 206 may further include an SSD connector 208 coupling the SSD 206 with a host (e.g., host 108 in FIG. 1). In some implementations, at least one of the storage capacity or operating speed of SSD 206 is greater than at least one of the storage capacity or operating speed of memory card 202.

In some examples, each memory block may be coupled to multiple word lines, and multiple memory cells coupled to each word line constitute a physical page.

Figure 3:
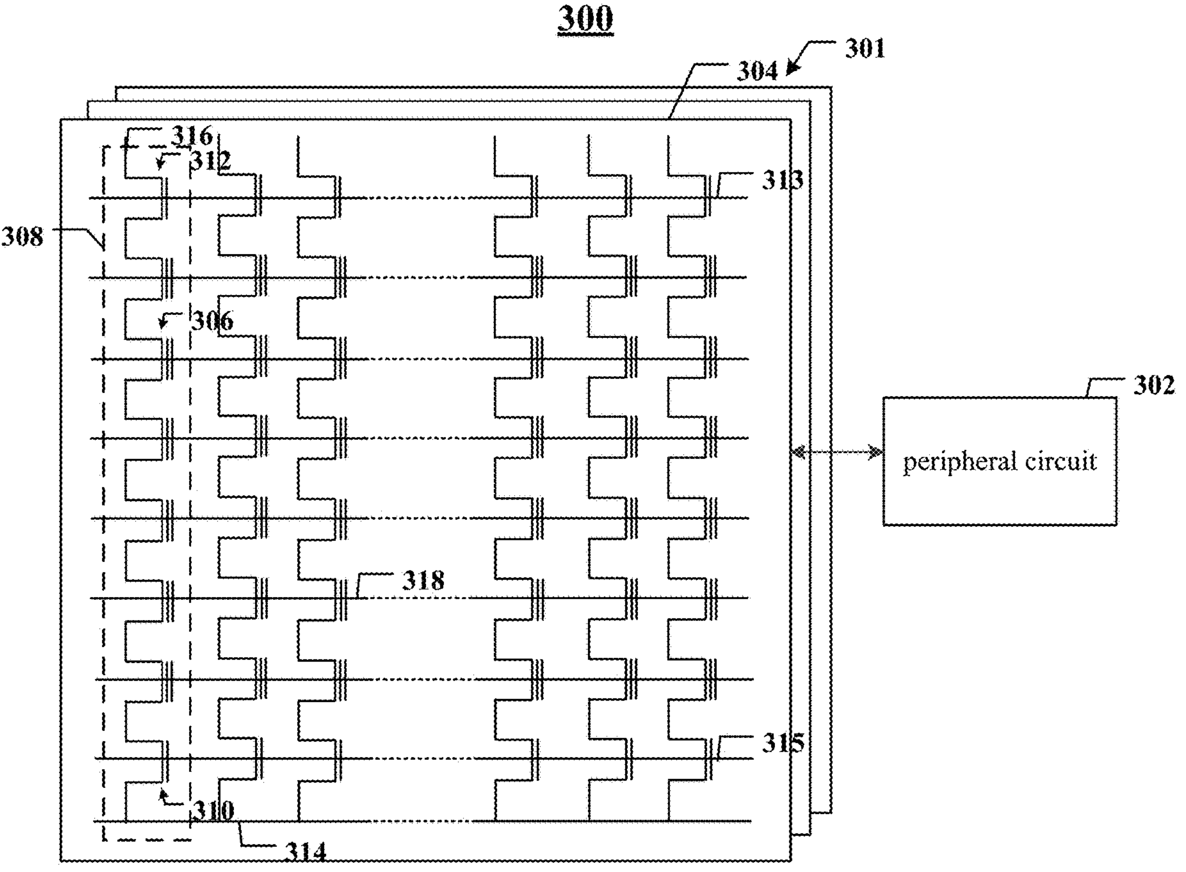
FIG. 3 is a schematic diagram of an example of a memory including peripheral circuits according to an example of the present disclosure.

FIG. 3 illustrates a schematic circuit diagram of an example of a memory device 300 including peripheral circuit according to some aspects of the present disclosure. Memory device 300 may be an example of memory device 104 in FIG. 1. The memory device 300 may include an array of memory cells 301 and a peripheral circuit 302 coupled to the array of memory cells 301. Taking memory cell array 301 being a three-dimensional NAND memory cell array as an example for illustration, where memory cells 306 is a NAND-type memory cell, and memory cells 306 are provided in the form of an array of memory strings 308, each memory string 308 extending vertically over a substrate (not shown). In some implementations, each memory string 308 includes multiple memory cells 306 coupled in series and stacked vertically. Each memory cell 306 may retain a continuous analog value, e.g., voltage or charge, depending on the number of electrons trapped within the area of the memory cell 306. Each memory cell 306 may be a "floating gate" type memory cell including a floating gate transistor, or a "charge trap" type memory cell including a charge trap transistor.

In some implementations, each memory cell 306 is a Single-level Cell (SLC) that has two possible memory states and may thus store one bit of data. For example, a first memory state of "0" may correspond to a first voltage range, and a second memory state of "1" may correspond to a second voltage range. In some implementations, each memory cell 306 is a Multi-Level Cell (MLC) capable of storing more than a single bit of data in more than four memory states. For example, an MLC may store two bits per cell (also known as a Double-Level Cell), three bits per cell (also known as a Trinary-Level Cell (TLC)), four bits per cell (also known as a Quad-Level Cell (QLC)), five bits per cell (also known as a Penta-level cell (PLC)), or more than five bits per cell. Each MLC can be programmed to assume a range of possible nominal storage values. In one example, if each MLC stores two bits of data, the MLC can be programmed to assume one of three possible programming levels from the erased state through writing one of three possible nominal storage values into the cell, a fourth nominal storage value may be used for the erase state.

It should be noted that the storage state mentioned here is also the storage state of the memory cell mentioned in this disclosure. Different memory cells have different numbers of storage states. e.g., an SLC type memory cell has 2 storage states (i.e., two memory states), where the 2 storage states include a programming state and an erase state. As another example, an MLC type memory cell has 4 storage states, where the four storage states include one erase state and three programming states. As yet another example, a TLC type memory cell has 8 storage states, where the 8 storage states include one erase state and seven programming states. In some implementations, the QLC type memory cell has 16 storage states, where the 16 storage states include one erase state and fifteen programming states.

As shown in FIG. 3, each memory string 308 may include a bottom select gate (BSG) 310 (also referred to as a source side select gate) at its source terminal and a top select gate (TSG) 312 (also referred to as a drain side select gate) at its drain terminal. BSG 310 and TSG 312 may be configured to activate the selected memory cell string 308 during read operation and program operation. In some implementations, the sources of memory strings 308 in a same memory block 304 are coupled through a same source line (SL) 314 (e.g., a common SL). In other words, according to some implementations, all memory strings 308 in a same memory block 304 have an array common source (ACS). According to some implementations, TSG 312 of each memory string 308 is coupled to a corresponding bit line (BL) 316 from which data may be read or written via an output bus (not shown). In some implementations, each memory string 308 is configured to be selected or deselected through applying a select voltage (e.g., above the threshold voltage of a transistor with a TSG 312) or a deselect voltage (e.g., 0V) to the corresponding TSG 312 via at least one of one or more TSG lines 313 or applying a select voltage (e.g., above the threshold voltage of a transistor with a BSG 310) or a deselect voltage (e.g., 0V) to the corresponding BSG 310 via one or more BSG lines 315.

As also shown in FIG. 3, a memory string 308 may be organized into multiple memory blocks 304 each of which may have a common source line 314 (e.g., coupled to ground). In some implementations, each memory block 304 is the basic data unit for an erase operation, i.e., all memory cells 306 on the same memory block 304 are erased simultaneously. To erase the memory cell 306 in the selected memory block 304, the source line 314 coupled to the selected memory block 304 and to the unselected memory blocks 304 in the same plane as the selected memory block 304 may be biased with an erase voltage (Vers) (e.g., a high positive voltage (e.g., 20V or higher)). It should be understood that, in some examples, erase operations may be performed at the half-memory block level, at the quarter-memory block level, or at a level with any suitable number of memory blocks or any suitable fraction of memory blocks. The memory cells 306 of adjacent memory strings 308 may be coupled through a word line 318 that selects which row of memory cells 306 is affected by read and program operations.

Referring to FIG. 3, each memory cell 306 of the multiple memory cells is coupled to a corresponding word line 318, and each memory string 308 is coupled to a corresponding bit line 316 through a corresponding select transistor (e.g., top select transistor (TSG) 312).

Figure 4:
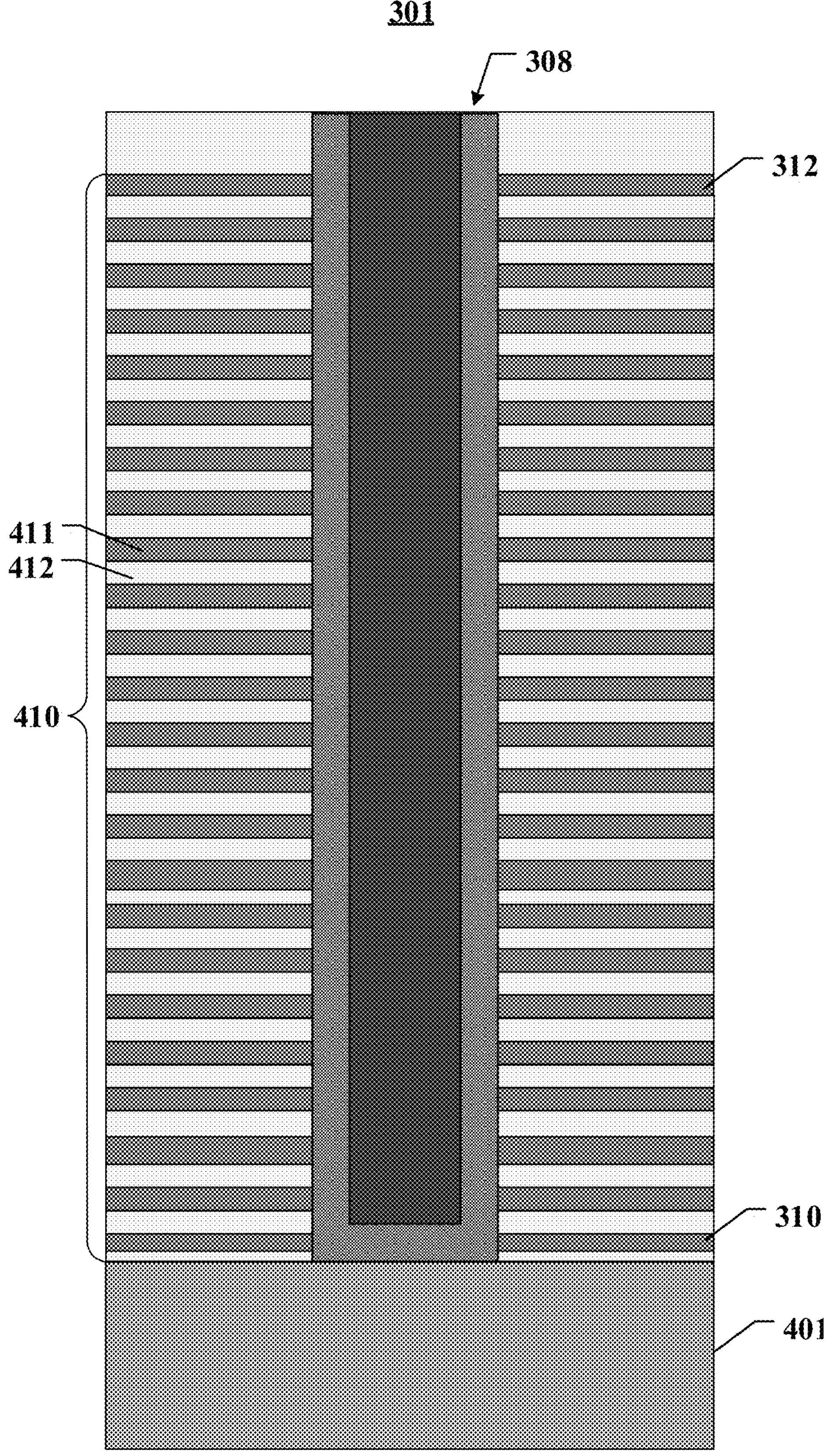
FIG. 4 is a schematic cross-sectional view of an array of memory cells including NAND-type memory strings according to an example of the present disclosure.

FIG. 4 illustrates a schematic cross-sectional view of an example of an array of memory cells 301 including memory strings 308, e.g., NAND, according to some aspects of the present disclosure. As shown in FIG. 4, the NAND memory cell array 301 may include a stacked structure 410, the stacked structure 410 includes multiple gate layers 411 and multiple insulating layers 412 alternately stacked in sequence, and the channel structure vertically penetrating through the gate layers 411 and the insulating layers 412, where the channel structure is coupled to each gate layer to form a memory cell, and the channel structure is coupled to multiple gate layers in the stacked structure 410 to form the memory string 308. Gate layers 411 and the insulating layers 412 may be stacked alternately, and two adjacent gate layers 411 are separated by an insulating layer 412.

A constituent material of the gate layer 411 may include a conductive material. Conductive materials include, but are not limited to, tungsten (W), cobalt (Co), copper (Cu), aluminum (Al), polysilicon, doped silicon, silicide, or any combination thereof. In some examples, each gate layer 411 includes a metal layer, e.g., a tungsten layer. In some examples, each gate layer 411 includes a doped polysilicon layer. Each gate layer 411 may include a control gate surrounding a memory cell. A gate layer 411 at the top of a stacked structure 410 may extend laterally as an upper selection gate line, a gate layer 411 at the bottom of a stacked structure 410 may extend laterally as a lower selection gate line, and a gate layer 411 extending laterally between a upper selection gate line and a lower selection gate line may serve as a word line layer.

In some examples, a stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some examples, a memory string 308 includes a channel structure extending vertically through stacked structure 410. In some implementations, a channel structure includes a channel hole filled with semiconductor material(s) (e.g., as a semiconductor channel) and dielectric material(s) (e.g., as a memory film). In some implementations, a semiconductor channel includes silicon, e.g., polysilicon. In some implementations, a memory film is a composite dielectric layer including a tunneling layer, a storage layer (also referred to as a "charge trapping/storage layer"), and a blocking layer. A channel structure may have a cylindrical shape (e.g., a pillar shape). According to some implementations, a semiconductor channel, a tunneling layer, a storage layer and a blocking layer are radially arranged in this order from the center of the pillar toward the outer surface of the pillar. A tunneling layer may include silicon oxide, silicon oxynitride, or any combination thereof. A storage layer may include silicon nitride, silicon oxynitride, or any combination thereof. A barrier layer may include silicon oxide, silicon oxynitride, a high-k (high-k) dielectric, or any combination thereof. In an example, a memory film may include a composite layer of silicon oxide/silicon oxynitride/silicon oxide (ONO).

Figure 5:
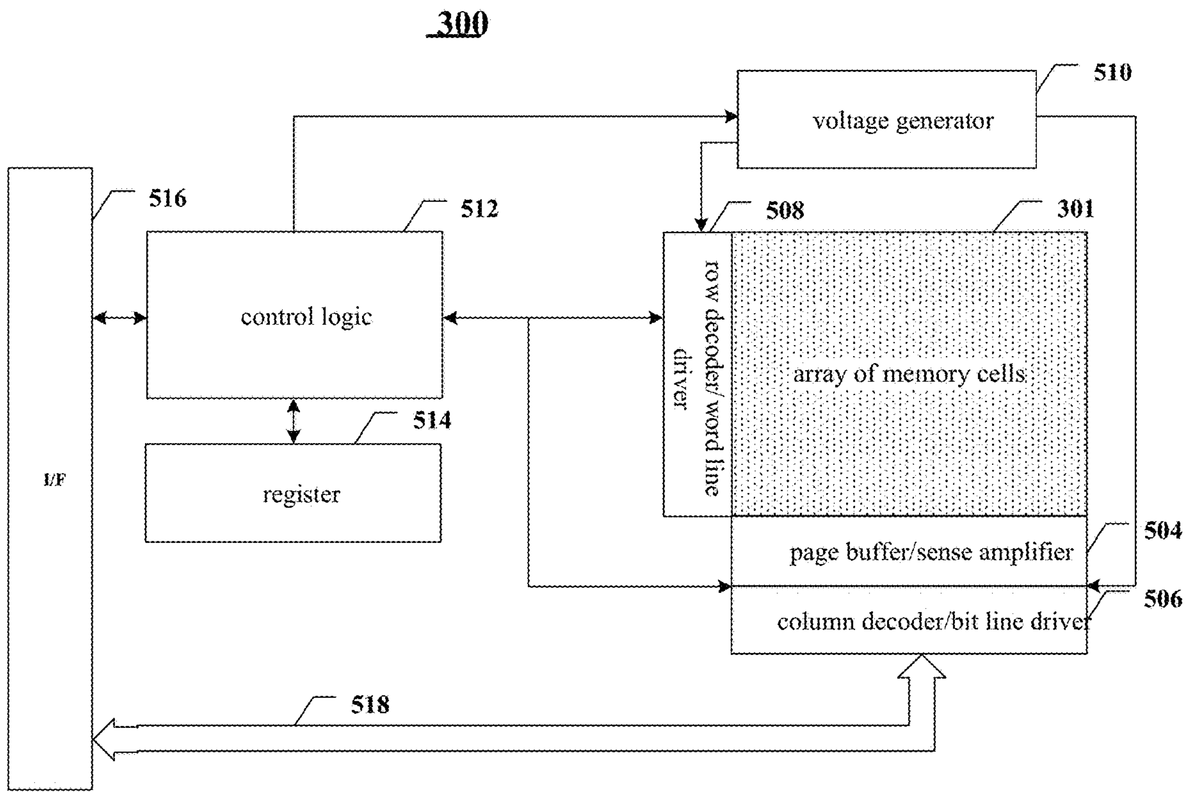
FIG. 5 is a schematic diagram of an example of a memory device including an array of memory cells and peripheral circuits according to an example of the present disclosure.

Referring back to FIG. 3, the peripheral circuit 302 may be coupled to the array of memory cells 301 through bit line 316, word line 318, source line 314, BSG line 315, and TSG line 313. The peripheral circuit 302 may include any suitable analog, digital, and mixed-signal circuit for facilitating operation of the array of memory cells 301 through applying at least one of a voltage signal or a current signal to and sensing at least one of voltage signal or current signal from each target memory cell 306 via bit line 316, word line 318, source line 314, BSG line 315, and TSG line 313. The peripheral circuit 302 may include various types of peripheral circuits formed with metal-oxide-semiconductor (MOS) technology. For example, FIG. 5 illustrates some example of a peripheral circuits, the peripheral circuit includes page buffer/sense amplifier 504, column decoder/bit line driver 506, row decoder/word line driver 508, voltage generator 510, control logic 512, register 514, interface 516 and data bus 518. It should be understood that in some examples, additional peripheral circuits not shown in FIG. 5 may also be included.

The page buffer/sense amplifier 504 may be configured to read data from and program (write) data to the array of memory cells 301 according to control signals from the control logic 512. In one example, the page buffer/sense amplifier 504 may store programming data (written data) to be programmed into the array of memory cells 301. In another example, the page buffer/sense amplifier 504 may perform a programming verify operation to ensure that data has been correctly programmed into memory cell 306 coupled to selected word line 318. In yet another example, the page buffer/sense amplifier 504 may also sense a low power signal from bit line 316 representing a data bit stored in memory cell 306 and amplify a small voltage swing to a recognizable logic level during a read operation. The column decoder/bit line driver 506 may be configured to be controlled by control logic 512 and to select one or more memory strings 308 through applying a bit line voltage generated from voltage generator 510.

The row decoder/word line driver 508 may be configured to be controlled by control logic 512 and select/deselect memory block 304 of memory cell array 301 and select/deselect word line 318 of memory block 304. The row decoder/word line driver 508 may also be configured to drive word line 318 with a word line voltage generated from voltage generator 510. In some implementations, the row decoder/word line driver 508 may also select/deselect and drive the BSG line 315 and the TSG line 313. As described in detail below, the row decoder/word line driver 508 is configured to perform programming operations on the memory cells 306 coupled to the selected word line 318. The voltage generator 510 may be configured to be controlled by the control logic 512, and generate word line voltage (e.g., read voltage, programming voltage, pass voltage, channel boost voltage, verify voltage, etc.), bit line voltage and source line voltage to be supplied to the array of memory cells 301.

The control logic 512 may be coupled to each of other portions of the peripheral circuit described above, and configured to control operations of each of the other portions of the peripheral circuit. The register 514 may be coupled to the control logic 512 and include status register, command register and address register for storing status information, command operation code (OP code) and command address for controlling operations of each of the peripheral circuits. The interface 516 may be coupled to control logic 512 and act as a control buffer to buffer and relay control commands received from a host (not shown) to control logic 512 and to buffer and relay status information received from the control logic 512 to the host. Interface 516 may also be coupled to column decoder/bit line driver 506 via data bus 518 and act as a data I/O interface and data buffer to buffer and relay data to/from memory cell array 301.

The basic principle of three-dimensional NAND memory is that carriers (electrons or holes) cross the charge barrier and inject a certain amount of charge into the memory cell to complete the process of data write, the storage data may then be read in accordance with the threshold voltage when the memory cell is turned on. Therefore, in order to read correct data, an error correction algorithm with strong error correction capability and high efficiency is usually introduced when reading data.

However, as the use time increases, the charge stored in the memory unit will change with the increase in use time, repeated read operations, cross temperature, etc., therefore affecting the accuracy of data reading. When the threshold voltage shifts upward or downward significantly, when the original read voltage is to read the data of the memory cell, the possibility of occurring read error will be very high, and a read error exceeding the error correction capability will also cause data read of the memory cell to fail.

Figure 6:
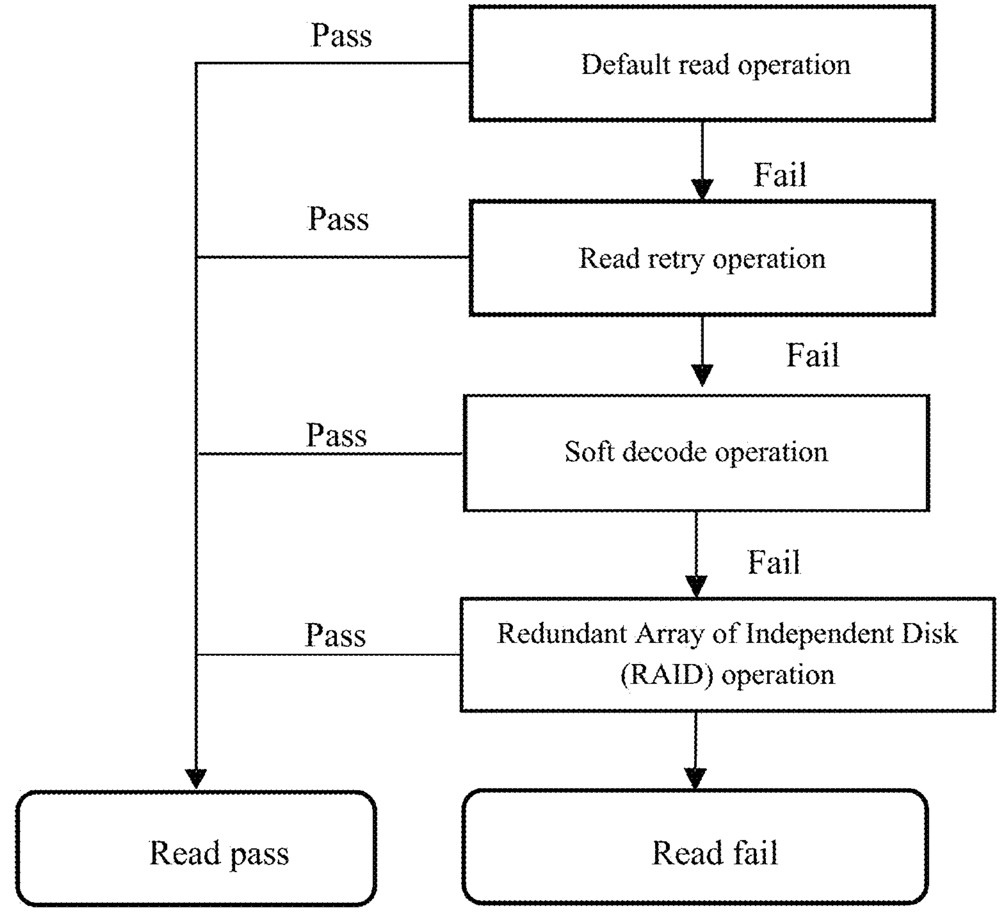
FIG. 6 is a schematic diagram of an example of a read operation flow of a memory system provided by the present disclosure.

FIG. 6 illustrates a schematic diagram of an example of a read operation flow of a memory system. In conjunction with what is shown in FIG. 6, when the memory controller controls the memory device to perform a read operation, a default read operation (FW) is first performed on the memory cell at the corresponding physical address; if the default read operation fails, a read retry operation is performed; after the read retry operation fails, a soft decode operation is performed; after the soft decode fails, a Redundant Array of Independent Disk (RAID) operation is performed; and after the RAID operation fails, the read operation stops and the read fails because the error cannot be corrected, then the memory controller sends a read fail signal to the host 108. Read retry operation and default read operation may be applicable to hard decode.

In some implementations, the read retry operation may usually be performed through querying the retry table provided by the manufacturer. The essence of the read retry operation is an error correction mechanism, the retry table may provide a reference voltage for reading data, which attempts to read each memory cell again with a read voltage that deviates from the normal threshold voltage through querying the retry table, combined with error correction algorithm for error correction, thereby attempting to read the data correctly. If the erroneous read data is corrected, query for the retry table is stopped. If the erroneous read data cannot be corrected, the retry table will be queried until the entire retry table is traversed.

The read retry operation described above requires querying the retry table one by one, which will inevitably increase the number of retry and take a long time. In addition, the retry table provided by the manufacturer is only a reference value in some environments, and the real usage scenarios are ever-changing, therefore, many scenarios cannot be covered by the retry table provided by the manufacturer, therefore, even if the retry table is traversed, the data may not be corrected, resulting in a lot of wasted time processing the command. In summary, the method of performing the read retry operation through repeatedly polling the retry table takes a long time, affects the response time of subsequent commands, and thus affects the performance of the device.

Based on one or more of the problems described above, in a first aspect, an example of this disclosure proposes a memory device.

Figure 7:
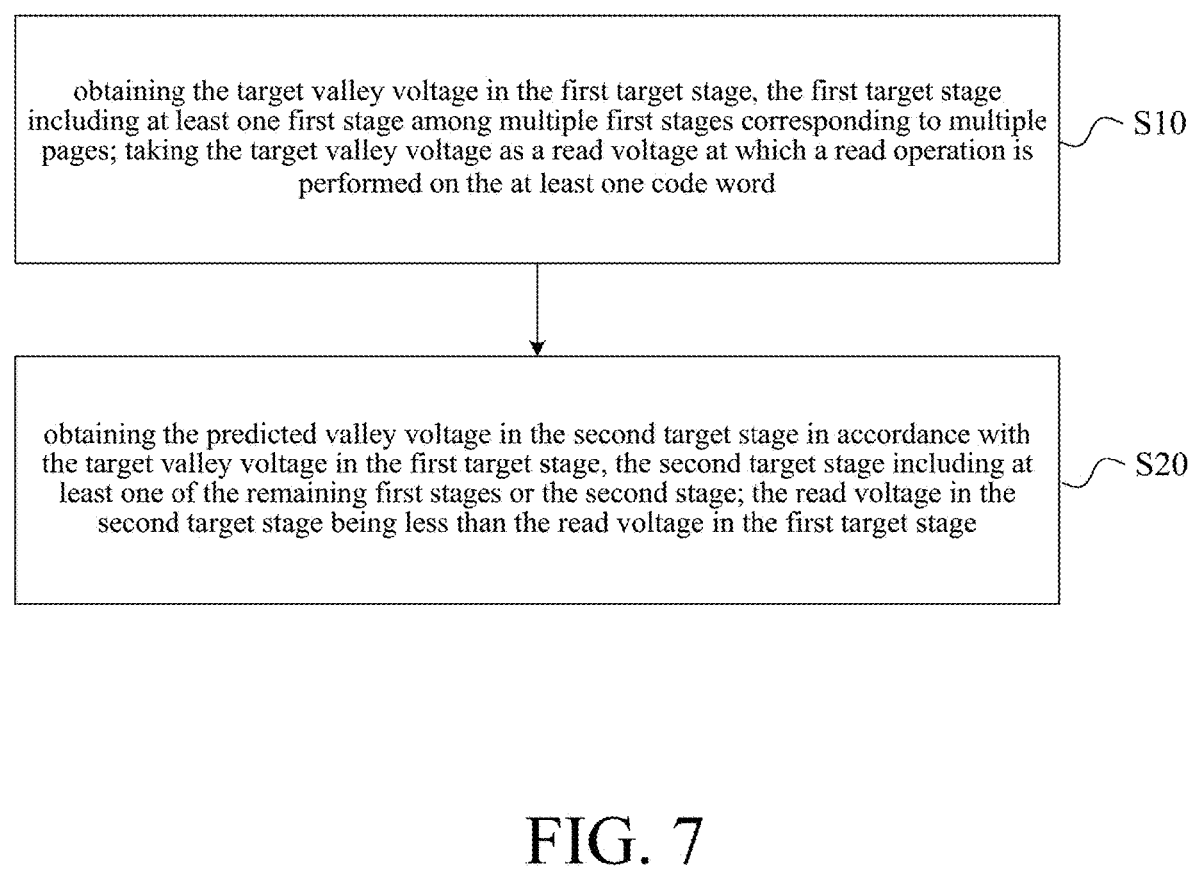

As shown in FIG. 7, the memory device includes: an array of memory cells including a memory cell with multiple storage bits; a preset number of the memory cells form one code word, and the multiple storage bits correspond to multiple pages respectively; at least one page corresponds to multiple stages, the multiple stages include a first stage and a second stage, and the read voltage in the second stage is less than the read voltage in the first stage; peripheral circuit coupled to the array of memory cells and configured to perform the following operations:

Operation S10: obtaining the target valley voltage in the first target stage, the first target stage including at least one first stage among multiple first stages corresponding to multiple pages; take the target valley voltage as a read voltage at which a read operation is performed on the at least one code word.

Operation S20: obtaining the predicted valley voltage in the second target stage in accordance with the target valley voltage in the first target stage, the second target stage including at least one of the remaining first stages or the second stage; the read voltage in the second target stage is less than the read voltage in the first target stage.

Here, the structure of the memory device refers to FIG. 3 described above and will not be repeated here.

In some examples, the memory device includes an array of memory cells, the array of memory cells including multiple memory cells, a preset number of the memory cells forming one code word (CW).

In some examples, the number of memory cells contained in one code word is the same as the number of memory cells contained in one encode or decode when error correction encode or decode is being performed. In some examples, the number of memory cells contained in a code word may be less than or equal to the number of memory cells coupled to a physical page, e.g., the number of memory cells contained in a code word is ¼ of the number of memory cells coupled to a physical page. In some examples, a code word may include a number ranging from $2^4$ to $2^{12}$ memory cells. In some examples, a code word may include $2^4$, $2^8$, or $2^{12}$ memory cells.

In general, different memory systems may choose code words with different sizes to meet their requirement for performance, reliability, and storage.

Memory cells in different types of memory devices (e.g., MLC, TLC or QLC) may store different numbers of bits.

It should be noted that in actual, some reserved space may be reserved in one code word for management and error correction, thus the actual number of memory cells required may slightly exceed the calculation results described above.

It may be understood that a code word may include multiple memory cells, and the number of memory cells included in a code word may be adjusted according to actual situations.

In some examples, the array of memory cells includes memory cells with M storage bits, and the M storage bits correspond to M pages respectively, and the M bit memory cells read their P bits of storage data through N-level read voltages; where M, N are both integers greater than 1, and $N=2^M-1$.

Figure 8A:
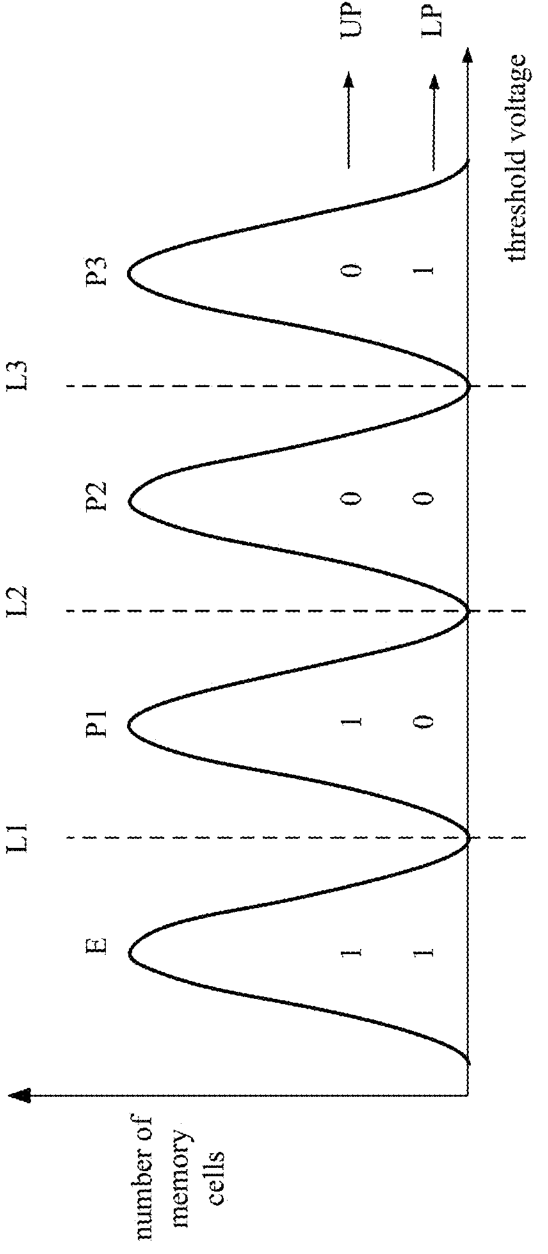
FIG. 8A is a schematic diagram of the threshold voltage distribution corresponding to a memory cell including 2 memory bits provided by an example of the present disclosure.

In one example, when the storage bits of the memory cell include two bits, the corresponding storage states include the 0-th state to the 4-th state, referring to FIG. 8A, the 4 states are the 0-th (also referred to as erase state) state E, the 1st state (also referred to as the 1st storage state) P1, the 2nd state (also referred to as the 2nd storage state) P2 and the 3rd state (also referred to as the 3rd storage state) P3, and the binary data corresponding to the 4 states are 11, 10, 00, 01 respectively. Accordingly, the memory device includes two pages, namely a Lower Page (LP) and an Upper Page (UP).

Taking the memory cell shown in FIG. 8A as an example, the memory cell with two bits reads its storage data having two bits and four states with read voltages at three levels (the first-level read voltage L1, the second-level read voltage L2, and the third-level read voltage L3 shown in FIG. 8A).

In one example, one page corresponds to read voltages at multiple levels, and another page corresponds to read voltages at one level, as shown in FIG. 8A, the binary data corresponding to the lower page is 1001, and reading the lower page requires corresponding first-level read voltage L1 and third-level read voltage L3. The binary data corresponding to the upper page is 1100, and reading the upper page requires corresponding second-level read voltage L2. In one example, when the storage bits of the memory cell include three bits, the corresponding storage states include the 0-th state to the 7-th state, referring to FIG. 8B, the 8 states are the 0-th (also referred to as erase state) state E, the 1st state (also referred to as the 1st storage state) P1, the 2nd state (also referred to as the 2nd storage state) P2 . . . the 7th state (also referred to as the 7-th storage state) P7, and the binary data corresponding to the 8 states are 111, 110, 100, 000, 010, 011, 001, 101, respectively. Accordingly, the memory device includes three pages, namely a Lower Page (LP), a Middle Page (MP), and an Upper Page (UP).

Figure 8B:
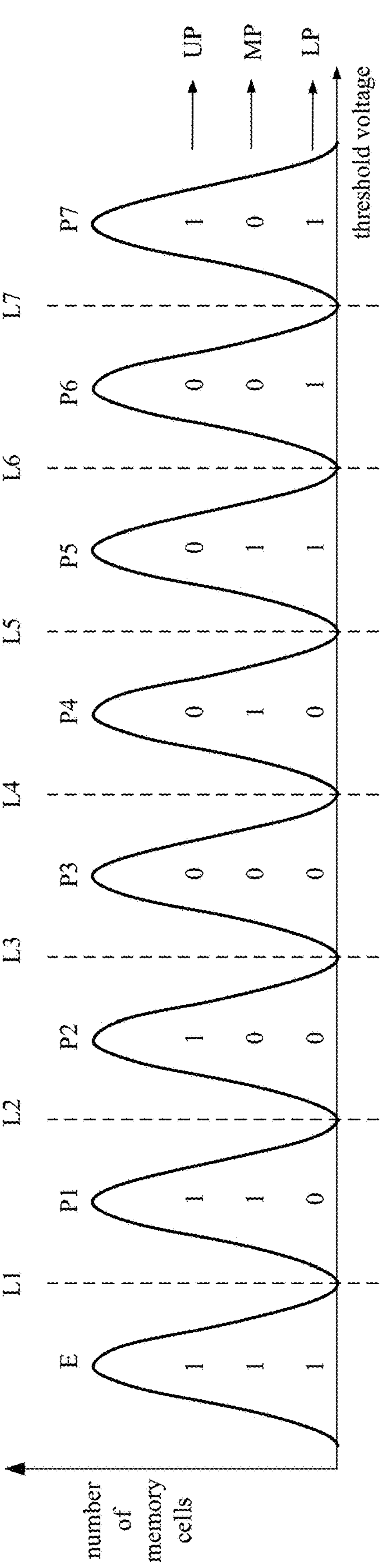
FIG. 8B is a schematic diagram of the threshold voltage distribution corresponding to a memory cell including 3 memory bits provided by an example of the present disclosure.

Taking the memory cell shown in FIG. 8B as an example, the memory cell with three bits reads its storage data having three bits and eight states with read voltages at seven levels (the first-level read voltage L1, the second-level read voltage L2, and the third-level read voltage L3, the fourth-level read voltage L4, the fifth-level read voltage L5, the sixth-level read voltage L6 and the seventh-level read voltage L7 as shown in FIG. 8B).

In one example, each page corresponds to read voltages at multiple levels, as shown in FIG. 8B, the binary data corresponding to the lower page is 10000111, and reading the lower page requires corresponding first-level read voltage L1 and fifth-level read voltage L5. The binary data corresponding to the middle page is 11001100, and reading the middle page requires corresponding second-level read voltage L2, fourth-level read voltage L4 and sixth-level read voltage L6. The binary data corresponding to the upper page is 11100001, and reading the upper page requires corresponding third-level read voltage L3 and seventh-level read voltage L7.

Figure 8C:
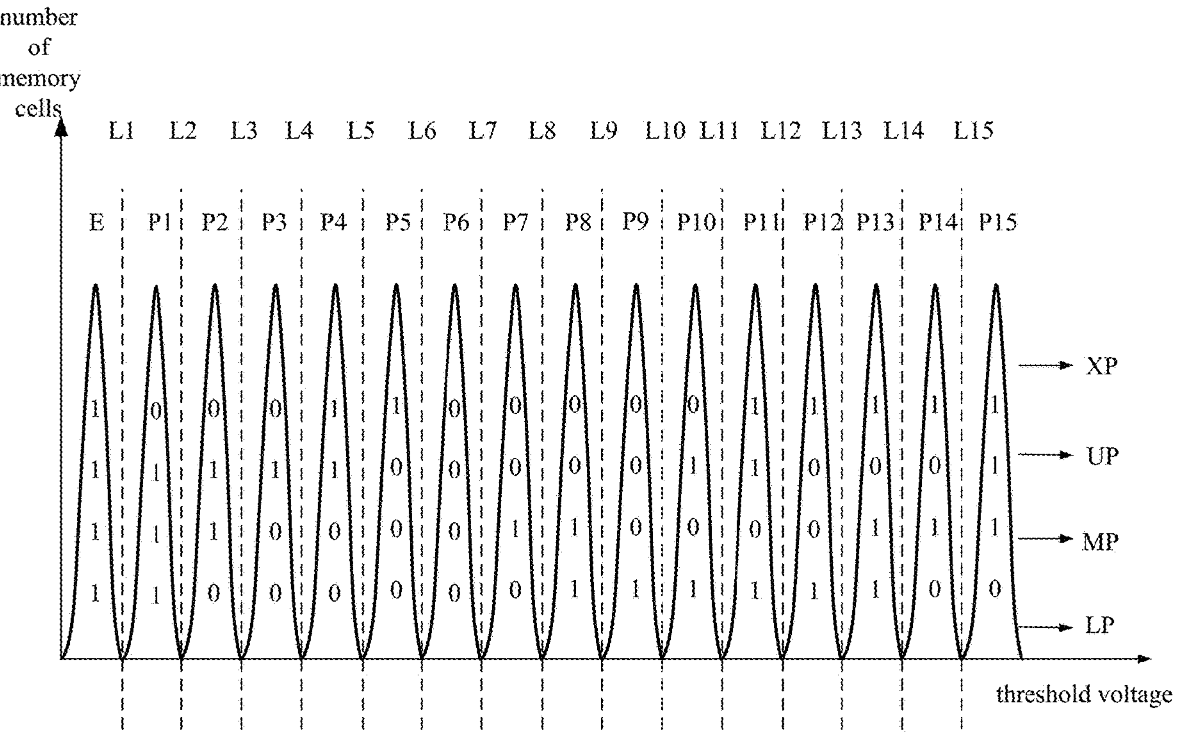
FIG. 8C is a schematic diagram of the threshold voltage distribution corresponding to a memory cell including 4 memory bits provided by an example of the present disclosure.

In one example, when the storage bits of the memory cell include four bits, the corresponding storage states include the 0-th state to the 15-th state, referring to FIG. 8C, the 16 states are the 0-th (also referred to as erase state) state E, the 1st state (also referred to as the 1st storage state) P1, the 2nd state (also referred to as the 2nd storage state) P2 . . . the 15-th state (also referred to as the 15-th storage state) P15, and the binary data corresponding to the 16 states are 1111, 0111, 0110 . . . 1110 respectively. Accordingly, the memory device includes four pages, namely lower page, middle page, upper page, and extra page (XP). Here, the four storage bits corresponding to the 16 states are stored in the lower page, middle page, upper page, and extra page respectively.

Taking the memory cell shown in FIG. 8C as an example, the four-bit memory cell reads its storage data having four bits and sixteen states with read voltages at 15 levels (the first-level read voltage L1, the second-level read voltage L2, and the third-level read voltage L3, the fourth-level read voltage L4, the fifth-level read voltage L5, the sixth-level read voltage L6, the seventh-level read voltage L7, the eighth-level read voltage L8, the ninth-level read voltage L9, the tenth-level read voltage L10, the eleventh-level read voltage L11, the twelfth-level read voltage L12, the thirteenth-level read voltage L13, the fourteenth-level read voltage L14, the fifteenth-level read voltage L15 as shown in FIG. 8C).

In one example, each page corresponds to read voltages at multiple levels, as shown in FIG. 8C, the binary data corresponding to the lower page is 1100000011111100, and reading the lower page requires corresponding second-level read voltage L2, eighth-level read voltage L8, and fourteenth-level read voltage L14. The binary data corresponding to the middle page is 1110000110000111, and reading the middle page requires corresponding third-level read voltage L3, seventh-level read voltage L7, ninth-level read voltage L9 and thirteenth-level read voltage L13. The binary data corresponding to the upper page is 1111100000110001, and reading the upper page requires corresponding fifth-level read voltage L5, tenth-level read voltage L10, twelfth-level read voltage L12, and fifteenth-level read voltage L15.

The binary data corresponding to the extra page is 1000110000011111, and reading the extra page requires corresponding first-level read voltage L1, fourth-level read voltage L4, sixth-level read voltage L6 and eleventh-level read voltage L11.

The lower page is usually closest to the source/drain, thus the read voltages at each of the levels corresponding to the lower page is determined preferentially, which is at the fastest access speed and with the shortest response time, and ensures balanced performance and durability during data access.

It should be noted that the method of preferentially determining the read voltages at each of the levels corresponding to the lower page is only an example and is not used to limit the sequence of determining the read voltages at each of the multiple levels corresponding to at least part of the pages in the example of the present disclosure.

In some examples, at least part of the pages corresponds to read voltages in multiple stages, the read voltages in multiple stages include a read voltage in a first stage and a read voltage in a second stage, where the read voltage in the second stage is less than the read voltage in the first stage. For example, the read voltage in the first stage may be understood as the highest read voltage among the read voltages in the multiple stages for each page, and the read voltage in the second stage may be understood as other read voltages less than the highest read voltage among the read voltages in the multiple stages for each page.

It should be noted that the first stage and the second stage are used to distinguish the high-level read voltage from the low-level read voltage in the read voltages in multiple stages corresponding to at least part of the pages, and the low-level read voltage is less than the high-level read voltage. For a memory cell containing multiple storage bits, a page corresponding to one storage bit may include one or more stages, and one stage may include one or more levels.

In some examples, referring to FIG. 8A, the memory device includes a lower page and an upper page, where the lower page corresponds to multiple stages, and the multiple stages correspond to the lower page include a first level and a third level, the first-level read voltage L1 is less than the third-level read voltage L3. Here, the third-level read voltage L3 corresponds to the read voltage in the first stage, and the first-level read voltage L1 corresponds to the read voltage in the second stage.

In some examples, referring to FIG. 8B, the memory device includes a lower page, a middle page and an upper page, where each page corresponds to multiple stages, the multiple stages corresponding to the lower page include a first level and a fifth level, and the first-level read voltage L1 is less than the fifth-level read voltage L5; the multiple stages corresponding to the middle page include a second level, a fourth level and a sixth level, and the second-level read voltage L2 and the fourth-level read voltage L4 are both less than the sixth-level read voltage L6; the multiple stages corresponding to the upper page include a third level and a seventh level, and the third-level read voltage L3 is less than the seventh-level read voltage L7. Here, the fifth-level read voltage L5, the sixth-level read voltage L6, and the seventh-level read voltage L7 correspond to the read voltages in the first stages for the low page, the middle page, and the upper page, respectively; and the first-level read voltage L1, the second-level read voltage L2, the fourth-level read voltage L4, and the third-level read voltage L3 correspond to the read voltages in the second stages for the lower page, the middle page, and the upper page, respectively.

In some examples, referring to FIG. 8C, the memory device includes a lower page, a middle page, an upper page and an extra page, where each page corresponds to multiple stages, the multiple stages corresponding to the lower page include a second level, an eighth level and a fourteenth level, the second-level read voltage L2 and the eighth-level read voltage L8 are both less than the fourteenth-level read voltage L14; the multiple stages corresponding to the middle page include a third level, a seventh level, a ninth level and a thirteenth level, the third-level read voltage L3, the seventh-level read voltage L7 and the ninth-level read voltage L9 are all less than the thirteenth-level read voltage L13; the multiple stages corresponding to the upper page include a fifth level, a tenth level, a twelfth level and a fifteenth level, the fifth-level read voltage L5, the tenth-level read voltage L10 and the twelfth-level read voltage L12 are less than the fifteenth-level read voltage L15; the multiple stages corresponding to the extra page include a first level, a fourth level, a sixth level and a eleventh level, the first-level read voltage L1, the fourth-level read voltage L4, and the sixth-level read voltage L6 are less than the eleventh-level read voltage L11. Here, the fourteenth-level read voltage L14, the thirteenth-level read voltage L13, the fifteenth-level read voltage L15 and the eleventh-level read voltage corresponds to the read voltages in the first stages for the lower page, the middle page, the upper page and the extra page, respectively; the second-level read voltage L2 and the eighth-level read voltage L8 correspond to the read voltages in the second stage for the lower page; the third-level read voltage L3, the seventh-level read voltage L7, and the ninth-level read voltage L9, correspond to the read voltage in the second stages for the middle page; the fifth-level read voltage L5, the tenth-level read voltage L10, and the twelfth-level read voltage L12 correspond to the read voltages in the second stages for the upper page; the first-level read voltage L1, the fourth-level read voltage L4, and the sixth-level read voltage L6 correspond to the read voltages in the second stages for the extra page.

In some examples, the peripheral circuit is configured to: obtain the target valley voltage in the first target stage, the first target stage including at least one first stage among multiple first stages corresponding to multiple pages; take the target valley voltage as a read voltage at which a read operation is performed on the at least one code word; and obtain the predicted valley voltage in the second target stage in accordance with the target valley voltage in the first target stage, the second target stage including at least one of the remaining first stages or the second stage; the read voltage in the second target stage is less than the read voltage in the first target stage.

Here and below, taking the array of memory cells including a memory cell with a storage number of 3 bits as an example for detailed description, but this is not used to limit the examples of the present disclosure. As shown in FIG. 8B, the fifth-level read voltage L5, the sixth-level read voltage L6, and the seventh-level read voltage L7 correspond to the read voltage in the first stage for the lower page, the middle page, and the upper page, respectively; and the first-level read voltage L1, the second-level read voltage L2, the fourth-level read voltage L4, and the third-level read voltage L3 correspond to the read voltage in the second stage for the lower page, the middle page, and the upper page, respectively. The first target stage includes at least one of a fifth-level read voltage L5, a sixth-level read voltage L6, and a seventh-level read voltage L7. The second target stage includes at least one of the remaining first stages or the second stage, e.g., when the first target stage is the seventh-level read voltage L7, the second target stage includes at least ones of the fifth-level read voltage L5, the sixth-level read voltage L5, the sixth-level read voltage L6 or the first-level read voltage L1, the second-level read voltage L2, and the fourth-level read voltage L4, the third-level read voltage L3.

In some examples, when the first target stage is the seventh-level read voltage L7, the predicted valley voltages in all the remaining first stages and second stages may be obtained in accordance with the target valley voltage for the seventh-level read voltage L7, i.e., the predicted valley voltages of the first-level read voltage L1, the second-level read voltage L2, the fourth-level read voltage L4, the fifth-level read voltage L5, and the sixth-level read voltage L6 may be directly obtained in accordance with the target valley voltage for the seventh-level read voltage L7.

It should be noted that the predicted valley voltage here may be directly taken as the target valley voltage to perform a read operation on the data to be read according to the requirements, or further processed to obtain the target valley voltage. The way for obtaining the predicted valley voltage will be further described later.

Figure 9:
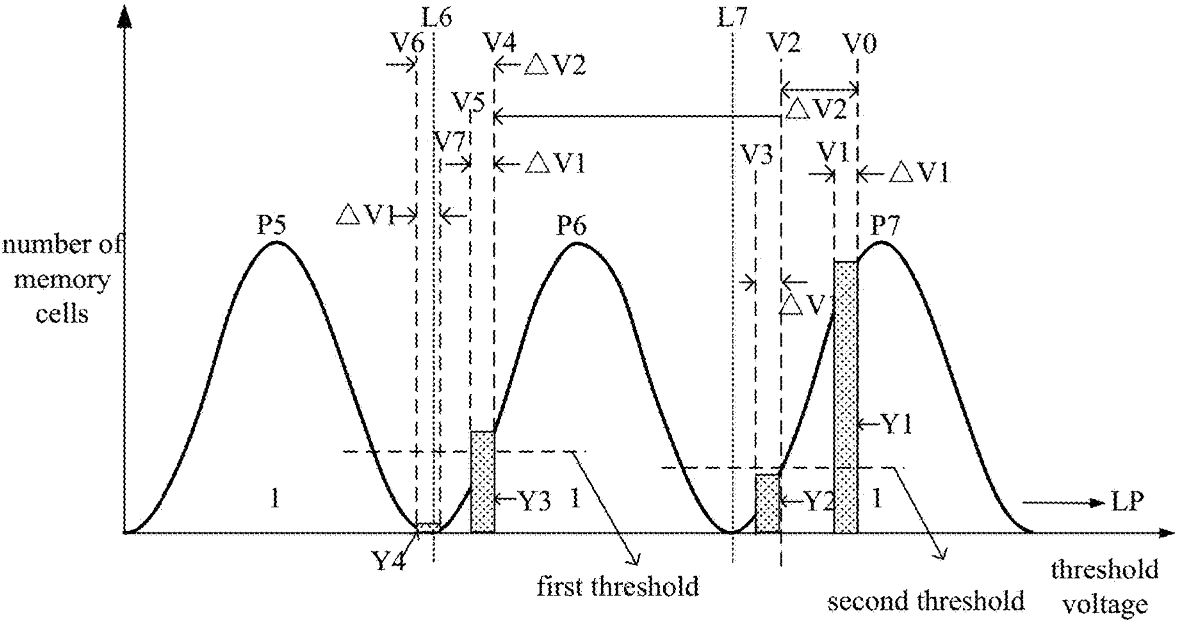
FIG. 9 is a schematic diagram of a method for confirming the valley voltage in the second target stage shown in FIG. 8B provided by an example of the present disclosure.

FIG. 9 is a schematic diagram of a confirm method for obtaining the target valley voltage in the second target stage shown in FIG. 8B provided by an example of the present disclosure. Referring to FIGS. 8B and 9, the peripheral circuit is configured to: obtain the target valley voltage in the first target stage (the seventh-level read voltage L7); in accordance with the target valley voltage in the first target stage (the seventh-level read voltage L7), obtain the predicted valley voltage in the second target stage (at least ones of the fifth-level read voltage L5, the sixth-level read voltage L6 or the first-level read voltage L1, the second-level read voltage L2, the fourth-level read voltage L4, and the third-level read voltage L3).

In some examples, the peripheral circuit is configured to: for a first target stage, obtain a first result corresponding to at least one code word at a target read voltage; the first result including the number of bits which represent the number of bits of the at least one code word which are flipped in two read results at a first read voltage and a second read voltage; the difference between the first read voltage and the second read voltage being less than a preset voltage; and make at least one adjustment to a target read voltage, and obtain the corresponding first result at the adjusted target read voltage after each adjustment; determine the target valley voltage in the first target stage in accordance with the multiple first results.

In some examples, during the process of reading the memory device, one read operation reads data of one physical page, and when the number of memory cells included in one code word may be less than the number of memory cells coupled to one physical page, the code word is a unit that may be performed to obtain the first result, but the case of multiple code words is not excluded. That is to say, the first result corresponding to at least one code word at the current read voltage may be obtained here. For example, a physical page may correspond to 4 code words, the hardware operation for the page buffer may count the Fail Bit Count (FBC) for each of the 4 code words at one time, and then the FBC for the four code words are added to obtain the FBC for one physical page, and the added value is used by subsequent calculations. It may be understood that the first result here may be based on data of one physical page, and one physical page may correspond to multiple code words.

It should be noted that the difference between the first read voltage and the second read voltage may be less than the preset voltage. In some examples, the second read voltage is greater than the first read voltage, and the range of the difference between the first read voltage and the second read voltage is set to 5 mV to 20 mV, e.g., the difference between the first read voltage and the second read voltage may be 5 mV, 10 mV, 15 mV, and 20 mV. In another some examples, the second read voltage is less than the first read voltage, and the range of the difference between the first read voltage and the second read voltage is set to −5 m V to −20 mV, e.g., the difference between the first read voltage and the second read voltage may be −5 mV, −10 mV, −15 mV, and −20 m V.

It should be noted that the first read voltage and the second read voltage here are sequentially related, that is to say, the second read voltage is obtained according to the first read voltage after a first adjustment. Based on this, the voltage difference between the first read voltage and the second read voltage is the step size for the first adjustment. The difference between the first read voltage and the second read voltage being less than the preset voltage may be understood that the voltage difference between the first read voltage and the second read voltage is small. The preset voltage is related to the step size for the first adjustment, and may be a voltage slightly larger than the step size for the first adjustment. In some examples, the range of the preset voltage is set to 6 mV to 21 mV, e.g., the preset voltage may be 6 mV, 11 mV, 16 mV, and 21 mV. In some examples, the range of the preset voltage is set to −6 mV to −21 mV, e.g., the preset voltage may be −6 mV, −10 mV, −16 mV, and −21 mV.

It should be noted that the first read voltage and the second read voltage are both general concepts, and the target read voltage and all read voltages obtained after a second adjustment to the target read voltage may be referred to as a first read voltage, and all read voltages obtained after the first adjustment to the first read voltage with a first step size may be referred to as a second read voltage. That is to say, the first read voltage is a general concept, which may be understood as the target read voltage or the target adjusted read voltage (the voltage obtained after a second adjustment to the target read voltage with the second step size; where, the range of the second step size may be set as 50 m V to 150 mV, e.g., the second step size may be 50 mV, 60 mV, 70 mV, 80 mV, 100 mV, 120 mV or 150 mV).

In examples of the present disclosure, a corresponding first result at a voltage may be understood as: a first adjustment is made to a voltage, i.e., a first voltage difference ΔV1 between the voltage and the voltage after the first adjustment exists, the number of bits of a preset number of memory cells which are flipped in two read results at the voltage and the voltage after the first adjustment may be taken as the corresponding first result at the voltage, where the preset number of memory cells may form at least one code word.

In some examples, a corresponding first result at a first read voltage may be understood as: a second read voltage is obtained by making a first adjustment to the first read voltage, i.e., a first voltage difference ΔV1 between the first read voltage and a second read voltage exists, the number of bits of a preset number of memory cells which are flipped in two read results at the first read voltage and the second read voltage may be taken as the corresponding first result at the first read voltage. The first read voltage may be the target read voltage in the first target stage (V0 shown in FIG. 9), and the second read voltage may be the read voltage obtained after the first adjustment to the first read voltage (V1 shown in FIG. 9); or the first read voltage may be the target adjusted read voltage in the first target stage (V2 shown in FIG. 9), and the second read voltage may be the read voltage obtained after the first adjustment to the target adjusted read voltage (V3 shown in FIG. 9).

In some examples, before obtaining the first result corresponding to at least one code word at the target read voltage in the first target stage, the read mode of the memory device is set to a Single Level Read (SLR) mode; the single-level read mode includes reading at least one bit of storage data stored in the memory cell with a one-level read voltage.

In some examples, the memory device is configured to: enter a single-level read mode in response to a mode set command, and, in the single-level read mode, obtain a first result corresponding to at least one code word at the target read voltage in the first target stage.

In some examples, as shown in FIG. 9, peripheral circuit is configured to: for the seventh-level read voltage L7, obtain a first result Y1 corresponding to at least one code word at the target read voltage (V0 shown in FIG. 9); and make at least one adjustment to a target read voltage (V0 shown in FIG. 9), and obtain the first result Y2 corresponding to the adjusted target read voltage (V2 shown in FIG. 9) after each adjustment; determine the target valley voltage for the seventh-level read voltage L7 in accordance with the multiple first results.

In some examples, at least one adjustment may be a second adjustment; the second adjustment may be understood as an adjustment with a relatively large amplitude, and the amplitude of the second adjustment is greater than the amplitude of the first adjustment. In some examples, the range of the step size for the second adjustment is set to 50 mV to 150 mV, e.g., the step size for the second adjustment may be 50 mV, 60 mV, 70 mV, 80 mV, 100 mV, 120 mV or 150 mV. In some examples, as shown in FIG. 9, a second adjustment is made to the target read voltage of the seventh-level read voltage (V0 shown in FIG. 9) to obtain the adjusted target read voltage (V2 shown in FIG. 9), there is a second voltage difference ΔV2 between the target read voltage V3 after the adjustment (V2 shown in FIG. 9) and the target read voltage of the seventh-level read voltage (V0 shown in FIG. 9), and the magnitude of the second voltage difference ΔV2 is the step size for the second adjustment. The step size for the second adjustment is greater than the step size for the first adjustment, i.e., the second voltage difference ΔV2 is greater than the first voltage difference ΔV1.

In some examples, if the corresponding first result at the target read voltage after one adjustment is lower than the second threshold, or taking the minimum first result among the multiple first results corresponding to the target read voltages after multiple adjustments as a reference value, the number of first results from remaining first results which differ from the reference value with a difference being less than the third threshold is greater than the preset number, the adjustment is stopped and the target read voltage corresponding to the minimum first result among the multiple first results is taken as the target valley voltage.

In some examples, the second threshold is taken as the threshold for determining the target valley voltage, that is, when the first result is less than or equal to the second threshold, it indicates that the error rate of the read result is low and the reliability of the read result is high when the read voltage corresponding to the first result is taken as the target valley voltage.

The magnitude of the second threshold is related to the type of memory device, storage density, etc. The second threshold may be an empirical value, or it may be a default value configured when the memory device leaves the factory, the default value is obtained through extensive simulation experiments before the memory device leaves the factory. In some examples, the range of the second threshold is set to 5 to 30, and in a further example, the second threshold may be 5, 10, 15, 20, 25, 30.

As shown in FIG. 9, the corresponding first result Y2 at the adjusted target read voltage (V2 shown in FIG. 9) is less than the second threshold, thus the adjusted target read voltage (V2 shown in FIG. 9) is determined as the target valley voltage for the seventh-level read voltage L7.

In some examples, the peripheral circuit is configured to: obtain the predicted valley voltage in the second target stage in accordance with the target valley voltage in the first target stage and the mapping function, and the mapping function represents the relationship between the target valley voltage in the first target stage and the predicted valley voltage in the second target stage.

In some examples, the peripheral circuit is configured to: obtain the predicted valley voltage in the second target stage in accordance with the target valley voltage in the first target stage, the first adjustment coefficient, the second adjustment coefficient, and the third adjustment coefficient in the mapping function; the first adjustment coefficient, the second adjustment coefficient, and the third adjustment coefficient are all fixed values related to the stage number in which the read voltage is.

It should be noted that the predicted valley voltage may be directly taken as the target valley voltage to perform a read operation on the data to be read according to the requirements, or further processed to obtain the target valley voltage. For ease of explanation, the mapping function in this example is also referred to as the second mapping function, i.e., the second mapping function represents the relationship between the target valley voltage/predicted valley voltage in the first target stage and the predicted valley voltage in the second target stage.

In some examples, in accordance with the target valley voltage valley_shift in the first target stage, the first adjustment coefficient dir, the second adjustment coefficient pred_ref and the third adjustment coefficient pred_mult, the reference shift ref_sft and the predicted shift pred_sft for the predicted valley voltage pred_valley in the second target stage relative to the target read voltage v_default in the second target stage are obtained. In some examples, the equation (1) for obtaining the reference shift ref_sft is: ref_sft=dir*valley_shift. The equation (2) for obtaining the predicted shift pred_sft is: pred_sft−ref_sft/pred_ref+ref_sft/(pred_ref*pred_mult).

Here, the target read voltage v_default in the second target stage may refer to the preset read voltage that may distinguish two adjacent storage states of the memory cell of the memory device in the previous read processes, where the preset read voltage may be an empirical value, or it may be a default value configured when the memory device leaves the factory, where the default value is obtained through extensive simulation experiments before the memory device leaves the factory.

It should be noted that A/B in equation (2) represents the quotient obtained through dividing A by B, e.g., ref_sft/pred_ref represents the quotient obtained through dividing the reference shift ref_sft by the predicted shift pred_sft. In some examples, when the reference shift ref_sft is −35 and the predicted shift pred_sft is 14, the result of ref_sft/pred_ref is −2.

In some examples, the predicted valley voltage pred_valley in the second target stage is obtained based on the target read voltage v_default in the second target stage and the predicted shift pred_sft.

For example, the equation (3) for obtaining the predicted valley voltage pred_valley in the second target stage is: pred_valley=pred_sft+v_default.

For example, taking TLC as an example, the example of a first adjustment coefficient dir is 1 or −1. It should be noted that when the second target stage is the second-level read voltage L2 or the third-level read voltage L3, the first adjustment coefficient dir is −1, and when the second target stage is the first-level read voltage L1, the fourth-level read voltage L4, the fifth-level read voltage L5, or the sixth-level read voltage L6, the first adjustment coefficient dir is 1.

An example of a second adjustment coefficient pred_ref is {DMY, 1, 1, 1, 4, 7, 2, 14}. In some implementations, the value of the second adjustment coefficient pred_ref is related to the stage number in which the read voltage is, in a further example, the value of the second adjustment coefficient pred_ref is related to the level number at which the read voltage is, when the read voltages for obtaining the predicted valley voltage in the second target stage are the target valley voltage for the first-level read voltage L1, the target valley voltage for the second-level read voltage L2, the target valley voltage for the third-level read voltage L3, the target valley voltage for the fourth-level read voltage L4, the target valley voltage for the fifth-level read voltage L5, the target valley voltage for the sixth-level read voltage L6, the target valley voltage for the seventh-level read voltage L7 respectively, the values of the second adjustment coefficient pred_ref are 1, 1, 1, 4, 7, 2, and 14 respectively.

An example of a third adjustment coefficient pred_mult is {DMY, 1, 1, 1, 3, 1, 4, 3}. In some implementations, the value of the third adjustment coefficient pred_mult is related to the stage number in which the read voltage is, in a further example, the value of the third adjustment coefficient pred_mult is related to the level number at which the read voltage is, when the read voltages used to obtain the predicted valley voltage in the second target stage are the target valley voltage for the first-level read voltage L1, the target valley voltage for the second-level read voltage L2, the target valley voltage for the third-level read voltage L3, the target valley voltage for the fourth-level read voltage L4, the target valley voltage for the fifth-level read voltage L5, the target valley voltage for the sixth-level read voltage L6, the target valley voltage for the seventh-level read voltage L7 respectively, the values of the third adjustment coefficient pred_mult are 1, 1, 1, 3, 1, 4, and 3 respectively.

It should be noted that the first adjustment coefficient dir, the second adjustment coefficient pred_ref and the third adjustment coefficient pred_mult are all fixed values related to the stage number in which the read voltage is, and the first adjustment coefficient dir, the second adjustment coefficient pred_ref and the third adjustment coefficient pred_mult may be empirical values; or may be default values configured when the memory device leaves the factory, the default value is obtained through extensive simulation experiments before the memory device leaves the factory.

In some examples, as shown in FIG. 9, peripheral circuit is configured to: obtain the predicted valley voltage for the sixth-level read voltage L6 (V4 shown in FIG. 9) in accordance with the target valley voltage for the seventh-level read voltage L7 (V2 shown in FIG. 9) and the mapping function, and the mapping function represents the relationship between the target valley voltage for the seventh-level read voltage L7 and predicted valley voltage for the sixth-level read voltage L6.

In an implementation, combined with the examples of the first adjustment coefficient, the second adjustment coefficient and the third adjustment coefficient in the example described above where taking TLC as an example and FIG. 9, since the first target stage is the seventh-level read voltage L7, and the second target stage is the sixth-level read voltage L6, thus the first adjustment coefficient dir takes a value of 1, the second adjustment coefficient pred_sft takes a value of 14, and the third adjustment coefficient pred_mult takes a value of 3. In some examples, the target valley voltage for the seventh-level read voltage L7 is −35 DAC (DAC represents a unit of voltage offset), and −35 DAC represents the shift of the target valley voltage for the seventh-level read voltage L7 relative to the target read voltage of the seventh-level read voltage L7, thus a reference shift ref_sft=(−1)*(−35) may be obtained according to equation (1), and a predicted shift pred_sft=(−1)*(−35)/14+1*(−35)/(14*3)=2 DAC may be obtained according to equation (2), and a predicted valley voltage pred_valley=2 DAC+v_default of the sixth-level read voltage L6 may be obtained according to equation (3), it may be understood that the magnitude of the predicted valley voltage pred_valley for the sixth-level read voltage L6 is an shift of 2 DAC relative to the target read voltage of the sixth-level read voltage L6.

The equation described above and related parameters (e.g., the first adjustment coefficient, the second adjustment coefficient, the third adjustment coefficient) are only taken as an example, and the equation and related parameters in the examples of the present disclosure may be adjusted according to the actual product performance.

It should be noted that the conversion relationship between DAC and the aforementioned mV is 1 DAC=10 mV.

In some examples, the peripheral circuit is configured to: for a second target stage, obtain a first result corresponding to at least one code word at the target read voltage; and obtain a first threshold in accordance with the corresponding first result at the target read voltage; the first threshold represents the corresponding first result at the upper limit of the predicted valley voltage; when the corresponding first result at the predicted valley voltage in the second target stage is less than the first threshold, determine the predicted valley voltage in the second target stage to be the target valley voltage in the second target stage.

In some examples, peripheral circuit is configured to: when the corresponding first result at the predicted valley voltage in the second target stage is greater than or equal to the first threshold, make at least one adjustment to the predicted valley voltage read voltage in the second target stage, and obtain the corresponding first result at the adjusted target read voltage after each adjustment; determine the target valley voltage in the second target stage in accordance with the multiple first results.

In some examples, the first threshold is greater than or equal to the second threshold.

In some examples, as shown in FIG. 9, peripheral circuit is configured to: for the sixth-level read voltage L6, obtain a first result corresponding to at least one code word at the target read voltage; and obtain a first threshold in accordance with the corresponding first result at the target read voltage; the first threshold represents the corresponding first result at the upper limit of the predicted valley voltage. Here the target read voltage for the sixth-level read voltage L6 may be an empirical value, or it may be a default value configured when the memory device leaves the factory.

As shown in FIG. 9, the first result Y3 corresponding to the predicted valley voltage for the sixth-level read voltage L6 (V4 shown in FIG. 9) is greater than the first threshold, thus at least one adjustment is made to the predicted valley voltage for the sixth-level read voltage L6 (V4 shown in FIG. 9), and the first result Y4 corresponding to the adjusted target read voltage is obtained after each adjustment (V6 shown in FIG. 9); the target valley voltage for the sixth-level read voltage L6 is determined in accordance with the multiple first results.

The first result Y3 is the number of bits flipped in two read results at the first read voltage V4 and the second read voltage V5. The first result Y4 is the number of bits flipped in two read results at the first read voltage V6 and the second read voltage V7.

In some examples, there is a second voltage difference ΔV2 between the adjusted target read voltage (V6 shown in FIG. 9) and the predicted read voltage for the sixth-level read voltage (V4 shown in FIG. 9).

As shown in FIG. 9, since the first result Y4 corresponding to the adjusted target read voltage (V6 shown in FIG. 9) is less than the second threshold, thus the adjusted target read voltage (V4 shown in FIG. 9) is determined as the target valley voltage for the sixth-level read voltage.

In another example, the peripheral circuit is configured to: when the corresponding first result at the predicted valley voltage in the second target stage is greater than or equal to the first threshold, obtain the predicted valley voltage in the second target stage in accordance with the target valley voltage in the first target stage and an alternate adjustment coefficient of the mapping function, and the mapping function represents the relationship between the target valley voltage in the first target stage and the predicted valley voltage in the second target stage.

In some examples, as shown in FIG. 9, peripheral circuit is configured to: when the first result Y3 corresponding to the predicted valley voltage for the sixth-level read voltage L6 (V4 shown in FIG. 9) is greater than the first threshold, obtain the predicted valley voltage for the sixth-level read voltage L6 in accordance with the target valley voltage for the seventh-level read voltage L7 and the alternate adjustment coefficient of the mapping function, and the mapping function represents the relationship between the target valley voltage for the seventh-level read voltage L7 and predicted valley voltage for the sixth-level read voltage L6.

It should be noted that FIG. 9 takes the first target stage as the seventh-level read voltage L7 as an example, and illustrates the process of obtaining the predicted valley voltage for the sixth-level read voltage L6 in accordance with the target valley voltage for the seventh-level read voltage L7, and the process of obtaining predicted valley voltages in other second stages in accordance with the seventh-level read voltage L7 may be referred to the relevant description and will not be repeated here.

In other examples, the predicted valley voltage for the sixth-level read voltage L6 may be obtained in accordance with the seventh-level read voltage L7, the target valley voltage for the sixth-level read voltage may be obtained in accordance with the predicted valley voltage for the sixth-level read voltage L6, and then the predicted valley voltage for the fifth-level read voltage L5 may be obtained in accordance with the valley voltage for the sixth-level read voltage L6, by analogy, the target valley voltages for the fifth-level read voltage L5, the fourth-level read voltage L4, the third-level read voltage L3, the second-level read voltage L2, and the first-level read voltage L1 are obtained in sequence.

In some examples, the peripheral circuit is configured to: obtain the target valley voltage in the first stage for each of the multiple pages; and in accordance with the target valley voltage in the first stage for each page, obtain the predicted valley voltage in the second stage for the same page to which the first stage belongs to.

In some examples, as shown in FIGS. 10A, 10B, 10C and 10D, the number of storage bits of the memory unit of at least one code word is 3 bits, corresponding to the lower page, the middle page, and the upper page respectively; each page corresponds to multiple stages, the multiple stages for the lower page include a first level and a fifth level, and the first-level read voltage L1 is less than the fifth-level read voltage L5; the multiple stages for the middle page include a second level, a fourth level and a sixth level, and the second-level read voltage L2 and the fourth-level read voltage L4 are both less than the sixth-level read voltage L6; the multiple stages for the upper page include a third level and a seventh level, and the third-level read voltage L3 is less than the seventh-level read voltage L7. Here, the fifth-level read voltage L5, the sixth-level read voltage L6, and the seventh-level read voltage L7 correspond to the read voltages in the first stages for the lower page, the middle page, and the upper page, respectively; and the first-level read voltage L1, the second-level read voltage L2, the fourth-level read voltage L4, and the third-level read voltage L3 correspond to the read voltage in the second stage for the lower page, the middle page, and the upper page, respectively.

Figure 10A:
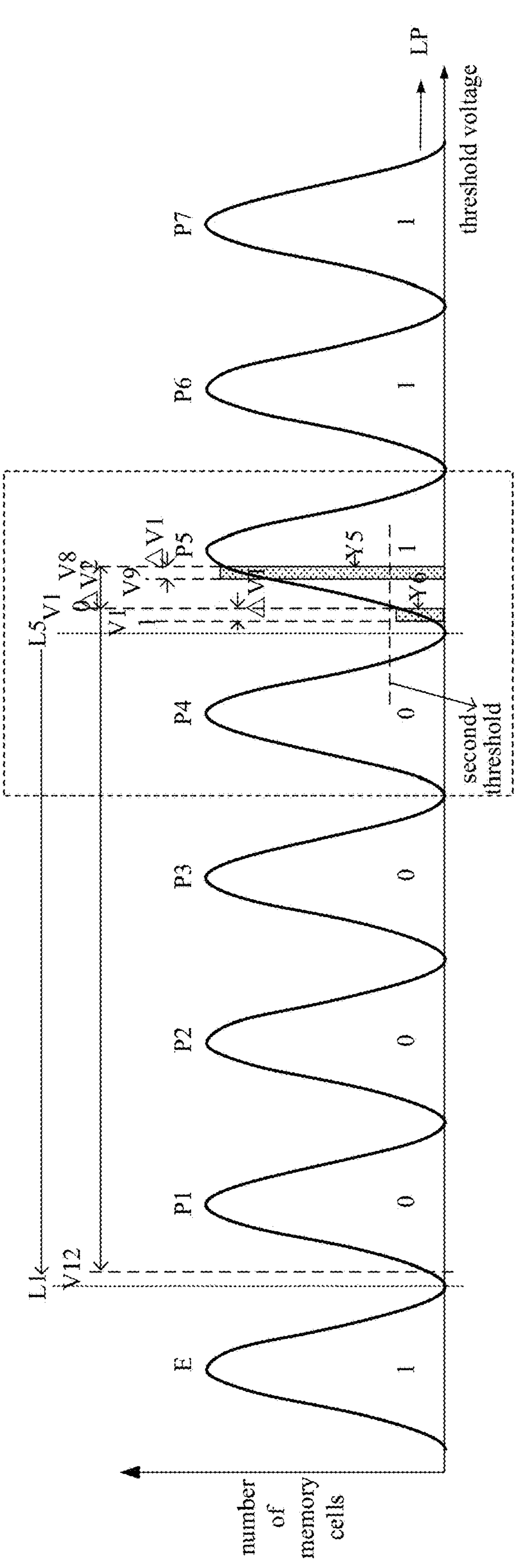
FIG. 10A is a schematic diagram of a method for confirming the predicted valley voltage in the second target stage corresponding to the lower page shown in FIG. 8B provided by an example of the present disclosure.
Figure 10B:
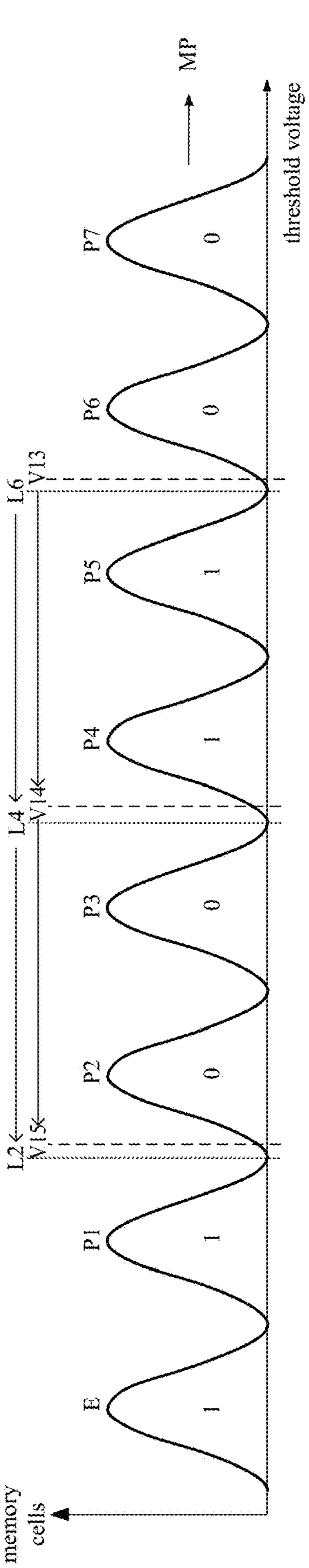
FIG. 10B is a schematic diagram of a method for confirming the predicted valley voltage in the second target stage corresponding to the middle page shown in FIG. 8B provided by an example of the present disclosure.
Figure 10C:
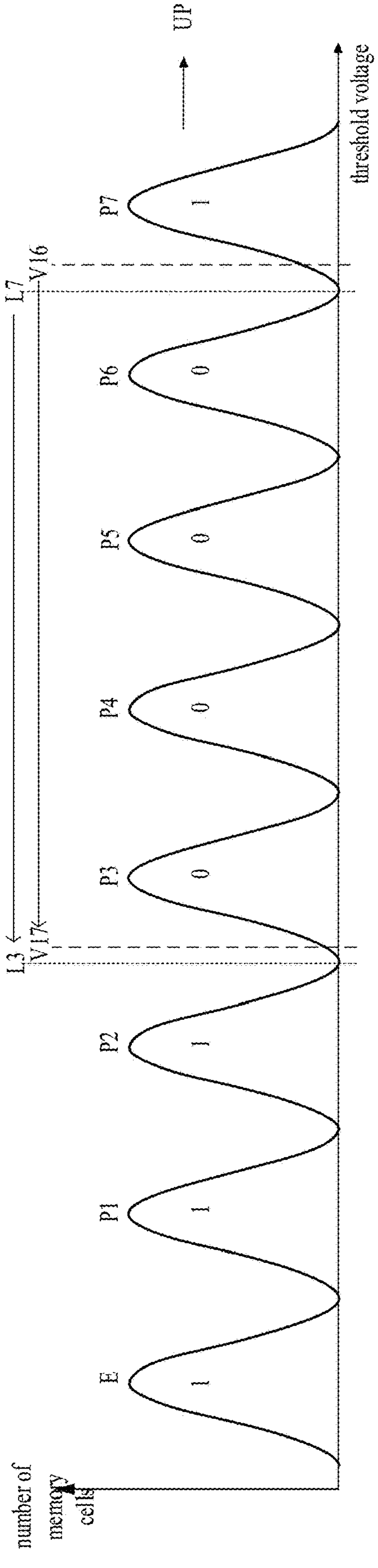
FIG. 10C is a schematic diagram of a method for confirming the predicted valley voltage in the second target stage corresponding to the upper page shown in FIG. 8B provided by an example of the present disclosure.
Figure 10D:
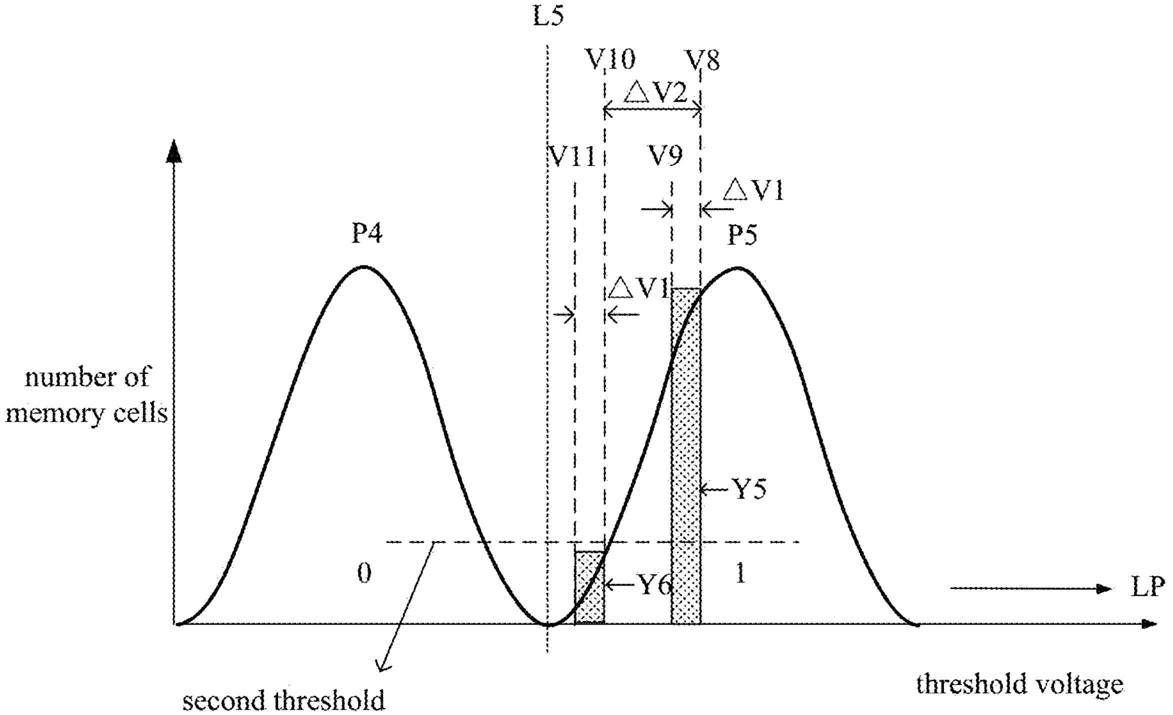
FIG. 10D is an enlarged schematic diagram of the rectangular dotted frame area of FIG. 10A.

In some examples, as shown in FIGS. 10A and 10D, the peripheral circuit is configured to: obtain the target valley voltage for the fifth-level read voltage L5 for the lower page among multiple pages; obtain a predicted valley voltage for the first-level read voltage L1 for the lower page in accordance with the target valley voltage for the fifth-level read voltage L5 for the lower page.

In some examples, for the fifth-level read voltage L5, a first result Y5 corresponding to at least one code word at the target read voltage (V8 shown in FIG. 10A) is obtained; and at least one adjustment is made to a target read voltage (V8 shown in FIGS. 10A and 10D), and the first result Y6 corresponding to the adjusted target read voltage (V10 shown in FIGS. 10A and 10D) is obtained after each adjustment; the fifth-level read voltage L5 is determined in accordance with the multiple first results.

The first result Y5 is the number of bits flipped in two read results at the first read voltage V8 and the second read voltage V9. The first result Y6 is the number of bits flipped in two read results at the first read voltage V10 and the second read voltage V11.

Referring to the process of determining the target valley voltage for the seventh-level read voltage L7 in FIG. 9, since the first result Y6 corresponding to the adjusted target read voltage (V10 shown in FIGS. 10A and 10D) is less than the second threshold, thus the adjusted target read voltage (V10 shown in FIG. 10A) is determined as the target valley voltage for the fifth-level read voltage L5.

As shown in FIGS. 10A and 10D, the peripheral circuit is configured to: obtain the predicted valley voltage for the first-level read voltage L1 (V12 shown in FIG. 10A) in accordance with the target valley voltage for the fifth-level read voltage L5 (V10 shown in FIGS. 10A and 10D) and a mapping function. The process of obtaining the target valley voltage for the first-level read voltage L1 in accordance with the predicted valley voltage for the first-level read voltage L1 (V12 shown in FIG. 10A) may be referred to the process of obtaining the target valley voltage for the sixth-level read voltage L6 in accordance with the predicted valley voltage for the sixth-level read voltage L6 in FIG. 9, which will not be repeated here.

In some examples, each of the multiple pages contains multiple second stages; the peripheral circuit is configured to: in accordance with the valley voltage in the first stage for each of the multiple pages, obtain the predicted valley voltage in the second stage corresponding to the greatest read voltage among the multiple second stages in the same page to which the first stage belongs; and in accordance with the predicted valley voltage in the second stage corresponding to a larger read voltage among the multiple second stages in the same page to which the first stage belongs in sequence, obtain the predicted valley voltage in a second stage corresponding to a smaller read voltage than a read voltage corresponding to an adjacent second stage, until the predicted valley voltages in all the second stages in the same page to which the first stage belongs are obtained.

In some examples, as shown in FIG. 10B, the peripheral circuit is configured to: obtain the predicted valley voltage (V14 shown in FIG. 10B) for the fourth-level read voltage L4 corresponding to the largest read voltage among the multiple second stages for the middle page in accordance with the valley voltage (V13 shown in FIG. 10B) for the sixth-level read voltage L6 for the middle page among the multiple pages, obtain the target valley voltage for the fourth-level read voltage L4 in accordance with the predicted valley voltage for the fourth-level read voltage L4, in accordance with the target valley voltage or the predicted valley voltage for the fourth level read voltage L4, obtain the predicted valley voltage (V15 shown in FIG. 10B) for the second-level read voltage L2 corresponding to a smaller read voltage than a read voltage corresponding to an adjacent second stage.

As shown in FIG. 10C, the peripheral circuit is configured to: obtain the predicted valley voltage (V17 shown in FIG. 10C) for the third-level read voltage L3 for the upper page in accordance with the target valley voltage (V16 shown in FIG. 10C) for the seventh-level read voltage L7 for the upper page.

In some examples, the peripheral circuit is configured to: perform a read operation on at least one code word in accordance with the target valley voltages of the first target stage and the second target stage.

In some examples, as shown in FIGS. 10A to 10C, the peripheral circuit is configured to: perform a read operation on at least one code word in accordance with the target valley voltage for the first-level read voltage L1, the second-level read voltage L2, the third-level read voltage L3, the fourth-level read voltage L4, the fifth-level read voltage L5, the sixth-level read voltage L6 and the seventh-level read voltage L7.

In some examples, in the scenario of a QLC type memory cell, the number of storage bits of the memory cell includes four bits, the corresponding storage states include the 0th state to the 15th state, and the four storage bits corresponding to the 16 states are stored in a lower page, a middle page, an upper page, and an extra page respectively; a lower page contains one first stage (i.e., a fourteenth level) and multiple second stages (i.e., an eighth level and a second level); a middle page contains one first stage (i.e., a thirteenth level) and multiple second stages (i.e., the ninth level, the seventh level, and the third level); an upper page contains one first stage (i.e., a fifteenth level) and multiple second stages (i.e., a twelfth level, a tenth level and a fifth level); an extra page contains one first stage (i.e., an eleventh level) and multiple second stages (i.e., a sixth level, a fourth level and a first level).

In some implementations, as shown in FIG. 8C, the peripheral circuit is configured to: obtain a predicted valley voltage for the eighth-level read voltage L8 for the lower page in accordance with the target valley voltage for the fourteenth-level read voltage L14 for the lower page, obtain a predicted valley voltage for the second-level read voltage L2 for the lower page in accordance with the predicted valley voltage for the eighth-level read voltage L8 for the lower page; obtain a predicted valley voltage for the ninth-level read voltage L9 for the middle page in accordance with the target valley voltage for the thirteenth-level read voltage L13 for the middle page, obtain the predicted valley voltage for the seventh-level read voltage L7 for the middle page in accordance with the predicted valley voltage for the ninth-level read voltage L9 for the middle page, obtain the predicted valley voltage for the third-level read voltage L3 for the middle page in accordance with the predicted valley voltage for the seventh-level read voltage L7 for the middle page; obtain the predicted valley voltage for the twelfth-level read voltage L12 for the upper page in accordance with the target valley voltage for the fifteenth-level read voltage L15 for the upper page, obtain the predicted valley voltage for the tenth-level read voltage L10 for the upper page in accordance with the predicted valley voltage for the twelfth-level read voltage L12 for the upper page, obtain the predicted valley voltage for the fifth-level read voltage L5 for the upper page in accordance with the predicted valley voltage for the tenth-level read voltage L10 for the upper page; obtain the predicted valley voltage for the sixth-level read voltage L6 for the extra page in accordance with the target valley voltage for the eleventh-level read voltage L11 for the extra page, obtain the predicted valley voltage for the fourth level of the extra page in accordance with the predicted valley voltage for the sixth-level read voltage for the extra page, obtain the predicted valley voltage for the first-level read voltage L1 for the extra page in accordance with the valley voltage for the sixth-level read voltage L6 for the extra page. In this way, the predicted valley voltages for the read voltages at 15 levels required to read the QLC-type memory cell is obtained, and the method of obtaining the valley voltage in accordance with the predicted valley voltage shown in FIG. 9 may be employed to obtain the target valley voltages for the read voltages at 15 levels required to read the QLC-type memory cell.

In some examples, the memory device is a memory device after data retention.

In some examples, the predicted valley voltage in the second target stage may refer to the predicted read voltage obtained after a prediction in accordance with the target valley voltage in the first target stage and the usage scenario of the memory device (e.g., data retention scenario).

In some examples, the peripheral circuit is configured to: read the storage data of at least one code word at the first read voltage to obtain a second result; read the storage data of at least one code word at the second read voltage to obtain a third result; perform a logical operation on the second result and the third result to obtain a fourth result; and count the number of bits in the fourth result representing the bits in the third result flipped relative to the second result to obtain a first result.

In some examples, as shown in FIG. 9, the data stored in the memory cell in at least one code word is read at the first read voltage (V0 shown in FIG. 9), the memory cell whose threshold voltage is less than the first read voltage is marked as bit 1, and the memory cell whose threshold voltage is greater than the first read voltage is marked as bit 0 to obtain a second result.

In some examples, as shown in FIG. 9, the data stored in the memory cell in at least one code word is read at the second read voltage (V1 shown in FIG. 9), the memory cell whose threshold voltage is less than the second read voltage is marked as bit 1, and the memory cell whose threshold voltage is greater than the second read voltage is marked as bit 0 to obtain a third result.

In some examples, XOR is performed on the second result and the third result to obtain the fourth result. It should be noted that the XOR operation is one of the basic logical operations, in binary, if two binary numbers at the same position are the same, the result is "0"; and if two binary numbers at the same position are different, the result is "1" (i.e., same is 0, and different is 1).

In some examples, a bit of 1 in the fourth result indicates that the data of a memory cell in at least one code word being read at the first read voltage and second read voltage are different, a bit of 0 in the fourth result indicates that the data of a memory cell in at least one code word being read at the first read voltage and second read voltage are the same, in other words, the number of bits 1 in the fourth result represents the number of bits of the at least one code word which are flipped in the two read results at the first read voltage and the second read voltage, the number of bits 0 in the fourth result represents the number of bits of the at least one code which are the same at the first read voltage and the second read voltage. Since the single-level read mode is employed, i.e., both of the two read operations described above are to read one bit of data stored in the same page of the memory cell of at least one code word, the number of bit 1 in the fourth result represents the number of memory cells of the at least one code word that are flipped in the two read results at the first read voltage and the second read voltage, the number is denoted as the corresponding first result at the first read voltage. For example, the first result Y1 corresponds to at least one code word at the target read voltage (V0 shown in FIG. 9) in the first target stage, the first result Y2 corresponds to the at least one code word at the target adjusted read voltage (V2 shown in FIG. 9) in the first stage.

In some examples, the peripheral circuit includes: a first latch, a second latch, and a third latch; the first latch is configured to store a second result; the second latch is configured to store a third result; and the third latch is configured to store a fourth result.

In some examples, the storage data of at least one code word read at a first read voltage (i.e., a second result) is stored in a first latch, the storage data of at least one code word read at a second read voltage (i.e., a third result) is stored in a second latch, the data obtained by XORing the second result and the third result (i.e., the fourth result) is stored in a third latch.

In a first aspect, in the memory devices provided by examples of the present disclosure, by transmitting a first result (size of the first result may be several bytes) instead of at least one code word (e.g. size of code word may be 4 KB), the amount of data transmitted is reduced; the process of obtaining the first result is converged inside the memory device and does not occupy space of, e.g., a memory controller, thus is less dependent on, e.g., a memory controller; the process of obtaining the target valley voltage in accordance with the first result and obtaining the predicted valley voltage in the second target stage in accordance with the target valley voltage in the first target stage is completed in the memory device, reducing the transmission time of the output port; therefore suitable for MLC, TLC or QLC type memory devices.

Figure 11A:
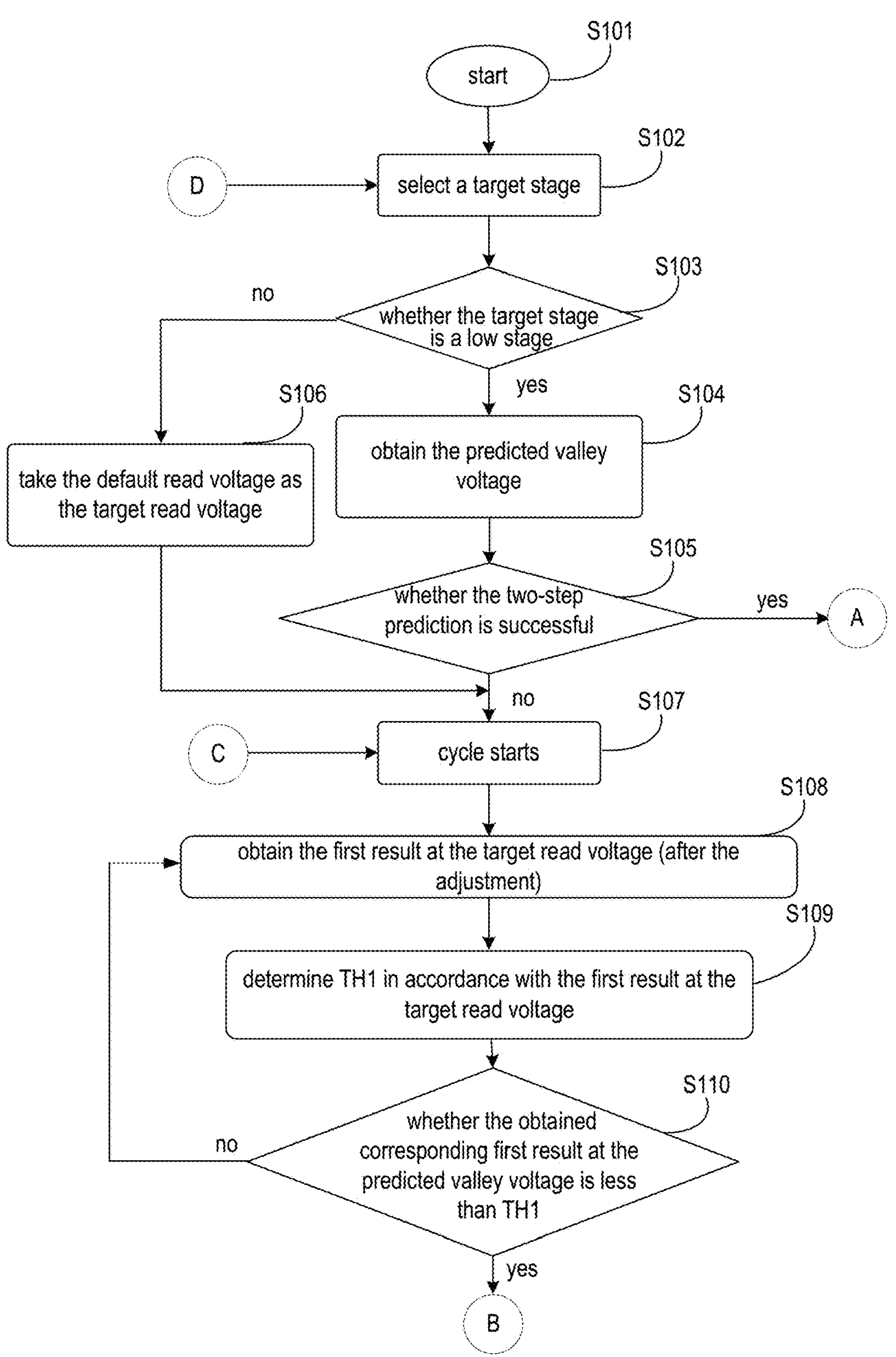
FIGS. 11A and 11B are a flowchart 1 of a method for operating a memory device provided by an example of the present disclosure.
Figure 11B:
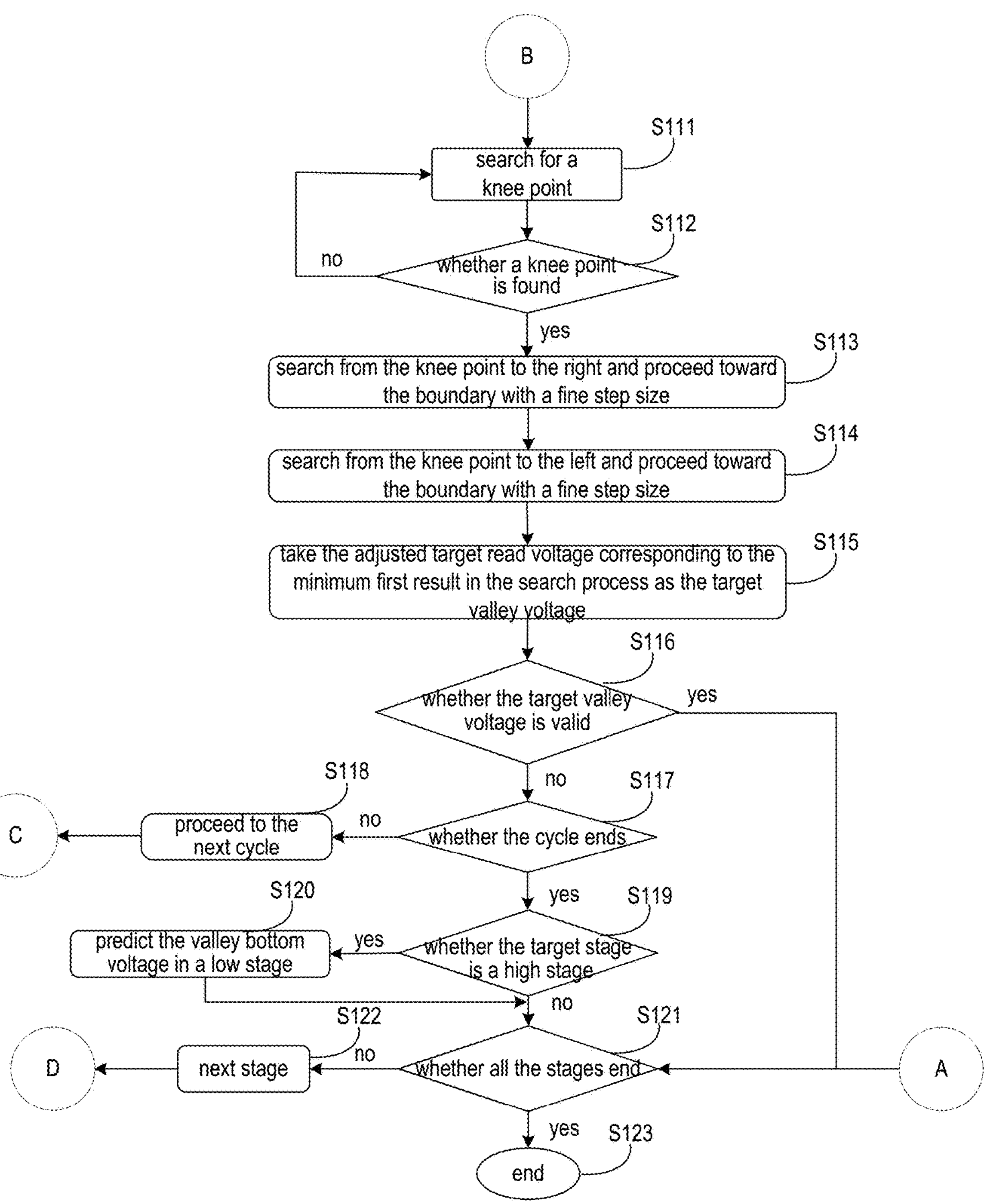

FIGS. 11A and 11B are a flowchart 1 of a method for operating a memory device provided by an example of the present disclosure. The process of determining the target valley voltage will be described in detail below through FIGS. 11A and 11B. It should be noted that here and below, the target valley voltage refers to the voltage used to perform a read operation on the data to be read.

In operation S101, the program of obtaining the target valley voltage is triggered, and the process of obtaining the target valley voltage is started. Next, operation S102 is performed. As mentioned above, in accordance with the memory cell including multiple storage bits, the multiple storage bits respectively correspond to multiple pages, and at least one page corresponds to multiple stages. When determining the target valley voltage, the target valley voltage among the read voltages in each of the at least one stage corresponding to each of the multiple pages is determined in sequence. In operation S103, one stage is selected as the target stage from the multiple stages corresponding to one page, and the target valley voltage corresponding to the read voltage in the target stage is first determined. For example, taking TLC as an example, the target valley voltages for the first-level read voltage L1 and the fifth-level read voltage L5 corresponding to the lower page are first determined, and one of L1 or L5 may be selected as the target stage. After the target stage is determined, operation S103 is performed.

In operation S103, the type to which the target stage belongs is mainly determined. Here, the target stage may be divided into two categories, the first stage (also referred to as high stage) and the second stage (also referred to as low stage), in which the read voltage in the first stage is greater than the read voltage in the second stage. For example, still taking the lower page of TLC as an example, L5 is in the first stage and L1 is in the second stage. If L1 is selected as the target stage in operation S103, the target stage is the second stage, which is the low stage; if L5 is selected as the target stage in operation S104, the target stage is the first stage, which is the high stage. If the target stage is a low stage, operation S104 is performed; according to the target stage being a high stage, operation S106 is performed.

In operation S104, the predicted valley voltage is obtained, here, the predicted valley voltage is the predicted valley voltage corresponding to a low stage obtained in accordance with the target valley voltage corresponding to a high stage and the related mapping function. Here and below, the related mapping function may be obtained by fitting a large number of experimental results before the memory device leaves the factory, and is stored in the memory device. Next, operation S105 is performed.

In operation S105, it is determined whether the prediction by the two-step method is successful. Here, the so-called prediction by the two-step method may include the first-step prediction and the second-step prediction, where the first-step prediction is to obtain a predicted valley voltage in a high stage, the way is to obtain the predicted valley voltage in the high stage in accordance with the corresponding first result at the target read voltage (default read voltage), the stage number at which the high stage is, and the first mapping function; the second-step prediction is to obtain the predicted valley voltage in a low stage, and the way is to obtain the predicted valley voltage in a low stage in accordance with the aforementioned predicted valley voltage in a high stage, the stage number at which the low stage is and the second mapping function. After the prediction by the two-step method, confirmation of the predicted valley voltage is not performed, and the predicted valley voltage in a high stage and the predicted valley voltage in a low stage are directly used for hard decode, if the hard decode passes, it indicates that the prediction by the two-step method is successful, at this point, the search for the target valley voltage is directly stopped and operation S121 is performed; If the hard decode fails, it indicates that the prediction by the two-step method fails, at this point, the point corresponding to the predicted valley voltage is taken as the near-valley point for subsequent iterations, and operation S107 is continued to be performed.

It should be noted that if the hard decode fails, it indicates that the prediction by the two-step method is unsuccessful, at this point, the target valley voltage needs to be determined through search or also called cycle (or iteration), therefore, when the prediction by the two-step method is unsuccessful, a cycle process will be entered, after the two-step prediction fails, the search process may be performed directly from the beginning of the cycle, i.e., jumping from operation S105 to S107.

If the target stage is a high stage, prepare to determine the target valley voltage in the high stage through the way of search or cycle. In operation S106, the default read voltage is taken as the target read voltage. Here, the target read voltage may be taken as an initial value for subsequent searches or cycles. In some implementations, the default read voltage may be the read voltage at which the threshold voltage of the memory cell does not offset, e.g., the corresponding read voltage at which just written in, and the corresponding offset value at this point is 0 DAC. Operation S107 is performed after operation S106.

In operation S107, it is started to determine the target valley voltage by searching or cycling. Operation S108 is performed after operation S107.

For the first performing of the cycle, in operation S108, the first result at the target read voltage is obtained; it may be understood that for the subsequent performing of the cycle, in operation S108, the first result at the adjusted target read voltage is obtained. Operation S109 is performed after operation S108.

In operation S109, the first threshold TH1 is determined or adjusted in accordance with the first result at the target read voltage. It may be understood that when a read operation is performed, the further the threshold voltage of the memory cell deviates from the threshold voltage during writing, the first result of reading with the target read voltage will generally be larger, based on this, the value of the first result at the default read voltage may be used to confirm the first threshold TH1, and the first threshold TH1 is to present the change (lifting) in the target valley voltage caused by the offset of the threshold voltage of the memory cell. Operation S110 is performed after operation S109.

It should be noted that operation S109 is mainly for the process of performing the cycle for the first time, and for the process of subsequent performing the cycle, this operation may be skipped.

In operation S110, the predicted valley voltage is obtained, and it is determined whether the corresponding first result at the predicted valley voltage is less than the aforementioned first threshold TH1. According to the corresponding first result at the target read voltage after the previous adjustment and the associated mapping function (e.g., the aforementioned first mapping function), the predicted read voltage after next adjustment is obtained, and the corresponding first result at the obtained predicted valley voltage is compared with the magnitude of the first threshold TH1. When the determination result in operation S110 is no, it indicates that the corresponding first result at the predicted valley voltage obtained at this point is greater than or equal to the first threshold TH1, and the operation S108 of the cycle continues where an adjustment is made to the target read voltage and the predicted valley voltage is re-obtained, each of the corresponding first results at reobtained predicted valley voltages is compared with the first threshold TH1, until the corresponding first result at the obtained predicted read voltage is less than the first threshold TH1. That is to say, the aforementioned prediction formula or related mapping function is used to perform prediction iteration, until the corresponding first result at the generated predicted read voltage is less than the first threshold TH1. When the determination result in operation S110 is yes, it indicates that the corresponding first result at the predicted valley voltage obtained at this point is less than the first threshold TH1, and the process proceeds to the next operation S111.

In operation S111, search for a knee point. Here, the target read voltage after each adjustment is taken as the abscissa, and the corresponding first result at the corresponding adjusted target read voltage is taken as the ordinate, the abscissa and ordinate will form a point. The knee point may be understood as a point closer to the valley. In some examples, starting from the near-valley point, searching with a coarser step size (a second step size) may be performed to the left boundary and the right boundary respectively until reaching the left boundary and the right boundary, and the point corresponding to the minimum first result during the search process is taken as the knee point. Here, the knee point is a point that is closer to the valley than the near-valley point, and the point less than the first threshold in the preceding operation may be taken as a near-valley point. The second step size may be a larger step size, in some examples, the second step size may be 5 DAC-15 DAC, in one example, the second step size may be 5 DAC, 10 DAC or 15 DAC. Operation S112 is performed after operation S111.

In operation S112, it is determined whether the knee point has been found. If the knee point is not found, the search continues and operation S111 is continued until the knee point is found. After the knee point is found, operation S113 is performed.

In operations S113 and S114, starting from the near-valley point, searching with a finer step size (a third step size) may be performed to the left boundary and the right boundary respectively until reaching the left boundary and the right boundary or the counted number for upward trend exceeds a preset number. Here when a corresponding first result at the target read voltage after a next adjustment is greater than the corresponding first result at the target read voltage after a previous adjustment, one for upward trend is counted. In some examples, the preset number is 3, 4, 5, 6, or 7, in one example, the preset number may be 3, 5, or 7. It should be noted that the locations of operations S113 and S114 may be interchanged. The third step size may be a smaller step size, and in some examples, the third step size may be 1 DAC-4 DAC, in one example, the third step size may be 2 DAC or 3 DAC.

When the searches in operations S113 and S114 both meet the aforementioned conditions (the boundary is reached or the counted number for upward trend exceeds the preset number), operation S115 is performed.

In operation S115, the adjusted target read voltage corresponding to the minimum first result is taken as the target valley voltage. Operation S116 is performed after operation S115.

In operation S116, it is determined whether the target valley voltage is valid. Here, the way to determine whether the target valley voltage is valid may be reading data with the target valley voltage, decoding the read data through the memory controller, and when the decoding is successful, it indicates whether the target valley voltage is valid. When the determination result in operation S116 is yes, operation S121 is performed; when the determination result in operation S116 is no, operation S117 is performed.

In operation S117, it is determined whether the cycle ends. When the determination result in operation S117 is yes, operation S119 is performed; when the determination result in operation S117 is no, operation S118 is performed.

In operation S118, enter the next cycle and searching continues. Operation S118 jumps to operation S107.

In operation S119, it is determined whether the target stage is a high stage. When the determination result in operation S119 is yes, operation S120 is performed; when the determination result in operation S119 is no, operation S121 is performed.

In operation S120, a predicted valley voltage in a low stage is obtained in accordance with the target valley voltage in a high stage. Here, the predicted valley voltage in a low stage may be obtained through the target valley voltage in a high stage, the stage number at which the low stage is and the related mapping function (e.g., the aforementioned second mapping function). Operation S121 is performed after operation S120.

In operation S121, it is determined whether corresponding target valley voltages have been determined for read voltages in all the stages contained on this page. When the determination result in operation S121 is yes, it indicates that target valley voltages corresponding to read voltages in all the stages contained on this page have been determined, and operation S123 may be performed at this point; and when the determination result in operation S121 is no, it indicates that target valley voltages corresponding to read voltages in some of the stages contained on this page have not been determined, and operation S122 may be performed at this point.

In operation S122, for the stages in which the target valley voltages are not determined, the target valley voltage in each of the stages is determined in sequence. Operation S122 jumps to operation S102.

In operation S123, the process of obtaining the target valley voltage ends. It should be noted that after operation S123, the determination of the target valley voltage corresponding to the read voltages in all stages for the next page may be started.

Figure 12A:
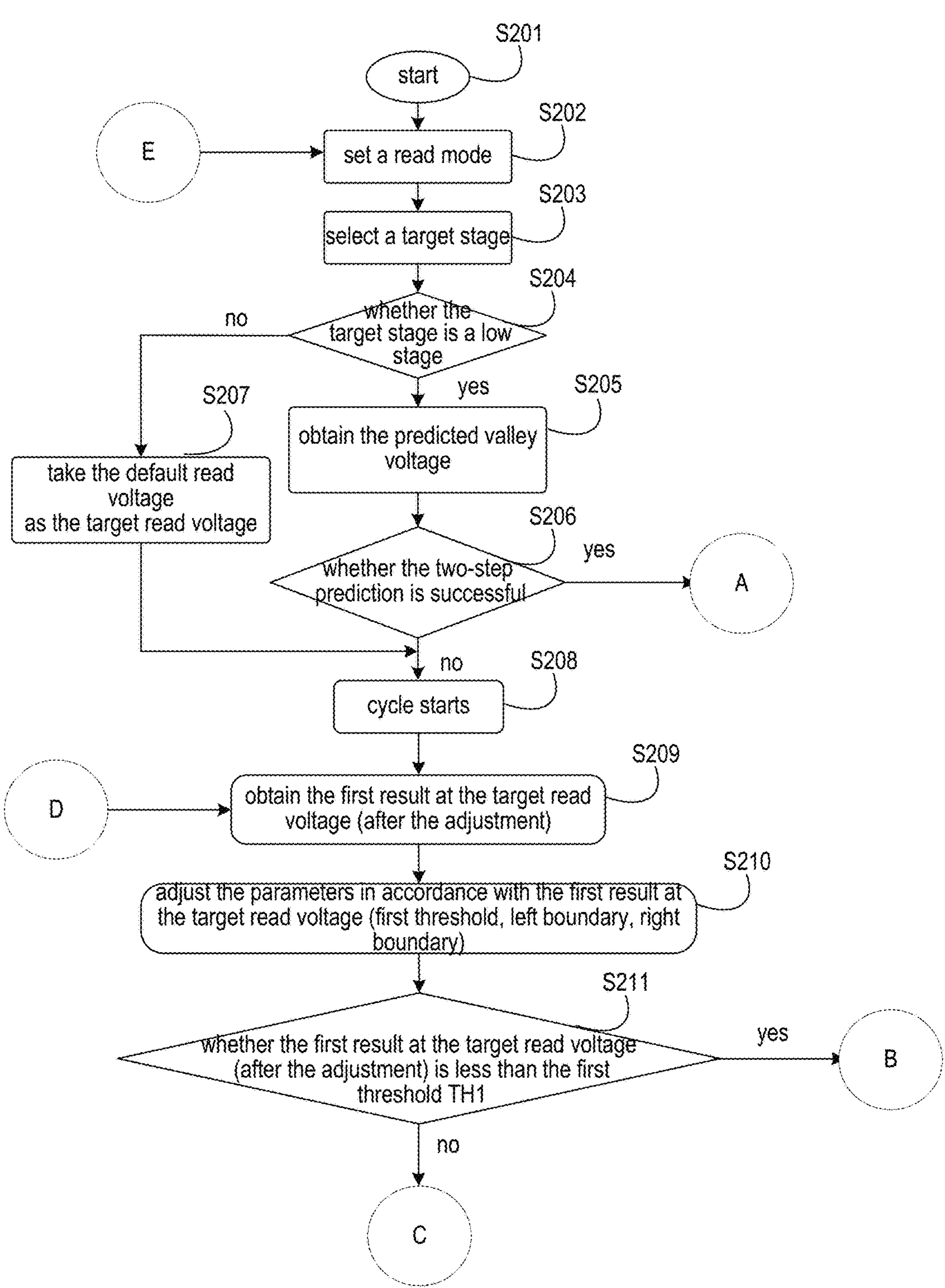
FIGS. 12A, 12B, and 12C are a flowchart 2 of a method for operating a memory device provided by an example of the present disclosure.
Figure 12B:
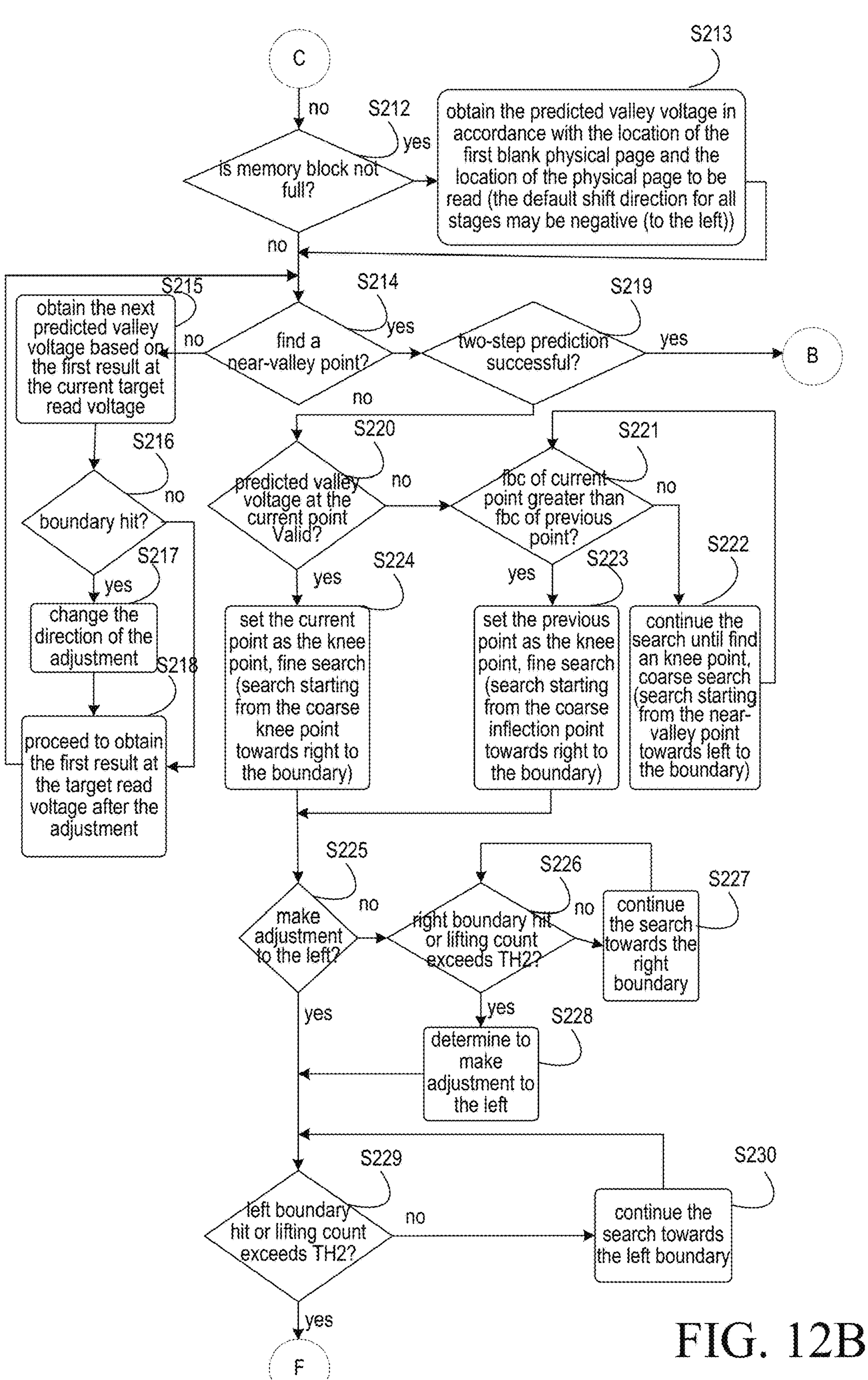
Figure 12C:
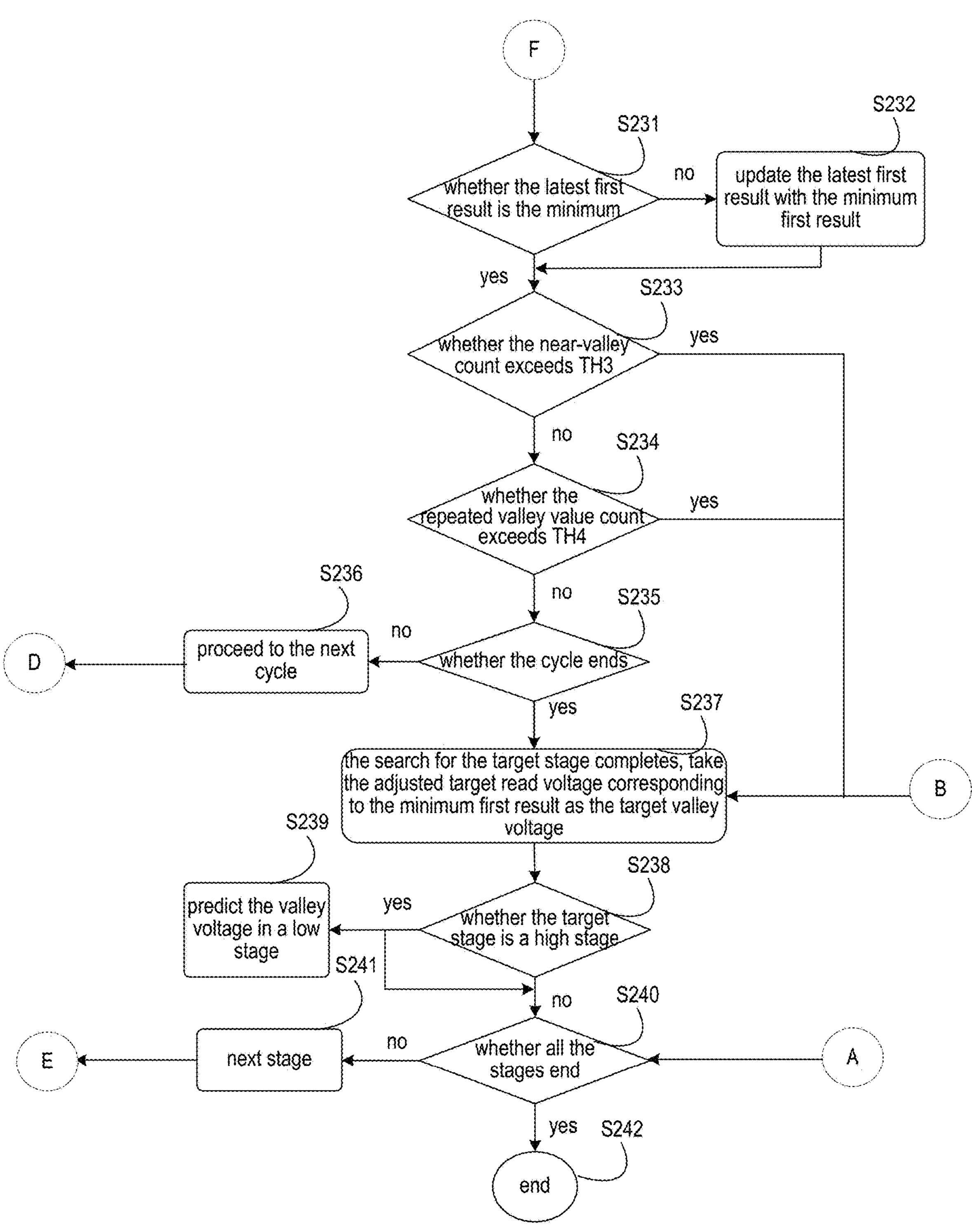

FIGS. 12A, 12B, and 12C are a flowchart 2 of a method for operating a memory device provided by an example of the present disclosure. The process of determining the target valley voltage will be described in detail below through FIGS. 12A, 12B, and 12C.

In operation S201, the program of obtaining the target valley voltage is triggered, and the process of obtaining the target valley voltage is started. Next, operation S202 is performed.

In operation S202, in some examples, the read mode of the memory device is set to a single-level read mode; here the single-level read mode includes reading at least one bit of the storage data stored in the memory cell through a read voltage in one stage. Next, operation S203 is performed.

As mentioned above, in accordance with the memory cell including multiple storage bits, the multiple storage bits respectively correspond to multiple pages, and at least one page corresponds to multiple stages. When determining the target valley voltage, the target valley voltage for the read voltages in each of the at least one stage corresponding to each of the multiple pages is determined in sequence. In operation S203, one stage is selected as the target stage from the multiple stages corresponding to one page, and the target read voltage corresponding to the read voltage in the target stage is first determined. For example, taking TLC as an example, the target valley voltages for the first-level read voltage L1 and the fifth-level read voltage L5 corresponding to the lower page is first determined, and one of L1 or L5 may be selected as the target stage. After the target stage is determined, operation S204 is performed.

In operation S204, the type to which the target stage belongs is mainly determined. Here, the target stage may be divided into two categories, the first stage (also referred to as high stage) and the second stage (also referred to as low stage), in which the read voltage in the first stage is greater than the read voltage in the second stage. For example, still taking the lower page of TLC as an example, L5 is in the first stage and L1 is in the second stage. If L1 is selected as the target stage in operation S203, the target stage is the second stage, which is the low stage; if L5 is selected as the target stage in operation S204, the target stage is the first stage, which is the high stage. If the target stage is a low stage, operation S205 is performed; if the target stage is a high stage, operation S207 is performed.

In operation S205, the predicted valley voltage is obtained, here, the predicted valley voltage is the predicted valley voltage corresponding to a low stage obtained in accordance with the target valley voltage corresponding to a high stage and the related mapping function. Here and below, the related mapping function may be obtained by fitting a large number of experimental results before the memory device leaves the factory, and is stored in the memory device. Next, operation S206 is performed.

In operation S206, it is determined whether the prediction by the two-step method is successful. Here, the so-called prediction by the two-step method may include the first-step prediction and the second-step prediction, where the first-step prediction is to obtain a predicted valley voltage in a high stage, the method is to obtain the predicted valley voltage in the high stage in accordance with the corresponding first result at the target read voltage (default read voltage), the stage number at which the high stage is, and the first mapping function; the second operation of prediction is to obtain the predicted valley voltage in a low stage, and the method is to obtain the predicted valley voltage in a low stage in accordance with the aforementioned predicted valley voltage in a high stage, the stage number at which the low stage is and the second mapping function. After the prediction by the two-step method, confirmation of the predicted valley voltage is not performed, and the predicted valley voltage in a high stage and the predicted valley voltage in a low stage are directly used for hard decode, if the hard decode passes, it indicates that the prediction by the two-step method is successful, at this point, the search for the target valley voltage is directly stopped and operation S245 is performed; if the hard decode fails, it indicates that the prediction by the two-step method fails, at this point, the point corresponding to the predicted valley voltage is taken as the near-valley point for subsequent iterations, and operation S220 is continued to be performed. Operation S220 will be described in detail in the subsequent description.

It should be noted that if the hard decode fails, it indicates that the prediction by the two-step method is unsuccessful, at this point, the target valley voltage needs to be determined through search or also called cycle (or iteration), therefore, when the prediction by the two-step method is unsuccessful, a cycle process will be entered, after the two-step prediction fails, the search process may be performed directly from the beginning of the cycle, i.e., jumping from operation S206 to S208; The point corresponding to the predicted valley voltage may also be directly taken as the near-valley point for subsequent iterations, i.e., jumping from operation S206 (S219) to S220.

If the target stage is a high stage, prepare to determine the target valley voltage in the high stage through search or cycle. In operation S207, the default read voltage is taken as the target read voltage. Here, the target read voltage may be taken as an initial value for subsequent searches or cycles. In some implementations, the default read voltage may be the read voltage at which the threshold voltage of the memory cell does not offset, e.g., the corresponding read voltage at which just written in, and the corresponding offset value at this point is 0 DAC. Operation S208 is performed after operation S207.

In operation S208, it is started to determine the target valley voltage by searching or cycling. Operation S209 is performed after operation S208.

For the first performing of the cycle, in operation S209, the first result at the target read voltage is obtained; it may be understood that for the subsequent performing of the cycle, in operation S209, the first result at the adjusted target read voltage is obtained. Operation S210 is performed after operation S209.

In operation S210, parameters are determined or adjusted in accordance with the first result at the target read voltage, the parameters here may at least include a first threshold, a first boundary voltage (the location corresponding to the first boundary voltage is also referred to as the left boundary) and a second boundary voltage (the location corresponding to the second boundary voltage is also referred to as the right boundary). It may be understood that when performing a read operation, the further the threshold voltage of the memory cell deviates from the threshold voltage during writing, the first result of reading with the target read voltage will generally be larger, based on this, the value of the first result at the default read voltage may be used to confirm the first threshold, and the first threshold is to present the change (lifting) in the valley voltage caused by the offset of the threshold voltage of the memory cell. Here, the initial first boundary voltage and the initial second boundary voltage may be set in accordance with empirical values, etc., for example, a relatively large range of the initial first boundary voltage and an initial second boundary voltage are first set, and then the initial first boundary voltage and the initial second boundary voltage are adjusted in accordance with the first result at the target read voltage, e.g., narrowing the range of a boundary voltage and a second boundary voltage, to obtain the first boundary voltage and the second boundary voltage. Operation S211 is performed after operation S210.

It should be noted that operation S210 is mainly for the process of performing the cycle for the first time, and for the process of subsequent performing the cycle, this operation may be skipped.

For the first performing of the cycle, in operation S211, it is determined whether the first result at the target read voltage is less than the first threshold; it may be understood that for the subsequent performing of the cycle, in operation S211, it is determined whether the first result at the adjusted target read voltage is less than the first threshold. When the determination result in operation S211 is yes, it may be considered that the corresponding first result at the adjusted target read voltage at this point may basically meet the needs of reading data decoding, next, jump to S242, the cycle ends, and the corresponding target valley voltage is output. When the determination result in operation S211 is no, operation S212 of the cycle continues.

In operation S212, it is determined whether the target memory block is not full. Here, the target memory block is the memory block where at least one code word to be performed a read operation is located. The memory blocks that are not full include memory blocks with two data states: program state and erase state. When the determination result in operation S212 is yes, operation S213 is performed; and when the determination result in operation S212 is no, operation S214 is performed.

It should be noted that operation S212 is mainly for the process of performing the cycle for the first time, and for the process of subsequent performing the cycle, this operation may be skipped. After skipping this operation, proceed to perform operation S214.

In operation S213, considering that the offset of the threshold voltage of memory cell in a memory block that is not full is more complicated compared to the offset of the threshold voltage of memory cell in a memory block that is full (a memory block that is full may be understood as a memory block whose writing time difference is less than the preset duration in the same disclosure scenario as a memory block that is not full). Compared with the memory block that is full, the offset of the threshold voltage of memory cell in a memory block that is not full is related to the location of the first blank physical page in the memory block that is not full (the first blank physical page may be understood as the physical page in which the first data state appearing in the memory block that is not full is erase state in accordance with the program sequence) and the location of the physical page to be read (the physical page where at least one code word to be read is located). Based on this, the predicted valley voltage may be obtained in accordance with the first offset corresponding to the memory block that is full, the second offset corresponding to the location of the first blank physical page in the memory block that is not full, and the third offset corresponding to the location of the physical page to be read, and then proceed to operation S214. It is to be understood that the obtained predicted valley voltage is more targeted than the blind adjustment of the target read voltage, and can shorten the search time to a certain extent and determine the target valley voltage faster.

In operation S214, it is determined whether a near-valley point is found. Here, the target read voltage after each adjustment is taken as the abscissa, and the corresponding first result at the corresponding adjusted target read voltage is taken as the ordinate, the abscissa and ordinate may form a point. In the process of making multiple adjustments to the target read voltage, the point corresponding to the first result that is less than the near-valley threshold for the first time among multiple corresponding first results at multiple adjusted target read voltages may be taken as the near-valley point. The near-valley threshold is to present the maximum among the corresponding first results at the read voltages near the target valley voltage. It should be noted that a difference exists between the near-valley threshold and the aforementioned first threshold, and when the first result is less than the near-valley threshold, it indicates that a more refined search may be carried out next; and when the first result is less than the first threshold, it indicates that the search may be considered to stop next. When the determination result in operation S214 is yes, operation S219 is performed; and when the determination result in operation S214 is no, operation S215 is performed.

In operation S215, when the near-valley point is not found, enter operation S215, where according to the corresponding first result at the target read voltage after the previous adjustment and the associated mapping function (e.g., the aforementioned first mapping function), the predicted read voltage after next adjustment is obtained, that is, prediction iteration is performed by taking the aforementioned prediction equation or mapping function. Operation S216 is performed after operation S215.

In operation S216, it is determined whether the obtained predicted read voltage after next adjustment hits the boundary. The boundary here may be one of the aforementioned left boundary or right boundary, and hitting the boundary may be understood as being exactly on the boundary, or beyond the boundary. When the determination result in operation S216 is yes, operation S217 is performed; and when the determination result in operation S216 is no, operation S218 is performed.

In operation S217, the adjustment direction is changed. Here, in the process of making adjustment to the target read voltage, there are two adjustment directions, namely positive (to the right) and negative (to the left). Adjusting the offset direction may be understood as adjusting to the right before, and then starting to adjust to the left after hitting the right boundary; or adjusting to the left before, and starting to adjust to the right after hitting the left boundary. Operation S218 is performed after operation S217.

In operation S218, a first result for the adjusted target read voltage is obtained. After operation S218, operation S214 is performed, that is to say, after each adjustment to the target voltage is made and the corresponding first result is obtained, it will be continued to determine whether the latest adjustment point is a near-valley point. Here one or more adjustments are made until the near-valley point is found.

It should be noted that if the next cycle is entered because the subsequent conditions are not met during the operations after finding the near-valley point, operations S215 to S218 may be skipped.

In operation S219, referring to the description in operation S206, in the process of entering a cycle when the prediction by the two-step method is unsuccessful, the point corresponding to the predicted valley voltage may also be directly taken as the near-valley point for subsequent iterations, i.e., jumping from operation S219 to S220.

In operation S220, it is determined whether predicted valley voltage at the current point (the latest adjusted target read voltage) is valid. In some examples, it may be determined that the predicted valley voltage is valid by the fact that the corresponding first result at the latest adjusted target read voltage is less than the first threshold. It should be noted that although in operation S211, when the first result at the (adjusted) target read voltage is not less than the first threshold, S212 and subsequent operations are entered, but before the determination result in operation S214 is yes, at least one adjustment has been made to the target read voltage, thus at this point, the new adjusted target read voltage may be less than the first threshold. When the determination result in operation S220 is yes, operation S224 is performed; when the determination result in operation S220 is no, operation S221 is performed.

In operation S221, it is determined whether the first result FBC of the current point is greater than the FBC of the previous point. Here, after finding the near-valley point and starting to perform a coarse search for the knee point to the left, generally the magnitude of FBC will first decrease and then increase, and when the first result FBC of the current point is greater than the FBC of the previous point, it indicates that FBC will further increase during the subsequent adjustment to the left, and the previous point is a relatively small point, at this point, the previous point is set as the knee point. In some examples, the step size used in the coarse search may be a larger step size, e.g., it may be 5 DAC-15 DAC, in some examples, it may be 5 DAC, 10 DAC or 15 DAC. Based on this, when the determination result in operation S221 is yes, operation S223 is performed; and when the determination result in operation S221 is no, operation S222 is performed.

In operation S222, starting from the near-valley point, a coarse search is performed to the left, and after each search, the FBC is compared with the FBC of the previous search until a point where the decrease stops and the increase starts is found. After finding this point, it indicates that operation S222 has been completed and then jumps to operation S223.

In operation S223, the previous point (i.e., the aforementioned point where the decrease stops and the increase starts) is set as a knee point, and a fine search starts from the knee point to the right. In some examples, the step size used in the fine search may be a small step size, e.g., it may be 1 DAC-4 DAC, in some examples, it may be 2 DAC or 3 DAC. Operation S225 is performed after operation S223.

In operation S224, the current point is set as the knee point, and a fine search starts from the knee point to the right. In some examples, the step size used in the fine search may refer to operation S223. Operation S225 is performed after operation S224.

In operation S225, it is determined whether to adjust the target read voltage to the left. When the determination result in operation S225 is yes, operation S229 is performed; when the determination result in operation S225 is no, operation S226 is performed.

In operation S226, the target read voltage is adjusted to the right, and in the process of adjusting the target read voltage to the right, it is determined whether the right boundary is hit or the lifting count (or count for upward trend, where, when a corresponding first result at the target read voltage after a next adjustment is greater than the corresponding first result at the target read voltage after a previous adjustment, one for upward trend is counted) exceeds the preset number TH2. In some examples, the preset number is 3, 4, 5, 6, or 7, in one example, the preset number of may be 3, 5, or 7. When the determination result in operation S226 is yes, operation S228 is performed; when the determination result in operation S226 is no, operation S227 is performed.

In operation S227, when the right boundary misses or the lifting count does not exceed the preset number TH2, the search continues to the right boundary, and a determination is made after each search until the right boundary is hit or the lifting count exceeds the preset number TH2. That is to say, when operation S227 is completed, jump to operation S228.

In operation S228, the target read voltage starts to be adjusted to the left.

In operation S229, during the process of adjusting the target read voltage to the left, it is determined whether the left boundary or the lifting count is hit. The lifting count here may be understood with reference to the aforementioned operation S226. The thresholds for left and right lifting counts are generally set to the same value. When the determination result in operation S229 is yes, operation S231 is performed; and when the determination result in operation S229 is no, operation S230 is performed.

In operation S230, when the left boundary misses or the lifting count does not exceed the preset number TH2, the search continues to the left boundary, and a determination is made after each search until the left boundary is hit or the lifting count exceeds the preset number TH2. That is to say, when operation S230 is completed, jump to operation S231.

In operation S231, it is determined whether the latest first result is the minimum. Here, the latest first result refers to whether the first result at the adjusted target read voltage after the previous adjustment to the target read voltage is the minimum. At this point, it is necessary to traverse at least all the searched points in this cycle to find the adjusted target read voltage corresponding to the point with the minimum first result. When the determination result in operation S231 is yes, operation S233 is performed; and when the determination result in operation S231 is no, operation S232 is performed.

In operation S232, the latest first result is updated with the found minimum first result. Operation S233 is performed after operation S232.

In operation S233, it is determined whether the near-valley count exceeds the preset number TH3. Here, taking the minimum first result among multiple corresponding first results at the target read voltages after multiple adjustments as a reference value, if the number of first results from remaining first results which differ from the reference value with a difference being less than a third threshold (equal to the aforementioned preset difference) is greater than the preset number, then the searching is stopped and the target read voltage corresponding to the minimum first result among the multiple first results is taken as the target valley voltage. In some examples, a third threshold (equal to the aforementioned preset difference) and the preset number may be set together in accordance with the actual situation, generally, if the third threshold (equal to the aforementioned preset difference) is set slightly larger, the preset number will be relatively larger; and if the third threshold (equal to the aforementioned preset difference) is set slightly smaller, the preset number will also be relatively smaller. When the determination result in operation S233 is yes, the search is stopped and operation S237 is performed; when the determination result in operation S233 is no, enter the next determination and operation S234 is performed.

In operation S234, it is determined whether the repeated valley value count exceeds the preset count TH4. Here, in the process of making multiple adjustments to the target read voltage, different adjustment methods may be employed for adjustment, in accordance with the adjusted target read voltages corresponding to more than preset number of adjustment methods among different adjustment methods are the same, and the corresponding first result at the same target read voltage is the minimum value among all first results, the same target read voltage is taken as the target valley voltage. In some examples, the preset number is 2-4, in one example, the preset number may be 2, 3, or 4. When the determination result in operation S234 is yes, the search is stopped and operation S237 is performed; when the determination result in operation S234 is no, enter the next determination and operation S235 is performed.

It should be noted that operation S233 and operation S234 belong to different determination methods, and the locational relationship between them may be interchanged, that is to say, the repeated valley count may be first determined, and then a near-valley count may be determined if the repeated valley count does not meet the conditions. It is understood that other determinations may also be performed here to determine whether the cycle ends.

In operation S235, it is determined whether the cycle ends. When the determination result in operation S235 is yes, operation S237 is performed; and when the determination result in operation S235 is no, operation S236 is performed.

In operation S236, enter the next cycle and searching continues. Operation S236 jumps to operation S209.

In operation S237, the target stage search is completed, the adjusted target read voltage corresponding to the minimum first result is taken as the target valley voltage. Operation S238 is performed after operation S237.

In operation S238, it is determined whether the target stage is a high stage. When the determination result in operation S238 is yes, operation S239 is performed; and when the determination result in operation S238 is no, operation S240 is performed.

In operation S239, a predicted valley voltage in a low stage is obtained in accordance with the target valley voltage in a high stage. Here, the predicted valley voltage in a low stage may be obtained through the target valley voltage in a high stage, the stage number at which the low stage is and the related mapping function (e.g., the aforementioned fourth mapping function). Operation S240 is performed after operation S239.

In operation S240, it is determined whether corresponding target valley voltages have been determined for read voltages in all the stages contained on this page. When the determination result in operation S240 is yes, it indicates that target valley voltages corresponding to read voltages in all the stages contained on this page have been determined, and operation S242 may be performed at this point; and when the determination result in operation S240 is no, it indicates that target valley voltages corresponding to read voltages in some of the stages contained on this page have not been determined, and operation S241 may be performed at this point.

In operation S241, for the stages in which the target valley voltages are not determined, the target valley voltage in each of the stages is determined in sequence. Operation S236 jumps to operation S202.

In operation S242, the process of obtaining the target valley voltage ends. It should be noted that after operation S242, the determination of the target valley voltage corresponding to the read voltages in all stages for the next page may be started.

It should be noted that the methods disclosed in the examples of the present disclosure are able to solve many problems existing in the re-reading operation, but are not used to limit the disclosure scenarios in the examples of the present disclosure, and the methods disclosed in the examples of the present disclosure are also applicable to conventional read operations.

It should be noted that the performing subject of the implementation process of each operation in FIGS. 11 and 12 may be a peripheral circuit or a memory controller.

Figure 13:
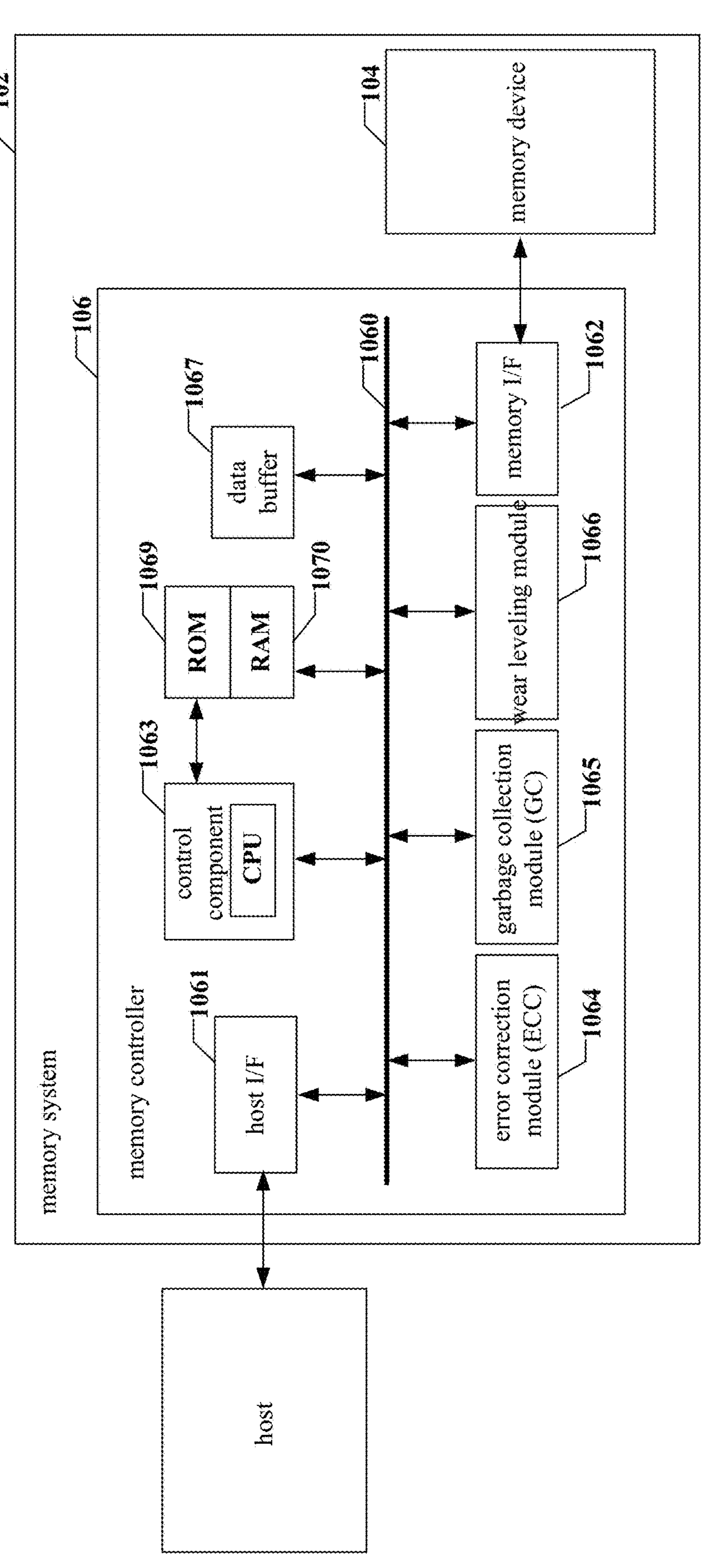
FIG. 13 is a schematic structural diagram of an example of a structure having a memory system provided by an example of the present disclosure.
Figure 14:
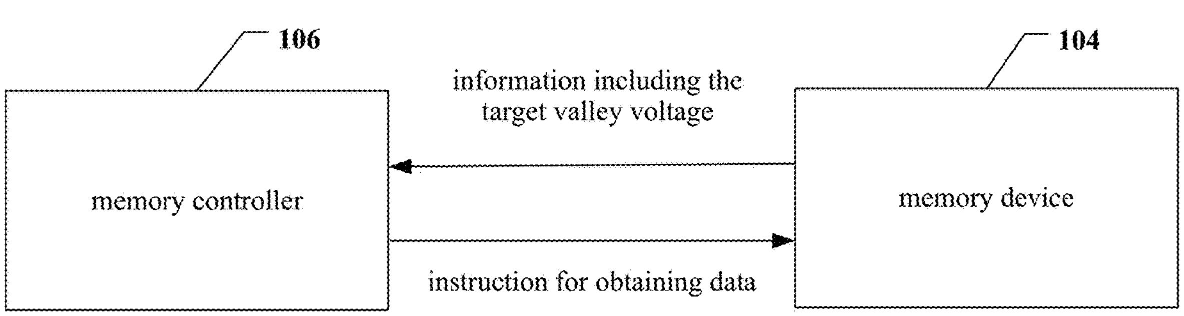
FIG. 14 is a block diagram of a memory system provided by an example of the present disclosure.

In a second aspect, an example of the present disclosure provides a memory system, as shown in FIGS. 13 and 14, the memory system 102 includes: one or more memory devices 104 of the first aspect; and a memory controller 106 coupled to and controlling the memory device 104.

As shown in FIG. 13, in some examples, the memory system 102 is coupled to the host, and responds to instructions from the host to perform various feedback. The memory system 102 may include: a memory controller 106 and a memory device 104, the memory controller 106 is to control the memory device 104 to perform operations such as read, write, and erase, and the memory controller 106 and the memory device 104 may also be coupled in any suitable manner.

The memory controller 106 may include a host interface (I/F) 1061, a memory interface (I/F) 1062, a control component 1063, a Read-Only Memory (ROM) 1069, a Random Access Memory (RAM) 1070, an error correction module 1064, a garbage collection module 1065, a wear leveling module 1066, a data buffer 1067 and a bus 1060. The host interface 1061 is a connection interface between the host 108 and the memory controller 106, the host interface 1061 allows the host and the memory controller to communicate in accordance with a specific protocol, to send read request and write request, and to perform other operations. The memory interface 1062 is a connection interface between the memory controller 106 and the memory device 104, the memory interface 1062 is used to implement data transmission between the memory controller 106 and the memory device 104. The control component 1063 is used to control the memory system 102 as a whole, and the performed specific operations described above regarding the memory controller are mainly performed and completed by the control component 1063 here. In some examples, the control component 1063 is, e.g., a central processing unit (CPU), a microprocessor (MCU), etc. ROM 1069 typically contains firmware or firmware program code for the memory controller 106, which is used to initialize and operate various components of the memory controller, and RAM 1070 is typically used to buffer data. The error correction module 1064 may further include an encode part and a decode part; the encode part is used to encode the data to be stored to obtain check data, and the decode part is used to decode the check data to detect and correct possible erroneous data during data transmission.

The garbage collection module 1065 is used to read out the valid data on some storage blocks after the storage space of the memory device reaches a certain threshold, rewrite them, and then mark these storage blocks to obtain new spare storage blocks. The general implementation of garbage collection may be divided into three operations: selecting source storage blocks with less valid data; finding valid data from the source storage blocks; writing valid data to the target storage block. At this point, all data in the source storage block becomes invalid data, and the source storage block is marked and may be taken as a new spare storage block. The wear leveling module 1066 is used to balance the wear (number of erases) of each storage block in the memory system through data statistics and algorithms. The general implementation of wear leveling may be divided into two operations: selecting the source storage block where the cold data is located; reading the valid data on the source storage block and writing it to the storage block with a relatively large number of erases, at this point, valid data in the source memory block becomes invalid data and is marked. The buffer 1067 is used to buffer data.

In some examples, the memory controller 106 is configured to control the memory device 104 to perform a read operation on at least one code word.

In some examples, memory device 104 includes: an array of memory cells, the array of memory cells includes a memory cell with multiple storage bits; a preset number of memory cells forming one code word, and the multiple storage bits corresponding to multiple pages respectively; at least one page corresponding to multiple stages, the multiple stages including a first stage and a second stage, and the read voltage in the second stage is less than the read voltage in the first stage; peripheral circuit of the memory device 104, coupled to the array of memory cells and configured to: obtain the target valley voltage in the first target stage, the first target stage including at least one first stage among multiple first stages corresponding to multiple pages; take the target valley voltage as a read voltage at which a read operation is performed on the at least one code word; and obtain the predicted valley voltage in the second target stage in accordance with the target valley voltage in the first target stage, the second target stage including at least one of the remaining first stages or the second stage; the read voltage in the second target stage is less than the read voltage in the first target stage.

In some examples, peripheral circuit of the memory device 104 is configured to: obtain the valley voltage in the first stage for each of the multiple pages; and in accordance with the valley voltage in the first stage for each page, obtain the predicted valley voltage in the second stage for the same page to which the first stage belongs.

In some examples, each of the multiple pages contains multiple second stages; peripheral circuit of the memory device 104 is configured to: in accordance with the valley voltage in the first stage for each of the multiple pages, obtain the predicted valley voltage in the second stage corresponding to the greatest read voltage among the multiple second stages for the same page to which the first stage belongs; and sequentially in accordance with the second stage corresponding to a larger read voltage among the multiple second stages for the same page to which the first stage belongs, obtain the predicted valley voltage in a second stage corresponding to a smaller read voltage than a read voltage corresponding to an adjacent second stage, until the predicted valley voltages in all the second stages in the same page to which the first stage belongs are obtained.

In some examples, the storage bits of the memory cell are three bits, and the three storage bits correspond to the lower page, the middle page, and the upper page respectively; multiple stages includes the first-level read voltage to the seventh-level read voltage with the read voltages increasing sequentially; the fifth-level read voltage to the seventh-level read voltage in the multiple stages are respectively the first stages for the lower page, the middle page, and the upper page, the first-level read voltage corresponds to the second stage for the lower page, the second-level read voltage in the multiple stages and the fourth-level read voltage in the multiple stages correspond to the second stages for the middle page, the third-level read voltage in the multiple stages corresponds to the second stage for the upper page; peripheral circuit of the memory device 104 is configured to: obtain the predicted valley voltage for the first-level read voltage for the lower page in accordance with the valley voltage for the fifth-level read voltage for the lower page; obtain the predicted valley voltage for the fourth-level read voltage for the middle page in accordance with the valley voltage for the sixth-level read voltage for the middle page; and obtain the predicted valley voltage for the second-level read voltage for the middle page in accordance with the predicted valley voltage for the fourth-level read voltage for the middle page; and obtain the predicted valley voltage for the third-level read voltage for the upper page in accordance with the valley voltage for the seventh-level read voltage for the upper page.

In some examples, peripheral circuit of the memory device 104 is configured to: obtain the predicted valley voltage in the second target stage in accordance with the valley voltage in the first target stage and the mapping function, and the mapping function represents the relationship between the valley voltage in the first target stage and the predicted valley voltage in the second target stage.

In some examples, peripheral circuit of the memory device 104 is configured to: obtain the predicted valley voltage in the second target stage in accordance with the valley voltage in the first target stage, the first adjustment coefficient, the second adjustment coefficient, and the third adjustment coefficient in the mapping function; the first adjustment coefficient, the second adjustment coefficient, and the third adjustment coefficient are all fixed values related to the stage number in which the read voltage is.

In some examples, peripheral circuit of the memory device 104 is configured to: for the first target stage, obtain a first result corresponding to at least one code word at a target read voltage; the first result including the number of bits of the at least one code word which are flipped in two read results at a first read voltage and a second read voltage; the difference between the first read voltage and the second read voltage being less than a preset voltage; and make at least one adjustment to a target read voltage, and after each adjustment, obtain the corresponding first result at the adjusted target read voltage; determine the target valley voltage in the first target stage in accordance with the multiple first results.

In some examples, peripheral circuit of the memory device 104 is configured to: for a second target stage, obtain a first result corresponding to at least one code word at the target read voltage; and obtain a first threshold in accordance with the corresponding first result at the target read voltage; the first threshold represents the corresponding first result at the upper limit of the predicted valley voltage; when the corresponding first result at the predicted valley voltage in the second target stage is less than the first threshold, determine the predicted valley voltage in the second target stage to be the target valley voltage in the second target stage.

In some examples, peripheral circuit of the memory device 104 is configured to: when the corresponding first result at the predicted valley voltage in the second target stage is greater than or equal to the first threshold, make at least one adjustment to the predicted read voltage in the second target stage, and obtain the corresponding first result at the adjusted target read voltage after each adjustment; determine the valley voltage in the second target stage in accordance with the multiple first results.

In some examples, peripheral circuit of the memory device 104 is configured to: when the corresponding first result at the predicted valley voltage in the second target stage is greater than or equal to the first threshold, obtain the predicted valley voltage in the second target stage in accordance with the valley voltage in the first target stage and an alternate adjustment coefficient of the mapping function, and the mapping function represents the relationship between the valley voltage in the first target stage and the predicted valley voltage in the second target stage.

In some examples, the memory device is a memory device after data retention.

In some examples, the memory controller 106 is configured to: send an instruction for obtaining data, the instruction for obtaining data indicates to obtain the valley voltage; the memory device 104 is configured to: receive an instruction for obtaining data, obtain the valley voltage, and send information including the valley voltage to the memory controller; the memory controller is further configured to: perform a read operation on data stored in the memory device in accordance with the valley voltage in the information.

In some examples, the memory controller 106 is further configured to: perform an error correction decode operation on the read result of the read operation. In some implementations, the error correction code decoding operation includes a hard decode operation employing a Low Density Parity Check Code (LDPC).

In some examples, as shown in FIG. 14, the memory controller 106 is configured to: send an instruction for obtaining data, the instruction for obtaining data indicates to obtain the target valley voltage; the memory device 104 is configured to: obtain the target valley voltage and send information including the target valley voltage to the memory controller 106.

Figure 15:
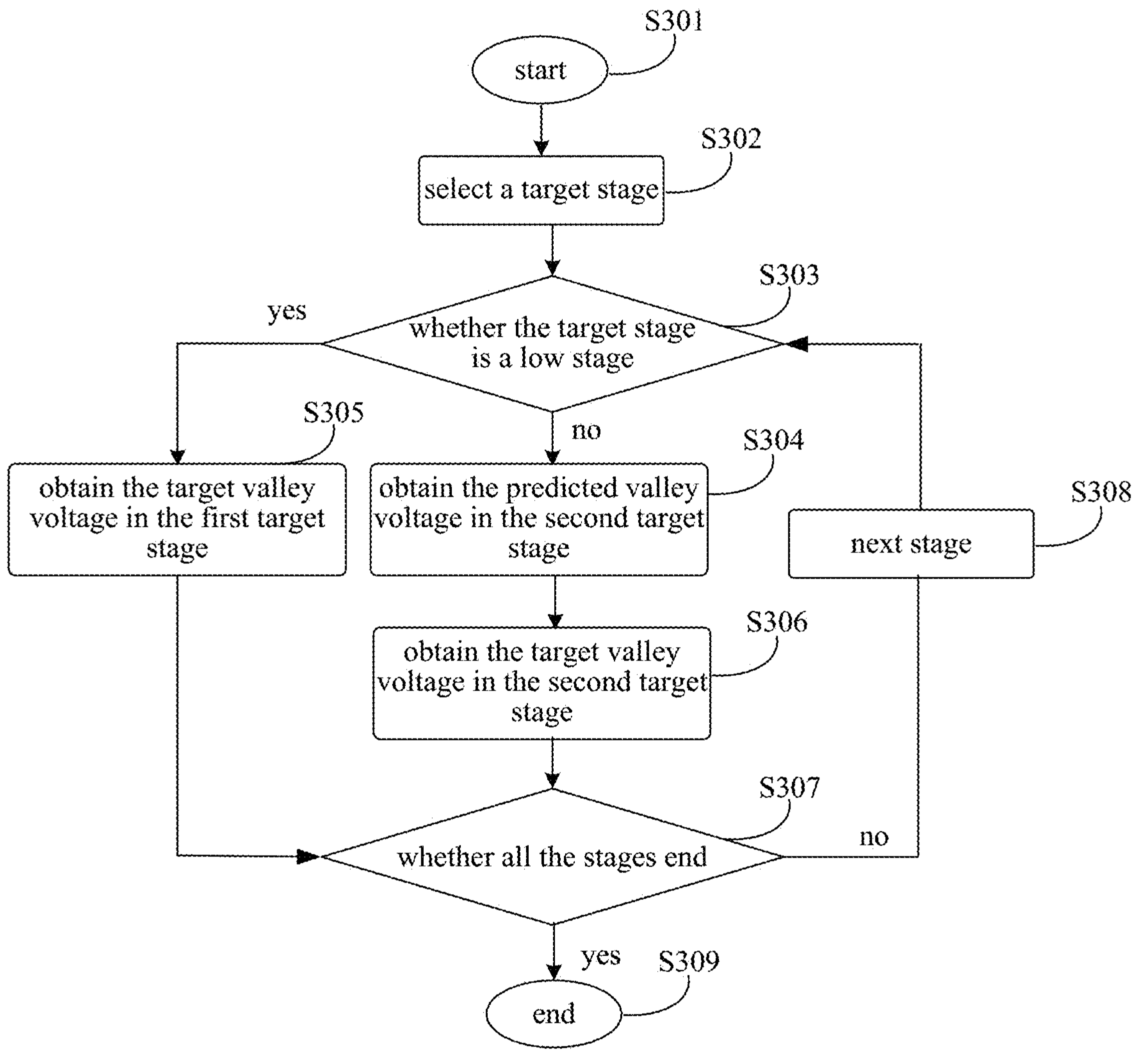
FIG. 15 is a flowchart of an operating method that the memory system is configured to perform provided by an example of the present disclosure.

In some examples, as shown in FIGS. 14 and 15, the memory device 104 is configured to receive an instruction for obtaining data to obtain the target valley voltage and send information including the target valley voltage to the memory controller, including performing the following operations:

Operation S301: start. In operation S301, the program of obtaining the target valley voltage is triggered, and the process of obtaining the target valley voltage is started. Next, operation S302 is performed.

Operation S302: select a target stage.

Operation S303: determine whether the target stage is a first target stage. The first target stage includes at least one first stage among multiple first stages corresponding to multiple pages. If the determination result in operation S303 is yes, operation S305 is performed.

Operation S305: obtain the target valley voltage in the first target stage. In some examples, for the first target stage, obtain a first result corresponding to at least one code word at the target read voltage; the first result including the number of bits of the at least one code word which are flipped in two read results at a first read voltage and a second read voltage; the difference between the first read voltage and the second read voltage being less than a preset voltage; and at least one adjustment is made to a target read voltage, and after each adjustment, obtain the corresponding first result at the adjusted target read voltage; the target valley voltage in the first target stage is determined in accordance with the multiple first results.

If the determination result in operation S303 is no, operation S304 is performed.

In operation S304: the predicted valley voltage in the second target stage is obtained. In some examples, the predicted valley voltage in the second target stage is obtained in accordance with the target valley voltage in the first target stage, where the second target stage including at least one of the remaining first stages or the second stage; the read voltage in the second target stage is less than the read voltage in the first target stage. Here, predicting the valley voltage is to obtain the predicted valley voltage corresponding to the second target stage corresponding to a read voltage being less than the read voltage in the first target stage, in accordance with the target valley voltage corresponding to the first target stage (higher stage) and the related mapping function. Here and below, the related mapping function may be obtained by fitting a large number of experimental results before the memory device leaves the factory, and is stored in the memory device.

Operation S306 is performed after operation S304.

In operation S306: obtain the target valley voltage in the second target stage. In some examples, for the second target stage, a first result corresponding to at least one code word at a target read voltage is obtained; and a first threshold is obtained in accordance with the corresponding first result at the target read voltage; the first threshold represents the corresponding first result at the upper limit of the predicted valley voltage; when the corresponding first result at the predicted valley voltage in the second target stage is less than the first threshold, the predicted valley voltage in the second target stage is determined to be the target valley voltage in the second target stage. When the corresponding first result at the predicted valley voltage in the second target stage is greater than or equal to the first threshold, at least one adjustment is made to the predicted valley voltage in the second target stage, and after each adjustment, the corresponding first result at the adjusted target read voltage is obtained; the target valley voltage in the second target stage is determined in accordance with the multiple first results.

After operation S305 or operation S306, operation S307 is performed.

In operation S307, it is determined whether corresponding target valley voltages have been determined for read voltages in all the stages contained on this page.

When the determination result in operation 307 is yes, it indicates that target valley voltages corresponding to read voltages in all the stages contained on this page have been determined, and operation S309 may be performed at this point; and when the determination result in operation S307 is no, it indicates that target valley voltages corresponding to read voltages in some of the stages contained on this page have not been determined, and operation S308 may be performed at this point.

In operation S308, for the stages in which the target valley voltages are not determined, the target valley voltage in each of the stages is determined in sequence. Operation S308 jumps to operation S303.

In operation S309, the process of obtaining the target valley voltage ends. It should be noted that after operation S309, the determination of the target valley voltage corresponding to the read voltages in all stages for the next page may be started.

In some examples, the memory controller 106 is configured to: send a mode setting command indicating to set a read mode of the memory device to a single-level read mode; the single-level read mode includes reading at least one bit of storage data stored in the memory cell through a read voltage at one level; the memory device 104 is configured to: enter a single-level read mode in response to a mode set command, and, in the single-level read mode, obtain a first result corresponding to at least one code word at the target read voltage.

In a second aspect, in a memory system provided by an example of the present disclosure, by transmitting a first result (size of the first result may be several bytes) instead of at least one code word (e.g. size of code word may be 4 KB), the amount of data transferred between the memory device and the memory controller is reduced; the process of obtaining the first result is converged inside the memory device and does not occupy space of a memory controller, thus is less dependent on a memory controller; the process of obtaining the target valley voltage in accordance with the first result and obtaining the predicted valley voltage in the second target stage in accordance with the target valley voltage in the first target stage is completed in the memory device, thereby reducing at least one of the transmission time of the input and output ports of the memory device or the time of the error correction decode operation of the memory controller, saving the iteration time of the error correction decode algorithm by the memory controller, thus the error correction decode speed is faster; therefore suitable for MLC, TLC or QLC type memory systems.

In a third aspect, an example of the present disclosure provides a memory controller, the memory controller is coupled to at least one memory device, and the memory device includes: an array of memory cells including a memory cell with multiple storage bits, a preset number of the memory cells form one code word, and the multiple storage bits correspond to multiple pages respectively; at least one page corresponds to multiple stages, the multiple stages include a first stage and a second stage, and the read voltage in the second stage is less than the read voltage in the first stage; the memory controller including a control component configured to: obtain the target valley voltage in the first target stage, the first target stage including at least one first stage among multiple first stages corresponding to multiple pages in the memory device; take the valley voltage as a read voltage at which a read operation is performed on the at least one code word; and obtain the predicted valley voltage in the second target stage in accordance with the target valley voltage in the first target stage; the second target stage including at least one of the remaining first stages or the second stage; the read voltage in the second target stage is less than the read voltage in the first target stage.

In some examples, the control component is configured to: obtain the target valley voltage in the first stage for each of the multiple pages; and in accordance with the target valley voltage in the first stage for each page, obtain the predicted valley voltage in the second stage for the same page to which the first stage belongs.

In some examples, each of the multiple pages contains multiple second stages; the control component is configured to: in accordance with the target valley voltage in the first stage for each of the multiple pages, obtain the predicted valley voltage in the second stage corresponding to the greatest read voltage among the multiple second stages for the same page to which the first stage belongs; and sequentially in accordance with the predicted valley voltage in the second stage corresponding to a larger read voltage among the multiple second stages for the same page to which the first stage belongs, obtain the predicted valley voltage in a second stage corresponding to a smaller read voltage than a read voltage corresponding to an adjacent second stage, until the predicted valley voltages in all the second stages in the same page to which the first stage belongs are obtained.

In some examples, the control component is configured to: obtain the predicted valley voltage in the second target stage in accordance with the target valley voltage in the first target stage and the mapping function, and the mapping function represents the relationship between the target valley voltage in the first target stage and the predicted valley voltage in the second target stage.

In some examples, the control component is configured to: obtain the predicted valley voltage in the second target stage in accordance with the target valley voltage in the first target stage, the first adjustment coefficient, the second adjustment coefficient, and the third adjustment coefficient in the mapping function; the first adjustment coefficient, the second adjustment coefficient, and the third adjustment coefficient are all fixed values related to the stage number in which the read voltage is.

In some examples, the control component is configured to: for the first target stage, obtain a first result corresponding to at least one code word at a target read voltage; the first result including the number of bits of the at least one code word which are flipped in two read results at a first read voltage and a second read voltage; the difference between the first read voltage and the second read voltage being less than a preset voltage; and make at least one adjustment to a target read voltage, and after each adjustment, obtain the corresponding first result at the adjusted target read voltage; the target valley voltage in the first target stage is determined in accordance with the multiple first results.

In some examples, the control component is configured to: for a second target stage, obtain a first result corresponding to at least one code word at the target read voltage; and obtain a first threshold in accordance with the corresponding first result at the target read voltage; the first threshold represents the corresponding first result at the upper limit of the predicted valley voltage; when the corresponding first result at the predicted valley voltage in the second target stage is less than the first threshold, determine the predicted valley voltage in the second target stage to be the target valley voltage in the second target stage.

In some examples, the control component is configured to: when the corresponding first result at the predicted valley voltage in the second target stage is greater than or equal to the first threshold, make at least one adjustment to the predicted valley voltage in the second target stage, and after each adjustment, obtain the corresponding first result at the adjusted target read voltage; determine the target valley voltage in the second target stage in accordance with the multiple first results.

In some examples, the control component is configured to: when the corresponding first result at the predicted valley voltage in the second target stage is greater than or equal to the first threshold, obtain the predicted valley voltage in the second target stage in accordance with the target valley voltage in the first target stage and an alternate adjustment coefficient of the mapping function, and the mapping function represents the relationship between the target valley voltage in the first target stage and the predicted valley voltage in the second target stage.

In some examples, the memory device is a memory device after data retention.

In some examples, the data amount of the first result is less than a preset threshold of data amount.

In a third aspect, in a memory system provided by an example of the present disclosure, by transmitting a first result (size of the first result may be several bytes) instead of at least one code word (e.g. size of code word may be 4 KB), the amount of data transferred between the memory device and the memory controller is reduced; the process of obtaining the first result is converged inside the memory device and does not occupy space of a memory controller, thus is less dependent on a memory controller; the process of obtaining the target valley voltage in accordance with the first result and obtaining the predicted valley voltage in the second target stage in accordance with the target valley voltage in the first target stage completed in the memory controller is more efficient compared to in the memory device, thereby reducing at least one of the transmission time of the input and output ports of the memory device or the time of the error correction decode operation of the memory controller, saving the iteration time of the error correction decode algorithm by the memory controller, thus the error correction decode speed is faster; therefore suitable for MLC, TLC or QLC type memory systems.

In a fourth aspect, an example of the present disclosure provides a method for operating a memory device, the memory device includes: a memory cell with multiple storage bits, a preset number of the memory cells form one code word, and the multiple storage bits correspond to multiple pages respectively; at least one page corresponds to multiple stages, the multiple stages include a first stage and a second stage, and the read voltage in the second stage is less than the read voltage in the first stage; the operating method includes: obtaining the target valley voltage in the first target stage, the first target stage including at least one first stage among multiple first stages corresponding to multiple pages; taking the target valley voltage as a read voltage at which a read operation is performed on the at least one code word; and obtaining the predicted valley voltage in the second target stage in accordance with the target valley voltage in the first target stage, the second target stage including at least one of the remaining first stages or the second stage; the read voltage in the second target stage is less than the read voltage in the first target stage.

In some examples, the method of operating the memory device includes: obtaining the valley voltage in the first stage for each of the multiple pages; and in accordance with the target valley voltage in the first stage for each page, obtaining the predicted valley voltage in the second stage for the same page to which the first stage belongs.

In some examples, each of the multiple pages contains multiple second stages; the method for operating the memory device includes: in accordance with the target valley voltage in the first stage for each of the multiple pages, obtaining the predicted valley voltage in the second stage corresponding to the greatest read voltage among the multiple second stages for the same page to which the first stage belongs; and sequentially in accordance with the predicted valley voltage in the second stage corresponding to a larger read voltage among the multiple second stages for the same page to which the first stage belongs, obtaining the predicted valley voltage in a second stage corresponding to a smaller read voltage than a read voltage corresponding to an adjacent second stage, until the predicted valley voltages in all the second stages in the same page to which the first stage belongs are obtained.

In some examples, the storage bits of the memory cell are three bits, and the three storage bits correspond to the lower page, the middle page, and the upper page respectively; the multiple stages includes the first level to the seventh level with the read voltages increasing sequentially; the fifth level to the seventh level among the multiple stages correspond to the first stages for the lower page, the middle page, and the upper page respectively, the first level corresponds to the second stage for the lower page, the second level in the multiple stages and the fourth level in the multiple stages correspond to the second stages for the middle page, the third level in the multiple stages corresponds to the second stage for the upper page; the method for operating the memory device includes:

the predicted valley voltage in the first stage for the lower page is obtained in accordance with the target valley voltage for the fifth level for the lower page; the predicted valley voltage for the fourth level for the middle page is obtained in accordance with the target valley voltage for the sixth level for the middle page; and the predicted valley voltage in the second stage for the middle page is obtained in accordance with the predicted valley voltage for the fourth level for the middle page; and the predicted valley voltage for the third level for the upper page is obtained in accordance with the target valley voltage for the seventh level for the upper page.

In some examples, the method for operating the memory device includes: obtaining the predicted valley voltage in the second target stage in accordance with the target valley voltage in the first target stage and the mapping function, and the mapping function represents the relationship between the target valley voltage in the first target stage and the predicted valley voltage in the second target stage.

In some examples, the method for operating the memory device includes: obtaining the predicted valley voltage in the second target stage in accordance with the target valley voltage in the first target stage, the first adjustment coefficient, the second adjustment coefficient, and the third adjustment coefficient in the mapping function; where the first adjustment coefficient, the second adjustment coefficient, and the third adjustment coefficient are all fixed values related to the stage number in which the read voltage is.

In some examples, the method for operating the memory device includes: for the first target stage, obtain a first result corresponding to at least one code word at a target read voltage; the first result including the number of bits of the at least one code word which are flipped in two read results at a first read voltage and a second read voltage; the difference between the first read voltage and the second read voltage being less than a preset voltage; and making at least one adjustment to a target read voltage, and after each adjustment, obtaining the corresponding first result at the adjusted target read voltage; determining the target valley voltage in the first target stage in accordance with the multiple first results.

In some examples, a method for operating a memory device includes: for a second target stage, obtaining a first result corresponding to at least one code word at the target read voltage; and obtaining a first threshold in accordance with the corresponding first result at the target read voltage; the first threshold represents the corresponding first result at the upper limit of the predicted valley voltage; when the corresponding first result at the predicted valley voltage in the second target stage is less than the first threshold, determining the predicted valley voltage in the second target stage to be the target valley voltage in the second target stage.

In some examples, a method for operating a memory device includes: when the corresponding first result at the predicted valley voltage in the second target stage is greater than or equal to the first threshold, making at least one adjustment to the predicted read voltage in the second target stage, and after each adjustment, obtaining the corresponding first result at the adjusted target read voltage; determining the target valley voltage in the second target stage in accordance with the multiple first results.

In some examples, a method for operating a memory device includes: when the corresponding first result at the predicted valley voltage in the second target stage is greater than or equal to the first threshold, obtaining the predicted valley voltage in the second target stage in accordance with the target valley voltage in the first target stage and an alternate adjustment coefficient of the mapping function, and the mapping function represents the relationship between the target valley voltage in the first target stage and the predicted valley voltage in the second target stage.

In a fifth aspect, an example of the present disclosure provides a method for operating a memory system, including: sending an instruction for obtaining data, the instruction for obtaining data indicates to obtain the target valley voltage; the target valley voltage is obtained according to the operating method described in any example of the fourth aspect; performing a read operation on data stored in the memory device in accordance with the target valley voltage.

In some examples, the memory device in the memory system includes: a memory cell with multiple storage bits, a preset number of the memory cells form one code word, and the multiple storage bits correspond to multiple pages respectively; at least one page corresponds to multiple stages, the multiple stages include a first stage and a second stage, and the read voltage in the second stage is less than the read voltage in the first stage; the method for operating the memory system includes: obtaining the target valley voltage in the first target stage, the first target stage including at least one first stage among multiple first stages corresponding to multiple pages in the memory device; take the valley voltage as a read voltage at which a read operation is performed on the at least one code word; and obtaining the predicted valley voltage in the second target stage in accordance with the target valley voltage in the first target stage; the second target stage including at least one of the remaining first stages or the second stage; the read voltage in the second target stage is less than the read voltage in the first target stage.

In a sixth aspect, an example of the present disclosure provides a method for operating a memory controller, the memory controller is coupled to at least one memory device, and the memory device includes: an array of memory cells including a memory cell with multiple storage bits, a preset number of the memory cells form one code word, and the multiple storage bits correspond to multiple pages respectively; at least one page corresponds to multiple stages, the multiple stages include a first stage and a second stage, and the read voltage in the second stage is less than the read voltage in the first stage; the method for operating the memory controller of the memory device includes: obtaining the target valley voltage in the first target stage, the first target stage including at least one first stage among multiple first stages corresponding to multiple pages in the memory device; taking the target valley voltage as a read voltage at which a read operation is performed on the at least one code word; and obtaining the predicted valley voltage in the second target stage in accordance with the target valley voltage in the first target stage; the second target stage including at least one of the remaining first stages or the second stage; the read voltage in the second target stage is less than the read voltage in the first target stage.

In some examples, the method for operating the memory controller of the memory device includes: obtaining the target valley voltage in the first stage for each of the multiple pages; and in accordance with the target valley voltage in the first stage for each page, obtaining the predicted valley voltage in the second stage for the same page to which the first stage belongs.

In some examples, each of the multiple pages contains multiple second stages; the method for operating the memory controller of the memory device includes: in accordance with the target valley voltage in the first stage for each of the multiple pages, obtaining the predicted valley voltage in the second stage corresponding to the greatest read voltage among the multiple second stages for the same page to which the first stage belongs; and sequentially in accordance with the predicted valley voltage in the second stage corresponding to a larger read voltage among the multiple second stages for the same page to which the first stage belongs, obtaining the predicted valley voltage in a second stage corresponding to a smaller read voltage than a read voltage corresponding to an adjacent second stage, until the predicted valley voltages in all the second stages in the same page to which the first stage belongs are obtained.

In some examples, the method for operating the memory controller of the memory device includes: obtaining the predicted valley voltage in the second target stage in accordance with the target valley voltage in the first target stage and the mapping function, and the mapping function represents the relationship between the target valley voltage in the first target stage and the predicted valley voltage in the second target stage.

In some examples, the method for operating the memory controller of the memory device includes: obtaining the predicted valley voltage in the second target stage in accordance with the target valley voltage in the first target stage, the first adjustment coefficient, the second adjustment coefficient, and the third adjustment coefficient in the mapping function; the first adjustment coefficient, the second adjustment coefficient, and the third adjustment coefficient are all fixed values related to the stage number in which the read voltage is.

In some examples, the method for operating the memory controller of the memory device includes: for the first target stage, obtain a first result corresponding to at least one code word at a target read voltage; the first result including the number of bits of the at least one code word which are flipped in two read results at a first read voltage and a second read voltage; the difference between the first read voltage and the second read voltage being less than a preset voltage; and making at least one adjustment to a target read voltage, and obtaining the corresponding first result at the adjusted target read voltage after each adjustment; determining the target valley voltage in the first target stage in accordance with the multiple first results.

In some examples, the method for operating the memory controller of the memory device includes: for a second target stage, obtaining a first result corresponding to at least one code word at the target read voltage; and obtaining a first threshold in accordance with the corresponding first result at the target read voltage; the first threshold represents the corresponding first result at the upper limit of the predicted valley voltage; when the corresponding first result at the predicted valley voltage in the second target stage is less than the first threshold, determining the predicted valley voltage in the second target stage to be the target valley voltage in the second target stage.

In some examples, the method for operating the memory controller of the memory device includes: when the corresponding first result at the predicted valley voltage in the second target stage is greater than or equal to the first threshold, making at least one adjustment to the predicted valley voltage in the second target stage, and obtaining the corresponding first result at the adjusted target read voltage after each adjustment; determining the target valley voltage in the second target stage in accordance with the multiple first results.

In some examples, the method for operating the memory controller of the memory device includes: when the corresponding first result at the predicted valley voltage in the second target stage is greater than or equal to the first threshold, obtaining the predicted valley voltage in the second target stage in accordance with the target valley voltage in the first target stage and an alternate adjustment coefficient of the mapping function, and the mapping function represents the relationship between the target valley voltage in the first target stage and the predicted valley voltage in the second target stage.

In some examples, the memory device is a memory device after data retention.

In some examples, the data amount of the first result is less than a preset threshold of data amount.

Figure 16:
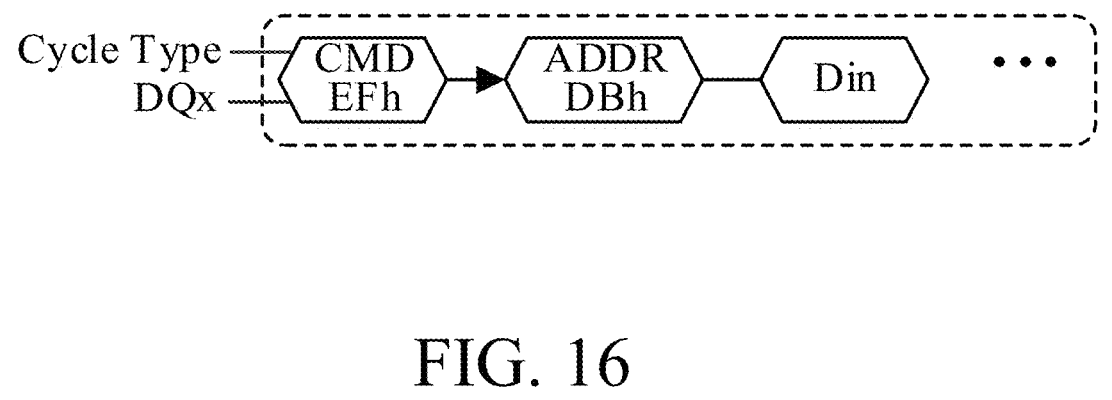

FIG. 16 is an example of a timing diagram for starting a single-level read mode operation provided by this disclosure. DQx may be represented as a data bus signal, and Cycle Type may further represent the type of data bus signal.

As shown in FIG. 16, the set function command may include, e.g., a subcommand (e.g., EFh), in one example, the memory device enables the single-level read mode upon receiving a subcommand EFh. In the single-level read mode, the memory device transmits the address ADDR of the data to be read (e.g., two column addresses C1 to C2 and three row addresses R1 to R3) between received subcommands 00h and 30h. During the reading time, the corresponding data DATA (e.g., Dn) in the page of the receiving address may be buffered in the page buffer, and then the data DATA will be read on demand. It should be noted that in the example described above, transmission of the data (e.g., Dn) corresponding to a physical page needs to be frequently performed (Din/Dout) between the memory device and the memory controller when performing a read retry operation, and transmission of the data consumes a long time.

Figure 17:
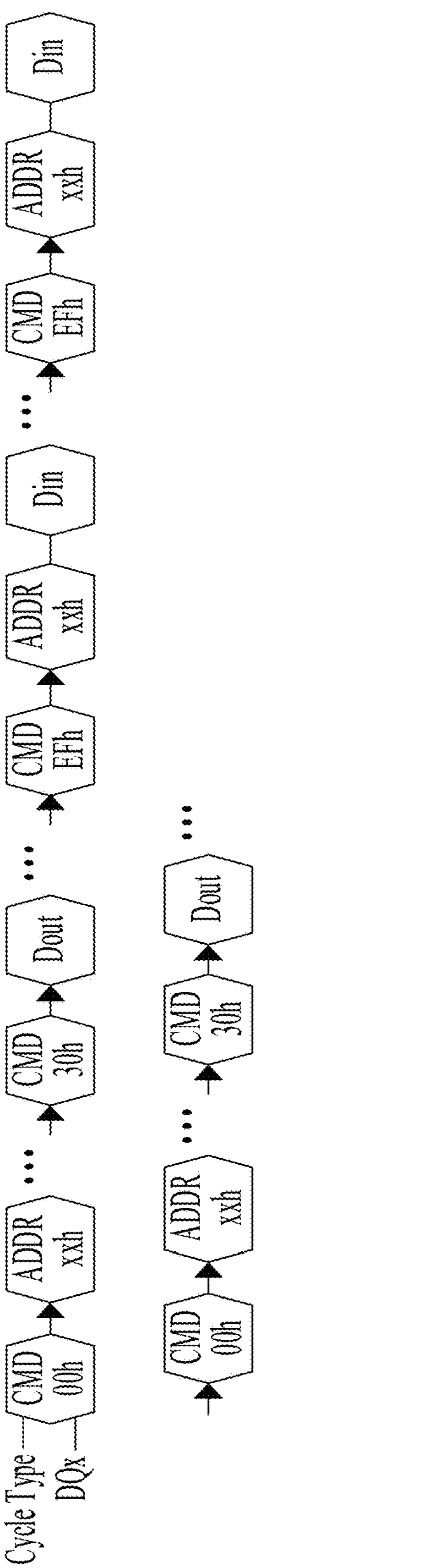
FIG. 17 is a timing diagram for determining the target valley voltage and performing a read operation provided by an example of the present disclosure.

FIG. 17 is a timing diagram for determining the valley voltage and performing a read operation provided by an example of the present disclosure. As shown in FIG. 17, the read command may include, e.g., two subcommands (e.g., 00h and 30h), and in some examples, the memory device transmits the address ADDR of the data to be read (e.g., two column addresses C1 to C2 and three row addresses R1 to R3) between received subcommands 00h and 30h. After the memory device receives the subcommand 30h, during the reading time, the corresponding data DATA (e.g., Dn) in the page of the receiving address may be buffered in the page buffer, and then the data DATA will be read on demand.

In an example, the memory device 104 transmits the address ADDR of the data to be read (e.g., two column addresses C1 to C2 and three row addresses R1 to R3) between received subcommands 00h and 30h. The memory device 104, after receiving the sub-command 30h, receives the sub-commands EFh and xxh of the instruction for obtaining data, the memory device 104 obtains first result corresponding to the code word at respective read voltage under the instruction of the instruction for obtaining data, and sends the obtained first result to the memory controller. The memory controller determines a target valley voltage in accordance with the multiple first results respectively corresponding to multiple different read voltages received from the memory device; and perform a read operation on data stored in the memory device in accordance with the target valley voltage.

It should be noted that the instruction for obtaining data provided in the example of the present disclosure is only an example and should not unduly limit the claimed scope of the present disclosure.

In some examples, the data amount of the first result is less than the preset threshold of data amount, e.g., the data amount of the first result ranges from 1 byte to 4 bytes, therefore, in the process of determining the target valley voltage, the amount of data transferred between the memory device and the memory controller is small and at a fast speed, which is beneficial to improving the overall speed of the read operation.

The present disclosure further provides a storage medium having executable instructions stored thereon, when executed, may implement the operations of the operating methods in the examples of the present disclosure described above.

In some examples, the storage medium may be memory such as Ferromagnetic Random-Access Memory (FRAM), Read Only Memory (ROM), Programmable Read-Only Memory (PROM), Erasable Programmable Read-Only Memory (EPROM), Electrically Erasable Programmable Read-Only Memory (EEPROM), Flash Memory, Magnetic Surface Memory, Optical Disk, or Compact Disc Read-Only Memory (CD-ROM); or may also be various devices including one or any combination of the memory devices described above.

In some examples, executable instructions may take the form of a program, software, software module, script, or code, written in any form of programming language (including compiled or interpreted languages, or declarative or procedural languages), and may be deployed in any form, including as a stand-alone program or as a module, component, subroutine, or other unit suitable for use in a computing environment.

As an example, executable instructions may, but do not necessarily correspond to, files in a file system, and may be stored as part of a file holding other programs or data, e.g., one or more scripts stored in a HyperText Markup Language (HTML) document, stored in a single file specific to the program discussed, or stored in multiple collaborative files (e.g., a file that stores one or more modules, subroutines, or portions of code).

As examples, executable instructions may be deployed to execute on one electronic device, or on multiple electronic devices located at one location, or to execute on multiple electronic devices distributed across multiple locations and interconnected by a communications network.

Figure 18:
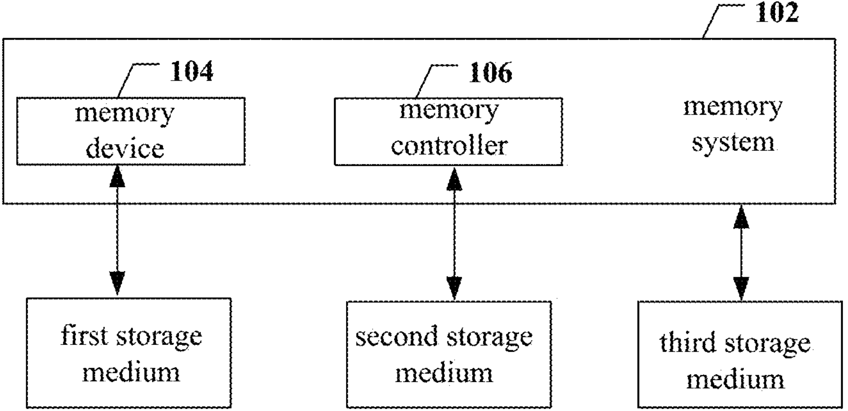
FIG. 18 is a schematic structural diagram of a storage medium provided by an example of present disclosure.

FIG. 18 is a schematic structural diagram of a storage medium provided by an example of present disclosure; the storage medium includes a first storage medium corresponding to the memory device 104, a second storage medium corresponding to the memory controller 106, and a third storage medium corresponding to the memory system 102; when the executable instructions are executed by the memory device, the first storage medium may be used to implement the operations of the method for operating the memory device in the examples of the present disclosure described above; when the executable instructions are executed by the memory controller, the second storage medium may be used to implement the operations of the method for operating the memory controller in the examples of the present disclosure described above; when the executable instructions are executed by the memory system, the third storage medium may be used to implement the operations of the operating method for the memory system in the examples of the present disclosure described above.

It should be understood that reference throughout the description to "one example" or "an example" means that a particular feature, structure or characteristic related to the example is included in at least one example of the present disclosure. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present disclosure, sequence numbers of the processes described above do not mean the execution order, and the execution stage for each process should be determined by its function and internal logic, and should not constitute any limitation to implementation process of examples of the present disclosure. The serial numbers of examples of the present disclosure described above are for the purpose of description only, and do not represent the advantages and disadvantages of the examples.

The above is only a preferred example of the present disclosure, and does not limit the patent scope of the present disclosure, and under the inventive concept of the present disclosure, any equivalent structural transformation made by using content of the present disclosure and the accompanying drawings, or direct/indirect disclosure in other related technical fields are included in the patent protection scope of the present disclosure.

What is claimed is:

1. A memory device, comprising:

an array of memory cells including a memory cell with multiple storage bits; wherein a preset number of the memory cells form at least one code word, and the multiple storage bits correspond to multiple pages respectively; wherein at least one page of the multiple pages corresponds to multiple stages; wherein the multiple stages include a first stage and a second stage; and wherein each of the multiple stages corresponds to a respective read voltage, and the read voltage corresponding to the second stage is less than the read voltage corresponding to the first stage; and a peripheral circuit coupled to the array of memory cells and configured to:

obtain a target valley voltage in a first target stage, the first target stage including at least one first stage among multiple first stages corresponding to the multiple pages; and determine the read voltage at which a read operation is performed on the at least one code word based on the target valley voltage; and obtain a predicted valley voltage in a second target stage in accordance with the target valley voltage in the first target stage, the second target stage including at least one of remaining first stages or the second stage; wherein the read voltage corresponding to the second target stage is less than the read voltage corresponding to the first target stage.

2. The memory device of claim 1, wherein the peripheral circuit is configured to:

obtain a target valley voltage in a first stage for each of the multiple pages; and obtain a predicted valley voltage in the second stage for a same page to which the first stage belongs, in accordance with the target valley voltage in the first stage for each of the multiple pages.

3. The memory device of claim 2, wherein each of the multiple pages includes multiple second stages;

the peripheral circuit is configured to:

obtain the predicted valley voltage in the second stage corresponding to a greatest read voltage among the multiple second stages for the same page to which the first stage belongs, in accordance with the target valley voltage in the first stage for each of the multiple pages; and sequentially in accordance with the predicted valley voltage in the second stage corresponding to a larger read voltage among the multiple second stages for the same page to which the first stage belongs, obtain the predicted valley voltage in the second stage corresponding to a smaller read voltage than a read voltage corresponding to an adjacent second stage, until the predicted valley voltage for each of the multiple second stages in the same page to which the first stage belongs is obtained.

4. The memory device of claim 3, wherein storage bits of the memory cell are three bits, and the three bits correspond to a lower page, a middle page, and an upper page respectively; the multiple stages includes a first-level read voltage, a second-level read voltage, a third-level read voltage, a fourth-level read voltage, a fifth-level read voltage, a sixth-level read voltage, and a seventh-level read voltage with read voltage values increasing sequentially; the fifth-level read voltage to the seventh-level read voltage in the multiple stages correspond to the first stages for the lower page, the middle page, and the upper page respectively, the first-level read voltage corresponds to the second stage for the lower page, the second-level read voltage in the multiple stages and the fourth-level read voltage in the multiple stages correspond to the second stages for the middle page, the third-level read voltage in the multiple stages corresponds to the second stage for the upper page;

the peripheral circuit is configured to:

obtain the predicted valley voltage for the first-level read voltage for the lower page in accordance with the target valley voltage for the fifth-level read voltage for the lower page;

obtain the predicted valley voltage for the fourth-level read voltage for the middle page in accordance with the target valley voltage for the sixth-level read voltage for the middle page; and obtain the predicted valley voltage for the second-level read voltage for the middle page in accordance with the predicted valley voltage for the fourth-level read voltage for the middle page; and obtain the predicted valley voltage for the third-level read voltage for the upper page in accordance with the target valley voltage for the seventh-level read voltage for the upper page.

5. The memory device of claim 1, wherein the peripheral circuit is configured to:

obtain the predicted valley voltage in the second target stage in accordance with the target valley voltage in the first target stage and a mapping function, wherein the mapping function represents a relationship between the target valley voltage in the first target stage and the predicted valley voltage in the second target stage.

6. The memory device of claim 5, wherein the peripheral circuit is configured to:

obtain the predicted valley voltage in the second target stage in accordance with the target valley voltage in the first target stage, a first adjustment coefficient, a second adjustment coefficient, and a third adjustment coefficient in the mapping function;

wherein the first adjustment coefficient, the second adjustment coefficient, and the third adjustment coefficient are all fixed values related to a stage number corresponding to the read voltage of the second target stage.

7. The memory device of claim 1, wherein the peripheral circuit is configured to:

for the first target stage, obtain a first result corresponding to the at least one code word at a target read voltage; wherein the first result includes a number of bits of the at least one code word which are flipped in two read results at a first read voltage and a second read voltage; a difference between the first read voltage and the second read voltage is less than a preset voltage;

make at least one adjustment to the target read voltage, and after each adjustment of the at least one adjustment, obtain a corresponding first result at the adjusted target read voltage; and determine the target valley voltage in the first target stage in accordance with multiple first results.

8. The memory device of claim 7, wherein the peripheral circuit is configured to:

for the second target stage, obtain a first result corresponding to the at least one code word at a target read voltage; and obtain a first threshold in accordance with the corresponding first result at the target read voltage; the first threshold represents the corresponding first result at an upper limit of the predicted valley voltage; and when the corresponding first result at the predicted valley voltage in the second target stage is less than the first threshold, determine the predicted valley voltage in the second target stage to be the target valley voltage in the second target stage.

9. The memory device of claim 8, wherein the peripheral circuit is configured to:

when the corresponding first result at the predicted valley voltage in the second target stage is greater than or equal to the first threshold, make at least one adjustment to a predicted read voltage in the second target stage, and after each adjustment of the at least one adjustment, obtain the corresponding first result at the adjusted target read voltage; and determine the target valley voltage in the second target stage in accordance with the multiple first results.

10. The memory device of claim 8, wherein the peripheral circuit is configured to:

when the corresponding first result at the predicted valley voltage in the second target stage is greater than or equal to the first threshold, obtain the predicted valley voltage in the second target stage in accordance with the target valley voltage in the first target stage and an alternate adjustment coefficient of a mapping function, wherein the mapping function represents a relationship between the target valley voltage in the first target stage and the predicted valley voltage in the second target stage.

11. The memory device of claim 1, wherein the memory device is a memory device after data retention.

12. A memory system, including:

one or more memory devices, comprising:

an array of memory cells including a memory cell with multiple storage bits; wherein a preset number of the memory cells form at least one code word, and the multiple storage bits correspond to multiple pages respectively; wherein at least one page of the multiple pages corresponds to multiple stages; wherein the multiple stages include a first stage and a second stage; and wherein each of the multiple stages corresponds to a respective read voltage, and the read voltage corresponding to the second stage is less than the read voltage corresponding to the first stage;

a peripheral circuit coupled to the array of memory cells and configured to:

obtain a target valley voltage in a first target stage, the first target stage including at least one first stage among multiple first stages corresponding to the multiple pages; and determine the read voltage at which a read operation is performed on the at least one code word based on the target valley voltage; and obtain a predicted valley voltage in a second target stage in accordance with the target valley voltage in the first target stage, the second target stage including at least one of remaining first stages or the second stage; wherein the read voltage corresponding to the second target stage is less than the read voltage corresponding to the first target stage; and a memory controller coupled to the memory device and controlling the memory device.

13. The memory system of claim 12, wherein the memory controller is configured to: send an instruction for obtaining data, wherein the instruction for obtaining data indicates to obtain the target valley voltage;

the memory device is configured to: receive the instruction for obtaining data, obtain the target valley voltage, and send information including the target valley voltage to the memory controller; and the memory controller is further configured to: perform a read operation on data stored in the memory device in accordance with the target valley voltage in the information.

14. The memory system of claim 13, wherein the memory controller is further configured to: perform an error correction code decoding operation on a read result of the read operation.

15. A memory controller coupled to at least one memory device, the memory controller comprising:

a control component configured to:

obtain a target valley voltage in a first target stage, the first target stage including at least one first stage among multiple first stages corresponding to multiple pages in the memory device; and determine a read voltage at which a read operation is performed on at least one code word based on the target valley voltage; wherein the memory device includes memory cells including a memory cell with multiple storage bits, a preset number of the memory cells form the at least one code word, and the multiple storage bits correspond to multiple pages respectively; and wherein at least one page corresponds to multiple stages, the multiple stages include a first stage and a second stage, and wherein each of the multiple stages corresponds to a respective read voltage, and the read voltage corresponding to the second stage is less than the read voltage corresponding to the first stage; and obtain a predicted valley voltage in a second target stage in accordance with the target valley voltage in the first target stage; the second target stage including at least one of remaining first stages or the second stage; wherein the read voltage corresponding to the second target stage is less than the read voltage corresponding to the first target stage.

16. The memory controller of claim 15, wherein the control component is configured to:

obtain a target valley voltage in a first stage for each of the multiple pages; and obtain a predicted valley voltage in the second stage for a same page to which the first stage belongs, in accordance with the target valley voltage in the first stage for each of the multiple pages.

17. The memory controller of claim 16, wherein each of the multiple pages includes multiple second stages; the control component is configured to:

obtain the predicted valley voltage in the second stage corresponding to a greatest read voltage among the multiple second stages for the same page to which the first stage belongs, in accordance with the target valley voltage in the first stage for each of the multiple pages; and sequentially in accordance with the predicted valley voltage in the second stage corresponding to a larger read voltage among the multiple second stages for the same page to which the first stage belongs, obtain the predicted valley voltage in the second stage corresponding to a smaller read voltage than a read voltage corresponding to an adjacent second stage, until the predicted valley voltage for each of the multiple second stages in the same page to which the first stage belongs is obtained.

18. The memory controller of claim 15, wherein the control component is configured to:

obtain the predicted valley voltage in the second target stage in accordance with the target valley voltage in the first target stage and a mapping function, wherein the mapping function represents a relationship between the target valley voltage in the first target stage and the predicted valley voltage in the second target stage.

19. The memory controller of claim 18, wherein the control component is configured to:

obtain the predicted valley voltage in the second target stage in accordance with the target valley voltage in the first target stage, a first adjustment coefficient, a second adjustment coefficient, and a third adjustment coefficient in the mapping function;

wherein the first adjustment coefficient, the second adjustment coefficient, and the third adjustment coefficient are all fixed values related to a stage number corresponding to the read voltage of the second target stage.

20. The memory controller of claim 15, wherein the control component is configured to:

for the first target stage, obtain a first result corresponding to the at least one code word at a target read voltage; wherein the first result includes a number of bits of the at least one code word which are flipped in two read results at a first read voltage and a second read voltage; a difference between the first read voltage and the second read voltage is less than a preset voltage;

make at least one adjustment to the target read voltage, and after each adjustment of the at least one adjustment, obtain the corresponding first result at the adjusted target read voltage; and determine the target valley voltage in the first target stage in accordance with multiple first results.

* * * * *